(12) United States Patent
Okazaki et al.

(10) Patent No.: US 9,627,413 B2
(45) Date of Patent: Apr. 18, 2017

(54) SEMICONDUCTOR DEVICE AND DISPLAY DEVICE

(71) Applicant: Semiconductor Energy Laboratory Co., Ltd., Atsugi-shi, Kanagawa-ken (JP)

(72) Inventors: Kenichi Okazaki, Tochigi (JP); Takashi Hamochi, Tochigi (JP); Yukinori Shima, Gunma (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/567,205

(22) Filed: Dec. 11, 2014

(65) Prior Publication Data

US 2015/0171116 A1 Jun. 18, 2015

(30) Foreign Application Priority Data

Dec. 12, 2013 (JP) ................................. 2013-256867

(51) Int. Cl.
*H01L 27/12* (2006.01)
*H01L 29/786* (2006.01)
(Continued)

(52) U.S. Cl.
CPC ........ *H01L 27/1225* (2013.01); *H01L 29/045* (2013.01); *H01L 29/41733* (2013.01);
(Continued)

(58) Field of Classification Search
CPC ............. H01L 29/7869; H01L 27/1225; H01L 29/66969; H01L 21/02554;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Jaehwan Oh
(74) *Attorney, Agent, or Firm* — Fish & Richardson P.C.

(57) ABSTRACT

The semiconductor device includes a transistor including an oxide semiconductor film, a first gate electrode overlapping with the oxide semiconductor film, a gate insulating film between the oxide semiconductor film and the first gate electrode, a first insulating film over the oxide semiconductor film, a pair of electrodes that are over the first insulating film and electrically connected to the oxide semiconductor film, a second insulating film over the first insulating film and the pair of electrodes, and a second gate electrode that is over the second insulating film and overlaps with the oxide semiconductor film. The first insulating film includes a region having a thickness of 1 nm or more and 50 nm or less, and the pair of electrodes includes a region in which a distance between the electrodes is 1 μm or more and 6 μm or less.

25 Claims, 32 Drawing Sheets

(51) Int. Cl.
*H01L 29/04* (2006.01)
*H01L 29/417* (2006.01)
*H01L 29/423* (2006.01)

(52) U.S. Cl.
CPC .... *H01L 29/42384* (2013.01); *H01L 29/7869* (2013.01); *H01L 29/78648* (2013.01); *H01L 29/78693* (2013.01); *H01L 29/78696* (2013.01); *H01L 2029/42388* (2013.01)

(58) Field of Classification Search
CPC ........... H01L 21/02565; H01L 27/1251; H01L 29/78603; H01L 27/1214
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,247,813 B2* | 8/2012 | Koyama | H01L 27/1225 257/43 |
| 8,293,661 B2* | 10/2012 | Yamazaki | H01L 21/3003 438/585 |
| 8,384,079 B2 | 2/2013 | Yamazaki | |
| 8,420,441 B2 | 4/2013 | Yamazaki | |
| 8,421,083 B2 | 4/2013 | Yamazaki et al. | |
| 8,546,180 B2 | 10/2013 | Yamazaki et al. | |
| 8,659,013 B2 | 2/2014 | Yamazaki | |
| 8,796,683 B2 | 8/2014 | Yamazaki et al. | |
| 8,872,171 B2 | 10/2014 | Yamazaki | |
| 8,946,702 B2 | 2/2015 | Yamazaki et al. | |
| 9,082,861 B2 | 7/2015 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0244029 A1* | 9/2010 | Yamazaki | H01L 27/1225 257/52 |
| 2011/0031491 A1* | 2/2011 | Yamazaki | G02F 1/136227 257/43 |
| 2011/0062432 A1* | 3/2011 | Yamazaki | H01L 29/7869 257/43 |
| 2011/0092017 A1* | 4/2011 | Akimoto | H01L 27/1225 438/104 |
| 2011/0127521 A1* | 6/2011 | Yamazaki | H01L 21/02472 257/43 |
| 2011/0127579 A1* | 6/2011 | Yamazaki | H01L 21/02472 257/192 |
| 2011/0133180 A1* | 6/2011 | Yamazaki | H01L 21/3003 257/43 |
| 2011/0133191 A1* | 6/2011 | Yamazaki | H01L 27/1225 257/57 |
| 2011/0136301 A1* | 6/2011 | Yamazaki | H01L 21/28176 438/156 |
| 2011/0140100 A1* | 6/2011 | Takata | H01L 29/7869 257/43 |
| 2011/0147739 A1* | 6/2011 | Yamazaki | H01L 21/02554 257/43 |
| 2011/0156024 A1* | 6/2011 | Koyama | G11C 11/412 257/43 |
| 2011/0156026 A1* | 6/2011 | Yamazaki | H01L 21/02422 257/43 |
| 2011/0248260 A1* | 10/2011 | Yamazaki | H01L 29/78606 257/43 |

(56) References Cited

U.S. PATENT DOCUMENTS

| | | | | |
|---|---|---|---|---|
| 2011/0284848 | A1* | 11/2011 | Yamazaki | H01L 27/1225 257/57 |
| 2012/0061662 | A1* | 3/2012 | Yamazaki | H01L 29/78648 257/43 |
| 2012/0064664 | A1* | 3/2012 | Yamazaki | H01L 29/7869 438/104 |
| 2012/0104385 | A1* | 5/2012 | Godo | H01L 29/7869 257/43 |
| 2012/0113341 | A1* | 5/2012 | Uochi | G02F 1/136213 349/38 |
| 2012/0161126 | A1* | 6/2012 | Yamazaki | H01L 27/10873 257/43 |
| 2012/0161139 | A1* | 6/2012 | Endo | G09G 3/3648 257/59 |
| 2012/0175608 | A1* | 7/2012 | Yamazaki | H01L 29/7869 257/43 |
| 2012/0294061 | A1* | 11/2012 | Nagatsuka | G11C 8/14 365/72 |
| 2013/0306966 | A1* | 11/2013 | Seon | H01L 29/66969 257/43 |
| 2013/0320334 | A1 | 12/2013 | Yamazaki et al. | |
| 2015/0123120 | A1 | 5/2015 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006165529 | 6/2006 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and SC2O3—A2O3—BO Systems [A; Fe; Ga; or Al; B: Mg, Mn, Fe, NI, Cu,or Zn] at Temperatures Over 1000° C.", Journal of Solid State Chemistry, 1985, vol. 60, pp. 382-384.

(56) References Cited

OTHER PUBLICATIONS

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors By DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectic Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci.Technol. B (Journal of Vaccum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (a2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

Van de Walle.C, "Hydrogen as a Cause of Doping in Zinc Oxide", Phys. Rev. Lett. (Physical Review Letter), Jul. 31, 2000, vol. 85, No. 5, pp. 1012-1015.

* cited by examiner

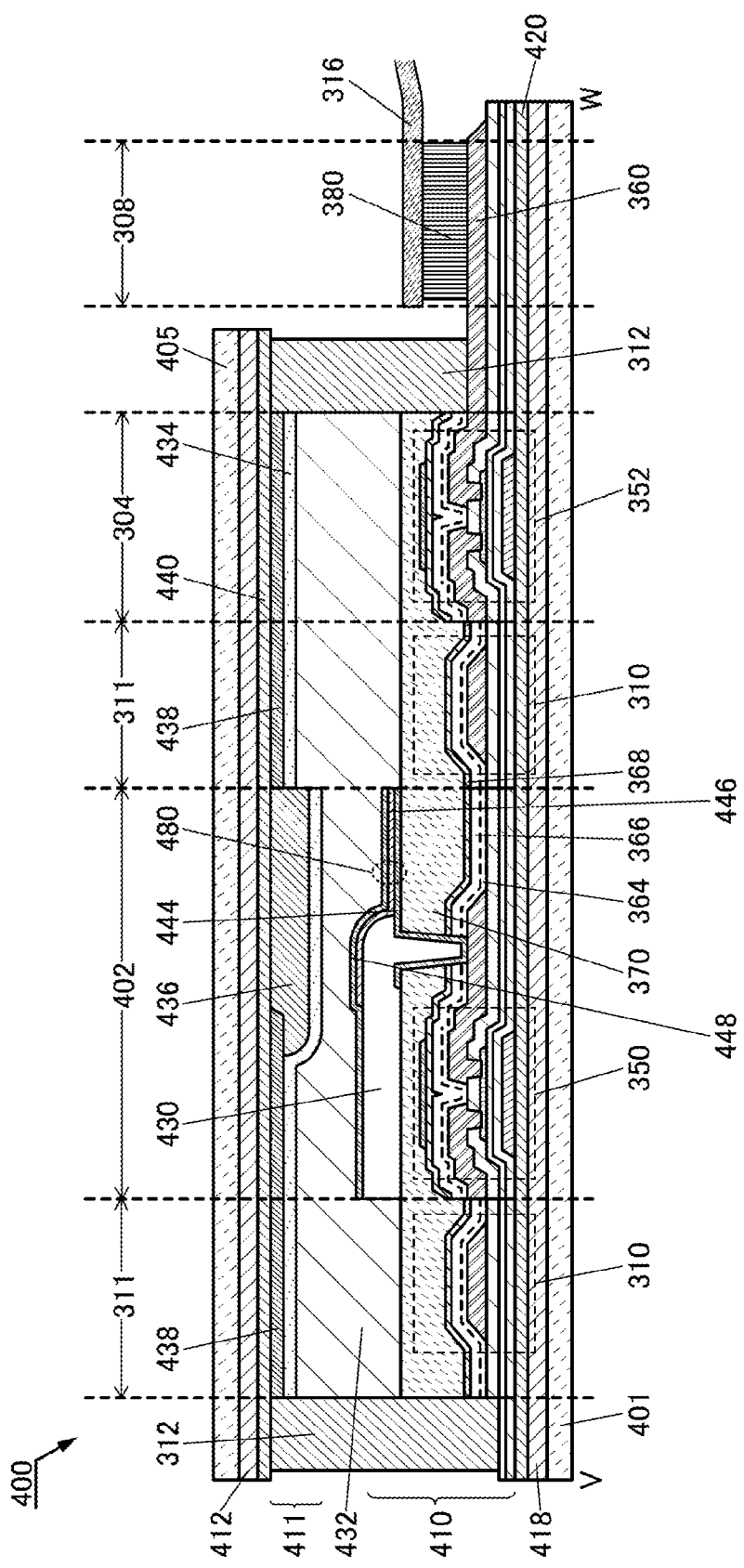

FIG. 20A
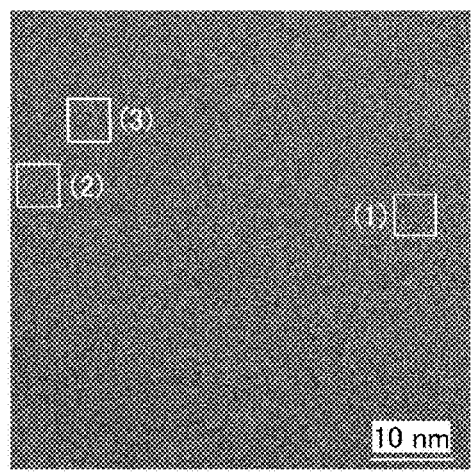
FIG. 20B  FIG. 20C  FIG. 20D
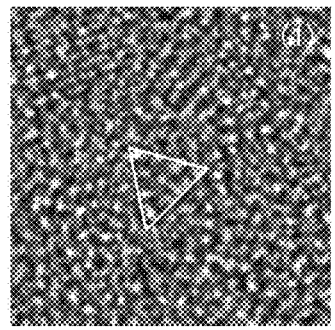 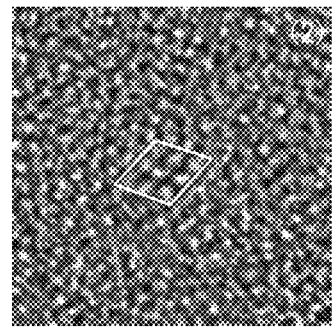 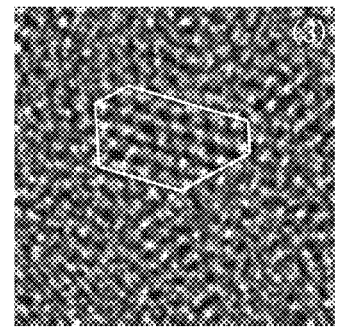

FIG. 27A
FIG. 27B
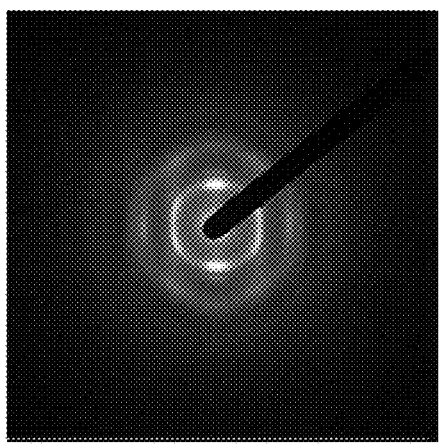
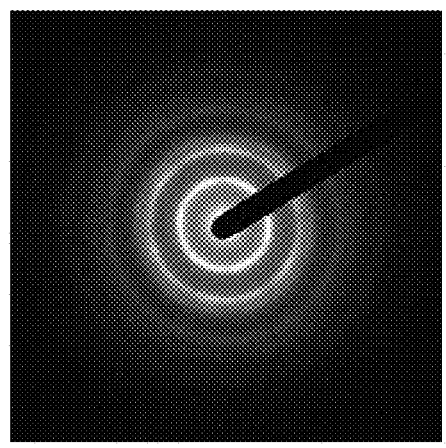

SEMICONDUCTOR DEVICE AND DISPLAY DEVICE

BACKGROUND OF THE INVENTION

1. Field of the Invention

One embodiment of the present invention relates to a semiconductor device including an oxide semiconductor and a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, a storage device, a method for driving any of them, and a method for manufacturing any of them.

Note that in this specification, a semiconductor device refers to a semiconductor element itself or a device including a semiconductor element. As an example of such a semiconductor element, for example, a transistor (a thin film transistor and the like) can be given. In addition, a display device such as a liquid crystal panel or an organic EL panel includes a semiconductor device in some cases.

2. Description of the Related Art

A technique by which a transistor is formed using a semiconductor film formed over a substrate having an insulating surface has been attracting attention. The transistor is applied to a wide range of electronic devices such as an integrated circuit (IC) and an image display device (also simply referred to as a display device). As a semiconductor film applicable to the transistor, a silicon-based semiconductor material is widely known; moreover, a metal oxide exhibiting semiconductor characteristics (an oxide semiconductor) has been attracting attention as another material.

For example, Patent Document 1 discloses a technique in which a transistor is manufactured using an amorphous oxide containing In, Zn, Ga, Sn, and the like as an oxide semiconductor.

REFERENCE

Patent Document

[Patent Document 1] Japanese Published Patent Application No. 2006-165529

SUMMARY OF THE INVENTION

An object of one embodiment of the present invention is to provide a novel semiconductor device including an oxide semiconductor, a semiconductor device with a high on-state current including an oxide semiconductor, a semiconductor device with a low off-state current including an oxide semiconductor, a semiconductor device that occupies a small area including an oxide semiconductor, a semiconductor device with stable electrical characteristics including an oxide semiconductor, or a semiconductor device with high reliability including an oxide semiconductor. Another object is to provide a novel semiconductor device, a novel display device, or the like.

Note that the descriptions of the above objects do not disturb the existence of other objects. In one embodiment of the present invention, there is no need to achieve all the objects. Objects other than the above objects will be apparent from and can be derived from the description of the specification and the like.

One embodiment of the present invention is a semiconductor device including a transistor including an oxide semiconductor film, a first gate electrode overlapping with the oxide semiconductor film, a gate insulating film between the oxide semiconductor film and the first gate electrode, a first insulating film over the oxide semiconductor film, a pair of electrodes that are over the first insulating film and electrically connected to the oxide semiconductor film, a second insulating film over the first insulating film and the pair of electrodes, and a second gate electrode that is over the second insulating film and overlaps with the oxide semiconductor film. The first insulating film includes a region having a thickness greater than or equal to 1 nm and less than or equal to 50 nm, and the pair of electrodes includes a region in which a distance between the electrodes is greater than or equal to 1 µm and less than or equal to 6 µm.

Another embodiment of the present invention is a semiconductor device including a transistor including an oxide semiconductor film, a first gate electrode overlapping with the oxide semiconductor film, a gate insulating film between the oxide semiconductor film and the first gate electrode, a first insulating film over the oxide semiconductor film, a pair of electrodes that are over the first insulating film and electrically connected to the oxide semiconductor film, a second insulating film over the first insulating film and the pair of electrodes, and a second gate electrode that is over the second insulating film and overlaps with the oxide semiconductor film. In a channel width direction of the transistor, the first gate electrode and the second gate electrode are connected to each other in an opening in the gate insulating film, the first insulating film, and the second insulating film, and the oxide semiconductor film is surrounded by the first gate electrode and the second gate electrode with the gate insulating film between the oxide semiconductor film and the first gate electrode and with the gate insulating film, the first insulating film, and the second insulating film between the oxide semiconductor film and the second gate electrode. The first insulating film includes a region having a thickness greater than or equal to 1 nm and less than or equal to 50 nm, and the pair of electrodes includes a region in which a distance between the electrodes is greater than or equal to 1 µm and less than or equal to 6 µm.

Another embodiment of the present invention is a semiconductor device including a transistor including a stacked-layer oxide film including an oxide semiconductor film and a metal oxide film, a first gate electrode overlapping with the stacked-layer oxide film, a gate insulating film between the stacked-layer oxide film and the first gate electrode, a first insulating film over the stacked-layer oxide film, a pair of electrodes that are over the first insulating film and electrically connected to the stacked-layer oxide film, a second insulating film over the first insulating film and the pair of electrodes, and a second gate electrode that is over the second insulating film and overlaps with the stacked-layer oxide film. The first insulating film includes a region having a thickness greater than or equal to 1 nm and less than or equal to 50 nm, and the pair of electrodes includes a region in which a distance between the electrodes is greater than or equal to 1 µm and less than or equal to 6 µm.

Another embodiment of the present invention is a semiconductor device including a transistor including a stacked-layer oxide film including an oxide semiconductor film and a metal oxide film, a first gate electrode overlapping with the stacked-layer oxide film, a gate insulating film between the stacked-layer oxide film and the first gate electrode, a first insulating film over the stacked-layer oxide film, a pair of electrodes that are over the first insulating film and electrically connected to the stacked-layer oxide film, a second insulating film over the first insulating film and the pair of electrodes, and a second gate electrode that is over the second insulating film and overlaps with the stacked-layer oxide film. In a channel width direction of the transistor, the first gate electrode and the second gate electrode are connected to each other in an opening in the gate insulating film, the first insulating film, and the second insulating film, and the stacked-layer oxide film is surrounded by the first gate electrode and the second gate electrode with the gate insulating film between the stacked-layer oxide film and the first gate electrode and with the gate insulating film, the first insulating film, and the second insulating film between the stacked-layer oxide film and the second gate electrode. The first insulating film includes a region having a thickness greater than or equal to 1 nm and less than or equal to 50 nm, and the pair of electrodes includes a region in which a distance between the electrodes is greater than or equal to 1 μm and less than or equal to 6 μm.

In any of the structures, the oxide semiconductor film is preferably an In-M-Zn oxide (M is Ti, Ga, Y, Zr, La, Ce, Nd, Sn, or Hf). In any of the structures, it is preferable that the oxide semiconductor film include a crystal part, and that a c-axis of the crystal part be aligned parallel to a normal vector of a surface where the oxide semiconductor film is formed.

In any of the structures, the metal oxide film is preferably an In-M-Zn oxide or an In-M oxide (M is Ti, Ga, Y, Zr, La, Ce, Nd, Sn, or Hf). In any of the structures, it is preferable that the metal oxide film include a crystal part, and that a c-axis of the crystal part be aligned parallel to a normal vector of a surface where the metal oxide film is formed. In any of the structures, the energy level of the bottom of the conduction band of the metal oxide film be closer to the vacuum level than that of the oxide semiconductor film is.

Embodiments of the present invention also include a display device including the above semiconductor device.

According to one embodiment of the present invention, it is possible to provide a novel semiconductor device including an oxide semiconductor, a semiconductor device with a high on-state current including an oxide semiconductor, a semiconductor device with a low off-state current including an oxide semiconductor, a semiconductor device that occupies a small area including an oxide semiconductor, a semiconductor device with stable electrical characteristics including an oxide semiconductor, or a semiconductor device with high reliability including an oxide semiconductor. Furthermore, according to one embodiment of the present invention, a novel semiconductor device, a novel display device, or the like can be provided. Note that the description of these effects does not disturb the existence of other effects. One embodiment of the present invention does not necessarily obtain all the effects listed above. Other effects will be apparent from and can be derived from the description of the specification, the drawings, the claims, and the like.

BRIEF DESCRIPTION OF THE DRAWINGS

In the accompanying drawings:

FIG. 11 illustrates a cross section of a display device;

FIGS. 20A to 20D are Cs-corrected high-resolution TEM images of a plane of a CAAC-OS;

FIGS. 27A and 27B show electron diffraction patterns of a CAAC-OS;

DETAILED DESCRIPTION OF THE INVENTION

Figure 1A:
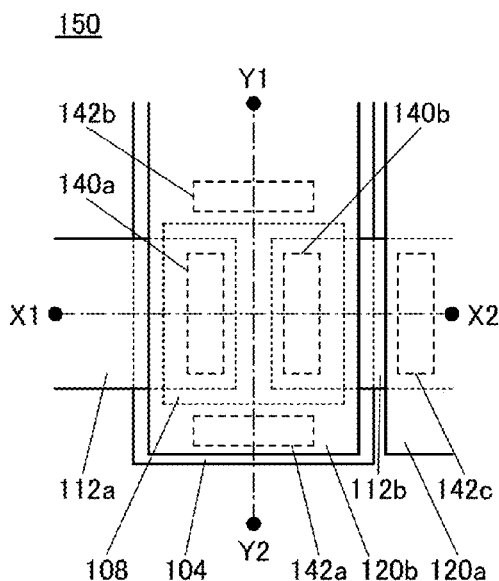
FIGS. 1A to 1C are a top view and cross-sectional views of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

(Embodiment 1)

In this embodiment, a semiconductor device of one embodiment of the present invention is described with reference to FIGS. 1A to 1C, FIG. 2, FIGS. 3A to 3C, FIGS. 4A to 4C, FIGS. 5A and 5B, FIGS. 6A to 6C, FIGS. 7A to 7C, FIGS. 8A to 8C, FIGS. 25A to 25C, and FIGS. 26A to 26C.

<Structure Example 1 of Semiconductor Device>

Figure 1B:
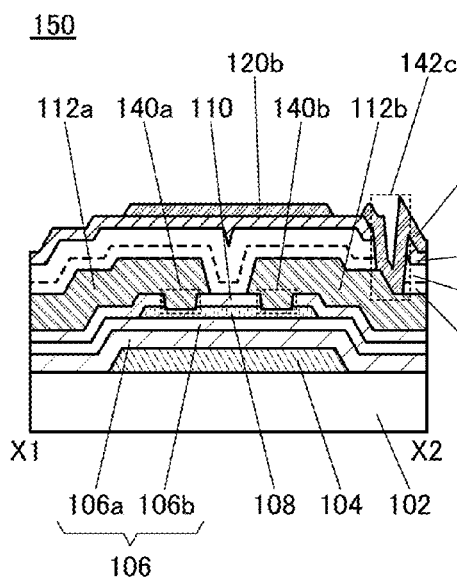
Figure 1C:
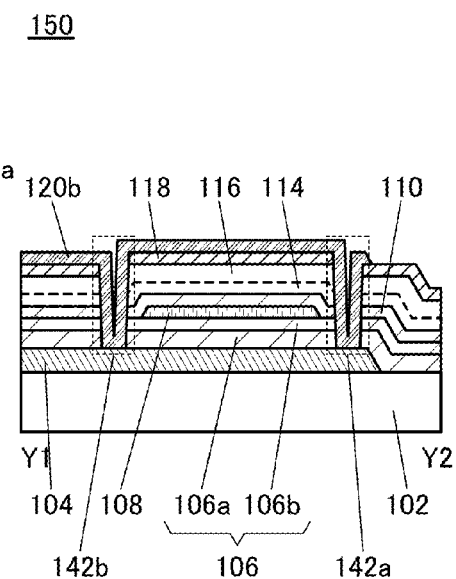

FIG. 1A is a top view of a transistor 150, which is a semiconductor device of one embodiment of the present invention. FIG. 1B is a cross-sectional view taken along dashed-dotted line X1-X2 shown in FIG. 1A, and FIG. 1C is a cross-sectional view taken along dashed-dotted line Y1-Y2 shown in FIG. 1A. Note that in FIG. 1A, some components of the transistor 150 (a gate insulating film and the like) are not illustrated for simplification. In a manner similar to that of the transistor 150, some components are not illustrated in some cases in top views of transistors described below. Furthermore, the direction of the dashed dotted line X1-X1 may be called a channel length direction, and the direction of the dashed dotted line Y1-Y2 may be called a channel width direction.

The transistor 150 includes a conductive film 104 functioning as a first gate electrode over a substrate 102; an insulating film 106 functioning as a gate insulating film over the substrate 102 and the conductive film 104; an oxide semiconductor film 108 provided over the insulating film 106 to overlap with the conductive film 104; a first insulating film 110 over the oxide semiconductor film 108; a pair of electrodes 112a and 112b that are over the first insulating film 110 and electrically connected to the oxide semiconductor film 108; insulating films 114, 116, and 118 over the first insulating film 110 and the pair of electrodes 112a and 112b; and conductive films 120a and 120b over the insulating film 118.

The conductive film 120a is connected to the electrode 112b through an opening 142c provided in the insulating films 114, 116, and 118. The conductive film 120b is formed over the insulating film 118 to overlap with the oxide semiconductor film 108.

The insulating film 106 functioning as a gate insulating film in the transistor 150 has a two-layer structure of an insulating film 106a and an insulating film 106b. Also in the transistors described below, the insulating film 106 functioning as a gate insulating film has the same structure, and detailed description thereof is omitted.

In the transistor 150, the first insulating film 110 functions as a protective insulating film of the oxide semiconductor film 108. The first insulating film 110 covers at least a channel region and a side surface of the oxide semiconductor film 108. In the transistor 150, the pair of electrodes 112a and 112b is in contact with the oxide semiconductor film 108 through openings 140a and 140b provided in the first insulating film 110. The insulating films 114, 116, and 118 in the transistor 150 function as a gate insulating film of the transistor 150. Note that the insulating films 114, 116, and 118 may be called a second insulating film. The conductive film 120a in the transistor 150 functions as, for example, a pixel electrode used for a display device. The conductive film 120b in the transistor 150 functions as a second gate electrode (also referred to as a back gate electrode).

In the transistor 150, the first insulating film 110 includes, for example, a region having a thickness greater than or equal to 1 nm and less than or equal to 50 nm. In addition, the pair of electrodes 112a and 112b includes, for example, a region in which the distance (e.g., the interval or the gap) between the electrode 112a and the electrode 112b is greater than or equal to 1 µm and less than or equal to 6 µm. The thickness of the first insulating film 110 and the distance between the pair of electrodes 112a and 112b are in the above ranges, whereby the on-state current, which is an electrical characteristic of a transistor, can be increased. Furthermore, the first insulating film 110 covers the oxide semiconductor film 108, so that impurities entering into the oxide semiconductor film 108 can be reduced. Thus, a highly reliable transistor having excellent electrical characteristics can be provided.

By forming the first insulating film 110 over the oxide semiconductor film 108, for example, damage to the oxide semiconductor film 108 (e.g., plasma damage at the time of sputtering) at the time of formation of a conductive film to be the pair of electrodes 112a and 112b can be suppressed. In addition, by providing the first insulating film 110 over the oxide semiconductor film 108, for example, damage to the oxide semiconductor film 108 (e.g., plasma damage at the time of dry etching) at the time of process of the pair of electrodes 112a and 112b can be suppressed. Thus, a highly reliable transistor having excellent electrical characteristics can be provided.

Figure 2:
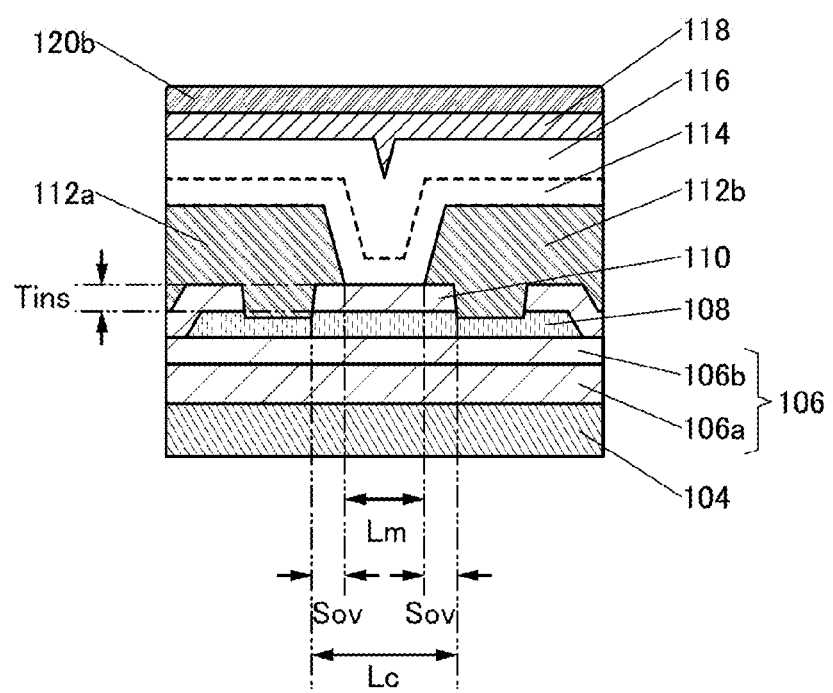
FIG. 2 is a cross-sectional view of a semiconductor device.

Here, FIG. 2 shows an enlarged cross-sectional view of some components in the semiconductor device illustrated in FIGS. 1A to 1C.

FIG. 2 is a cross-sectional view of the conductive film 104, the insulating film 106, the oxide semiconductor film 108, the first insulating film 110, the pair of electrodes 112a and 112b, the insulating films 114, 116, and 118, and the conductive film 120b that are included in the transistor 150.

In FIG. 2, Tins denotes the thickness of the first insulating film 110; Lm denotes the distance between the pair of electrodes 112a and 112b; Sov denotes the distance between an end of a portion where the oxide semiconductor film 108 is in contact with the electrode 112a on the electrode 112b side and an end of a portion where the first insulating film 110 is in contact with the electrode 112a on the electrode 112b side and the distance between an end of a portion where the oxide semiconductor film 108 is in contact with the electrode 112b on the electrode 112a side and an end of a portion where the first insulating film 110 is in contact with the electrode 112b on the electrode 112a side; and Lc denotes the distance between the end of a portion where the oxide semiconductor film 108 is in contact with the electrode 112a on the electrode 112b side and the end of a portion where the oxide semiconductor film 108 is in contact with the electrode 112b on the electrode 112a side.

In the case where the thickness Tins of the first insulating film 110 is 1 nm or greater and 50 nm or less, preferably 3 nm or greater and 30 nm or less, further preferably 5 nm or greater and 20 nm or less, a distance between a region corresponding to Sov in the oxide semiconductor film 108 and the pair of electrodes 112a and 112b is short; in other words, the thickness of the first insulating film 110 is small. Accordingly, the reduction in the thickness of the first insulating film 110 allows an electric field applied to the pair of electrodes 112a and 112b to also reach the oxide semiconductor film 108 side, so that part of the oxide semiconductor film 108 overlapping with the pair of electrodes 112a and 112b becomes n-type. Thus, an effective channel length of the transistor 150 can be shortened. Note that the channel length of the transistor 150 corresponds to the length of a portion in which the oxide semiconductor film 108 and the pair of electrodes 112a and 112b are in contact with each other, that is, Lc. The region corresponding to Sov in the oxide semiconductor film 108 becomes n-type, so that Lm that corresponds to the distance between the pair of electrodes 112a and 112b becomes the above effective channel length. When Lm corresponding to the distance between the pair of electrodes 112a and 112b is greater than or equal to 1 µm and less than or equal to 6 µm, the on-state current can be increased.

An In—Ga oxide, an In—Zn oxide, an In-M-Zn oxide (M is Ti, Ga, Y, Zr, La, Ce, Nd, Sn, or Hf) can be used for the oxide semiconductor film 108. In addition, it is preferable that the oxide semiconductor film 108 include a crystal part and that the c-axis of the crystal part be aligned in a direction parallel to a normal vector of a surface where the oxide semiconductor film 108 is formed. When the oxide semiconductor film 108 includes a crystal part, an impurity (e.g., a copper (Cu) element) contained in the pair of electrodes 112a and 112b can be inhibited from entering the oxide semiconductor film 108. Note that it is preferable that a c-axis aligned crystalline oxide semiconductor (CAAC-OS) described later be used for the oxide semiconductor film 108 including a crystal part.

illustrated in the cross-sectional view of FIG. 1C, the conductive film 120b is connected to the conductive film 104 functioning as a first gate electrode through openings 142a and 142b provided in the insulating films 106a, 106b, 114, 116, and 118 and the first insulating film 110. Therefore, the same potential is applied to the conductive film 120b and the conductive film 104.

As illustrated in the cross-sectional view of FIG. 1C, the oxide semiconductor film 108 is positioned to face each of the conductive film 104 functioning as a first gate electrode and the conductive film 120b functioning as a second gate electrode, and is sandwiched between the two conductive films functioning as gate electrodes. The lengths in the channel length direction and the channel width direction of the conductive film 120b functioning as a second gate electrode are longer than those in the channel length direction and the channel width direction of the oxide semiconductor film 108. The whole oxide semiconductor film 108 is covered with the conductive film 120b with the first insulating film 110 and the insulating films 114, 116, and 118 positioned therebetween. Since the conductive film 120b functioning as a second gate electrode is connected to the conductive film 104 functioning as a first gate electrode through the openings 142a and 142b provided in the insulating films 106a, 106b, 114, 116, and 118 and the first insulating film 110, a side surface of the oxide semiconductor film 108 in the channel width direction faces the conductive film 120b functioning as a second gate electrode with the first insulating film 110 positioned therebetween.

In other words, in the channel width direction of the transistor 150, the conductive film 104 functioning as a first gate electrode and the conductive film 120b functioning as a second gate electrode are connected to each other through the openings provided in the insulating film 106 functioning as a gate insulating film and the insulating films 114, 116, and 118 functioning as a gate insulating film; and the conductive film 104 and the conductive film 120b surround the oxide semiconductor film 108 with the insulating film 106 functioning as a gate insulating film between the oxide semiconductor film 108 and the conductive film 104 and with the first insulating film 110 and the insulating films 114, 116, and 118 functioning as a gate insulating film between the oxide semiconductor film 108 and the conductive film 120b.

Such a structure makes it possible that the oxide semiconductor film 108 included in the transistor 150 is electrically surrounded by electric fields of the conductive film 104 functioning as a first gate electrode and the conductive film 120*b* functioning as a second gate electrode. A device structure of a transistor, like that of the transistor 150, in which electric fields of a first gate electrode and a second gate electrode electrically surround an oxide semiconductor film where a channel region is formed can be referred to as a surrounded channel (s-channel) structure.

Since the transistor 150 has the s-channel structure, an electric field for inducing a channel can be effectively applied to the oxide semiconductor film 108 by the conductive film 104 functioning as a first gate electrode; therefore, the current drive capability of the transistor 150 can be improved and high on-state current characteristics can be obtained. Since the on-state current can be increased, it is possible to reduce the size of the transistor 150. In addition, since the transistor 150 is surrounded by the conductive film 104 functioning as a first gate electrode and the conductive film 120*b* functioning as a second gate electrode, the mechanical strength of the transistor 150 can be increased.

Note that in the transistor 150, one of the openings 142*a* and 142*b* may be provided, and the conductive film 120*b* and the conductive film 104 may be connected through the opening.

As described above, in a semiconductor device of one embodiment of the present invention, a first insulating film functioning as a protective insulating film of an oxide semiconductor film is provided over the oxide semiconductor film. Thus, entry of impurities contained in a pair of electrodes into the oxide semiconductor film can be suppressed. In addition, the first insulating film includes a region having a thickness greater than or equal to 1 nm and less than or equal to 50 nm, and the pair of electrodes includes a region where the distance between the electrodes is greater than or equal to 1 µm and less than or equal to 6 µm, whereby the on-state current of the transistor can be increased. Moreover, the structure of the transistor is an s-channel structure described above. Thus, current drive capability of the transistor can be improved and a novel semiconductor device with high reliability can be achieved. Note that one embodiment of the present invention is not limited thereto. Depending on circumstances or conditions, the first insulating film does not need to include a region having a thickness greater than or equal to 1 nm and less than or equal to 50 nm, and the pair of electrodes does not need to include a region where the distance between the electrodes is greater than or equal to 1 µm and less than or equal to 6 µm. Alternatively, the thickness of the first insulating film may be greater than or equal to 1 nm and less than or equal to 50 nm in the whole region. Alternatively, the distance between the pair of electrodes may be greater than or equal to 1 µm and less than or equal to 6 µm in the whole channel region.

Other constituent elements of the semiconductor device of this embodiment are described below in detail.

<Substrate>

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized display device can be manufactured.

Still further alternatively, a flexible substrate may be used as the substrate 102, and the transistor 150 may be provided directly on the flexible substrate. Further alternatively, a separation layer may be provided between the substrate 102 and the transistor 150. The separation layer can be used when part or the whole of a semiconductor device formed over the separation layer is separated from the substrate 102 and transferred to another substrate. In such a case, the transistor 150 can be transferred to a substrate having low heat resistance or a flexible substrate as well.

<Conductive Film>

The conductive film 104 functioning as a gate electrode can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy containing any of these metal element as its component; an alloy containing a combination of any of these elements; or the like. As an example of the alloy, a Cu—Mn alloy or the like is given. The conductive film 104 may have a single-layer structure or a stacked-layer structure of two or more layers. For example, any of the following can be used: a single-layer structure of an aluminum film containing silicon; a single-layer structure of a Cu—Mn alloy film; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a Cu—Mn alloy film; a three-layer structure in which a titanium film, an aluminum film, and a titanium film are stacked in this order; and a three-layer structure in which a Cu—Mn alloy film, a copper film, and a Cu—Mn alloy film are stacked in this order.

The conductive film 104 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, or a film of a metal nitride (e.g., InN or ZnN), or the like may be provided between the conductive film 104 and the insulating film 106*a*. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride semiconductor film, an In—Ga—Zn-based oxynitride semiconductor film having a higher nitrogen concentration than at least the oxide semiconductor film 108, specifically, an In—Ga—Zn-based oxynitride semiconductor film having a nitrogen concentration higher than or equal to 7 at. %, is used.

<Gate Insulating Film>

As each of the insulating films 106a and 106b functioning as a gate insulating film of the transistor 150, an insulating layer including at least one of the following films formed by a plasma enhanced chemical vapor deposition (PE-CVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the stacked-layer structure of the insulating films 106a and 106b is not necessarily employed, and an insulating film having a single-layer structure or a three or more insulating films including any of the above materials may be used.

Note that the insulating film 106b that is in contact with the oxide semiconductor film 108 functioning as a channel region of the transistor 150 is preferably an oxide insulating film and preferably includes a region (oxygen-excess region) containing oxygen in excess of the stoichiometric composition. In other words, the insulating film 106b is an insulating film capable of releasing oxygen. In order to provide the oxygen-excess region in the insulating film 106b, the insulating film 106b is formed in an oxygen atmosphere, for example. Alternatively, oxygen may be introduced into the deposited insulating film 106b to provide the oxygen-excess region therein. As a method for introducing oxygen, an ion implantation method, an ion doping method, a plasma immersion ion implantation method, plasma treatment, or the like may be employed.

Using hafnium oxide for the insulating films 106a and 106b has the following effects. Hafnium oxide has higher dielectric constant than silicon oxide and silicon oxynitride. Therefore, by using hafnium oxide or aluminum oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106a, and a silicon oxide film is formed as the insulating film 106b. A silicon nitride film has a higher dielectric constant than a silicon oxide film and needs a larger thickness for capacitance equivalent to that of the silicon oxide. Thus, when the gate insulating film of the transistor 150 includes a silicon nitride film, the physical thickness of the gate insulating film can be increased. This makes it possible to reduce a decrease in the withstand voltage of the transistor 150 and furthermore increase the withstand voltage, thereby preventing electrostatic breakdown of the transistor 150.

<Oxide Semiconductor Film>

The oxide semiconductor film 108 is typically In—Ga oxide film, In—Zn oxide film, or In-M-Zn oxide film (M is Ti, Ga, Y, Zr, La, Ce, Nd, Sn, or Hf). It is particularly preferable to use an In-M-Zn oxide (M is Ti, Ga, Y, Zr, La, Ce, Nd, Sn, or Hf) for the semiconductor film 108.

In the case where the oxide semiconductor film 108 includes In-M-Zn oxide (M is Ti, Ga, Y, Zr, La, Ce, Nd, Sn, or Hf), it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=1:1:1.5, and In:M:Zn=3:1:2 are preferable. Note that the atomic ratio of metal elements of the deposited oxide semiconductor film 108 vary from the above atomic ratio of metal elements of the sputtering target within a range of ±40% as an error.

Note that when the oxide semiconductor film 108 includes In-M-Zn oxide, the proportion of In and the proportion of M, not taking Zn and O into consideration, are preferably greater than or equal to 25 atomic % and less than 75 atomic %, respectively, further preferably greater than or equal to 34 atomic % and less than 66 atomic %, respectively.

The energy gap of the oxide semiconductor film 108 is 2 eV or more, preferably 2.5 eV or more, further preferably 3 eV or more. With the use of an oxide semiconductor having such a wide energy gap, the off-state current of the transistor 150 can be reduced.

The oxide semiconductor film 108 includes, for example, a region having a thickness of 3 nm to 200 nm, preferably 3 nm to 100 nm, more preferably 3 nm to 50 nm.

An oxide semiconductor film with low carrier density is used as the oxide semiconductor film 108. For example, the oxide semiconductor film 108 includes a region where carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably higher than or equal to $1\times10^{-9}/cm^3$ and lower than $1\times10^{10}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

Note that it is preferable to use, as the oxide semiconductor film 108, an oxide semiconductor film in which the impurity concentration is low and density of defect states is low, in which case the transistor can have more excellent electrical characteristics. Here, the state in which impurity concentration is low and density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current; even when an element has a channel width of $1\times10^6$ µm and a channel length L of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen contained in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. For example, the oxide semiconductor film 108 includes a region where the hydrogen concentration, which is measured by secondary ion mass spectrometry (SIMS), is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, even more preferably lower than $5\times10^{18}$ atoms/cm$^3$, still more preferably lower than or equal to $1\times10^{18}$ atoms/cm$^3$, yet still more preferably lower than or equal to $5\times10^{17}$ atoms/cm$^3$, even further more preferably lower than or equal to $1\times10^{16}$ atoms/cm$^3$.

When silicon or carbon, which is an element belonging to Group 14, is contained in the oxide semiconductor film 108, oxygen vacancies are increased in the oxide semiconductor film 108, and the oxide semiconductor film 108 becomes an n-type film. Note that the oxide semiconductor film 108 includes, for example, a region where the concentration of silicon or carbon measured by secondary ion mass spectrometry is lower than or equal to $2\times10^{18}$ atoms/cm$^3$, preferably lower than or equal to $2\times10^{17}$ atoms/cm$^3$.

In addition, the oxide semiconductor film 108 includes, for example, a region where the concentration of alkali metal or alkaline earth metal, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108.

Furthermore, when containing nitrogen, the oxide semiconductor film 108 easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible. For example, the oxide semiconductor film 108 preferably includes a region where the concentration of nitrogen measured by SIMS is lower than or equal to $5\times10^{18}$ atoms/cm$^3$.

The oxide semiconductor film 108 may have a non-single-crystal structure, for example. The non-single crystal structure includes, for example, a CAAC-OS described later, a polycrystalline structure, a microcrystalline structure described later, and an amorphous structure. Among the non-single crystal structure, the amorphous structure has the highest density of defect levels, whereas CAAC-OS has the lowest density of defect levels.

The oxide semiconductor film 108 may have an amorphous structure, for example. The oxide semiconductor films having the amorphous structure each have disordered atomic arrangement and no crystalline component, for example. Alternatively, the oxide films having an amorphous structure have, for example, an absolutely amorphous structure and no crystal part.

Note that the oxide semiconductor film 108 may be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

<First Insulating Film>

As the first insulating film 110 that can be used in the transistor 150, an insulating film including at least one of the following films formed by a PE-CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide layer. Note that the first insulating film 110 may have a stacked-layer structure of any of these films. To improve the interface characteristics between the first insulating film 110 and the oxide semiconductor film 108, it is particularly preferable to use a silicon oxide film or a silicon oxynitride film as the first insulating film 110.

Note that the first insulating film 110 that is in contact with the oxide semiconductor film 108 is preferably an oxide insulating film and preferably includes a region (oxygen-excess region) containing oxygen in excess of the stoichiometric composition. In order to provide the oxygen-excess region in the first insulating film 110, the first insulating film 110 may be formed in an oxygen atmosphere, for example. Alternatively, oxygen may be introduced into the formed first insulating film 110 to form the oxygen-excess region therein. As a method for introducing oxygen, an ion implantation method, an ion doping method, a plasma immersion ion implantation method, plasma treatment, or the like may be employed.

The first insulating film 110 preferably includes, for example, a region where the nitrogen concentration measured by SIMS is lower than or equal to $6\times10^{20}$ atoms/cm$^3$. In that case, nitrogen oxide is unlikely to be generated in the first insulating film 110, so that the carrier trap at the interface between the first insulating film 110 and the oxide semiconductor film 108 can be inhibited. When the nitrogen concentration in the first insulating film 110 is in the above range, a shift in the threshold voltage of the transistor included in the semiconductor device can be reduced.

The first insulating film 110 includes, for example, a region having a thickness of 1 nm or more and 50 nm or less.

Figure 32A:
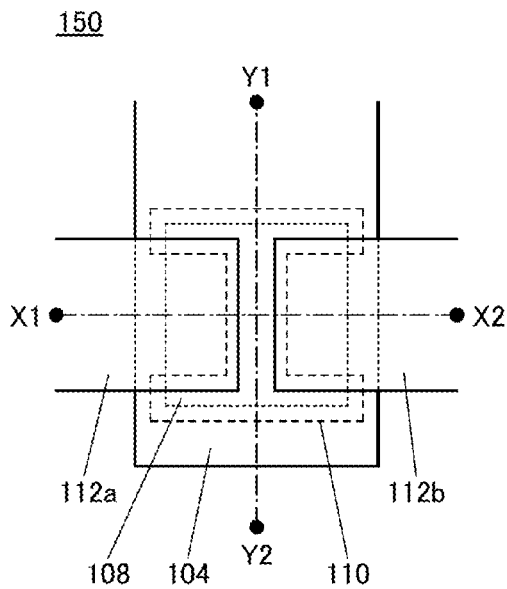
FIGS. 32A to 32C are a top view and cross-sectional views of a semiconductor device.
Figure 32B:
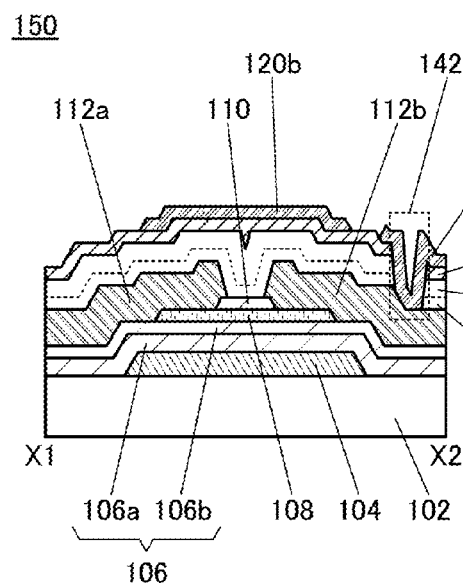
Figure 32C:
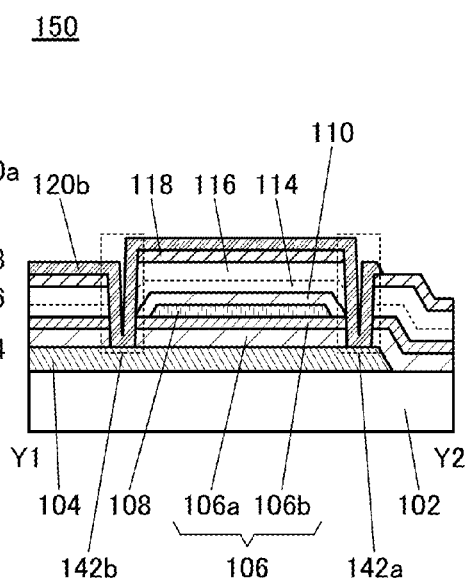

Alternatively, the first insulating film 110 may have a shape as illustrated in FIGS. 32A to 32C. FIG. 32A is a top view of the transistor 150, FIG. 32B is a cross-sectional view taken along dashed-dotted line X1-X2 shown in FIG. 32A, and FIG. 32C is a cross-sectional view taken along dashed-dotted line Y1-Y2 shown in FIG. 32A. Note that in FIG. 32A, to clarify the shape of the first insulating film 110, the openings 142a, 142b, and 142c and the conductive films 120a and 120b are not illustrated.

The first insulating film 110 covers at least a channel region and a side surface of the oxide semiconductor film 108; however, as illustrated in FIGS. 32A to 32C, part of the side surface of the oxide semiconductor film 108 may be exposed from the first insulating film 110 and in contact with the pair of electrodes 112a and 112b. For example, the insulating film 110 is processed into an island shape when the openings 140a and 140b are formed, whereby the transistor structure illustrated in FIGS. 32A to 32C can be obtained.

<Electrode>

The pair of electrodes 112a and 112b functioning as a source electrode and a drain electrode of the transistor 150 is preferably formed with a single layer or a stacked layer of a low-resistance material such as copper, aluminum, gold, or silver; an alloy containing any of these materials; or a compound containing any of these materials as a main component. The pair of electrodes 112a and 112b also functions as wirings; therefore, even in the case where a large-sized substrate is used as the substrate 102, when the pair of electrodes 112a and 112b is formed to contain a low-resistance material such as copper, aluminum, gold, or silver, a semiconductor device in which wiring delay is suppressed can be manufactured.

In the case where the pair of electrodes 112a and 112b has a two-layer structure, the pair of electrodes 112a and 112b is formed such that the second conductive film is thick and contains a low-resistance material such as copper, aluminum, gold, or silver, an alloy containing any of these materials, or a compound containing any of these components as a main component; and a conductive film functioning as a barrier film against the second conductive film is used as the first conductive film. For example, as the first conductive film, a conductive film of titanium, tantalum, molybdenum, tungsten; an alloy containing any of these elements; or a conductive film containing titanium nitride, tantalum nitride, molybdenum nitride, tungsten nitride; or the like can be used as the barrier film. In the case where the pair of electrodes 112a and 112b has a three-layer structure, the third conductive film is preferably formed using a conductive film functioning as a barrier film against the second conductive film so as to be over and in contact with the first and second conductive films.

In the case where the pair of electrodes 112a and 112b has a two-layer structure, for example, any of the following structures is preferably used: a structure in which an aluminum film is stacked on a titanium film; a structure in which a copper film is stacked on a tungsten film; a structure in which an aluminum film is stacked on a tungsten film; a structure in which a copper film is stacked on a copper-magnesium-aluminum alloy film; a structure in which a copper film is stacked on a titanium film; a structure in which a copper film is stacked on a tungsten film; a structure in which a copper film is stacked on a molybdenum film; a structure in which a copper film is stacked on an alloy film containing molybdenum and tungsten; a structure in which a copper film is stacked on an alloy film containing molybdenum and zirconium; and a structure in which a copper film is stacked on a Cu—Mn alloy film. In the case where the pair of electrodes 112a and 112b has a three-layer structure, it is preferable that a film formed of titanium, titanium nitride, molybdenum, tungsten, an alloy containing molybdenum and tungsten, an alloy containing molybdenum and zirconium, a Cu—Mn alloy, or molybdenum nitride be formed as each of the first and third layers, and that a film formed of a low-resistance material such as copper, aluminum, gold, or silver be formed as the second layer.

<Insulating Films>

The insulating films 114, 116, and 118 function as a gate insulating film of the transistor 150 and also function as a protective insulating film for the oxide semiconductor film 108. For example, the insulating film 114 is an insulating film which is permeable to oxygen. Note that the insulating film 114 also functions as a film which relieves damage to the oxide semiconductor film 108 at the time of forming the insulating film 116 in a later step. Note that the insulating film 114 is not necessarily provided.

A silicon oxide film, a silicon oxynitride film, or the like including a region having a thickness greater than or equal to 5 nm and less than or equal to 150 nm, preferably greater than or equal to 5 nm and less than or equal to 50 nm can be used as the insulating film 114, for example. Note that in this specification, a "silicon oxynitride film" refers to a film that contains more oxygen than nitrogen, and a "silicon nitride oxide film" refers to a film that contains more nitrogen than oxygen.

Furthermore, it is preferable that the number of defects in the insulating film 114 be small and typically, the spin density of a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that passes through the insulating film 114 is decreased.

Note that all oxygen entering the insulating film 114 from the outside is not moved to the outside of the insulating film 114 and some oxygen remains in the insulating film 114 in some cases. In addition, oxygen enters the insulating film 114 and oxygen contained in the insulating film 114 is moved to the outside of the insulating film 114, whereby movement of oxygen in the insulating film 114 occurs in some cases. When the oxide insulating film which is permeable to oxygen is formed as the insulating film 114, oxygen released from the insulating film 116 provided over the insulating film 114 can be moved to the oxide semiconductor film 108 through the insulating film 114.

The insulating film 116 is formed using an oxide insulating film containing more oxygen than that in the stoichiometric composition. Part of oxygen is released by heating from the oxide insulating film containing more oxygen than that in the stoichiometric composition. The oxide insulating film containing more oxygen than that in the stoichiometric composition is an oxide insulating film in which the amount of released oxygen converted into oxygen atoms is greater than or equal to $8.0 \times 10^{14}$/cm$^2$, preferably greater than or equal to $1.0 \times 10^{15}$/cm$^2$, further preferably greater than or equal to $1.5\times10^{15}/cm^2$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

Oxygen may be introduced to the formed insulating film 116 so that the insulating film 116 contains more oxygen than that in the stoichiometric composition. Oxygen can be introduced by an ion implantation method, an ion doping method, a plasma immersion ion implantation method, plasma treatment, or the like, for example. When oxygen is introduced, a substrate is preferably heated because a larger amount of oxygen can be introduced. The substrate temperature at the time when oxygen is introduced is preferably higher than room temperature and lower than 350° C., for example. For the above plasma treatment, an apparatus with which an oxygen gas is made to be plasma by high-frequency power (also referred to as a plasma etching apparatus or a plasma ashing apparatus) is preferably used.

In the case where oxygen is introduced to the insulating film 116, a protective film that suppresses release of oxygen may be formed over the insulating film 116. For the protective film, a material that can be used for the conductive films 120a and 120b described later may be used.

For example, the above protective film is formed over the insulating film 116 after the insulating film 116 is formed, and then oxygen is introduced to the insulating film 116 through the protective film by plasma treatment. Then, the protective film is removed. Thus, the insulating film 116 can contain more oxygen than that in the stoichiometric composition.

As the insulating film 116, for example, a silicon oxide film, a silicon oxynitride film, or the like including a region having a thickness greater than or equal to 30 nm and less than or equal to 500 nm, preferably greater than or equal to 50 nm and less than or equal to 400 nm can be used.

Further, it is preferable that the amount of defects in the insulating film 116 be small, and typically the spin density of a signal that appears at g=2.001 due to a dangling bond of silicon be lower than $1.5\times10^{18}$ spins/cm$^3$, further preferably lower than or equal to $1\times10^{18}$ spins/cm$^3$ by ESR measurement. Note that the insulating film 116 is provided more apart from the oxide semiconductor film 108 than the insulating film 114 is; thus, the insulating film 116 may have higher defect density than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, one embodiment of the present invention is not limited thereto. For example, a single-layer structure of the insulating film 114, a single-layer structure of the insulating film 116, or a stacked-layer structure of three or more layers may be used.

The insulating film 118 has a function of blocking oxygen, hydrogen, water, an alkali metal, an alkaline earth metal, and the like. By providing the insulating film 118, it is possible to prevent outward diffusion of oxygen from the oxide semiconductor film 108 and entry of hydrogen, water, or the like into the oxide semiconductor film 108 from the outside. The insulating film 118 can be formed using a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

<Conductive Film>

For example, a material including one of indium (In), zinc (Zn), and tin (Sn) can be used for the conductive films 120a and 120b used in the transistor 150. In particular, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used for the conductive films 120a and 120b. Furthermore, for the conductive films 120a and 120b used in the transistor 150, the above-described material that can be used for the conductive film 104 functioning as the first gate electrode or the above-described material that can be used for the pair of electrodes 112a and 112b functioning as the source electrode and the drain electrode may be used. The conductive films 120a and 120b can be formed by a sputtering method, for example.

Although a variety of films such as the conductive films, the insulating films, and the oxide semiconductor films which are described above can be formed by a sputtering method or a PE-CVD method, such films may be formed by another method, e.g., a thermal CVD method or an atomic layer deposition (ALD) method. As an example of a thermal CVD method, a metal organic chemical vapor deposition (MOCVD) method can be given.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time so that the pressure in the chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, a source gas for reaction is sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed using a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing an ALD method, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing an ALD method, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. In addition, instead of an $In(CH_3)_3$ gas, an $In(C_2H_5)_3$ gas may be used. Moreover, a $Zn(CH_3)_2$ gas may be used.

<Structure Example 2 of Semiconductor Device>

Next, a transistor 152 and a transistor 154, which are semiconductor devices of embodiments of the present invention, are described with reference to FIGS. 3A to 3C, FIGS. 4A to 4C, and FIGS. 5A and 5B.

First, the transistor 152, which is a semiconductor device of one embodiment of the present invention, is described with reference to FIGS. 3A to 3C.

Figure 3A:
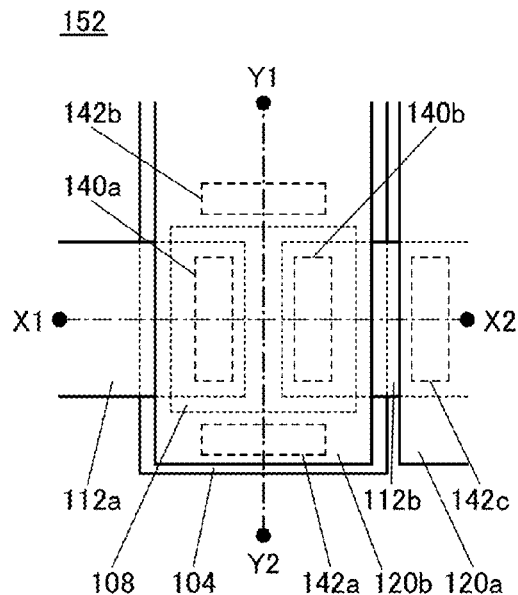
FIGS. 3A to 3C are a top view and cross-sectional views of a semiconductor device.

FIG. 3A is a top view of the transistor 152, which is a semiconductor device of one embodiment of the present invention. FIG. 3B is a cross-sectional view taken along dashed dotted line X1-X2 in FIG. 3A. FIG. 3C is a cross-sectional view taken along dashed dotted line Y1-Y2 in FIG. 3A.

The transistor 152 includes the conductive film 104 functioning as a first gate electrode over the substrate 102; the insulating film 106 functioning as a gate insulating film over the substrate 102 and the conductive film 104; the oxide semiconductor film 108 provided over the insulating film 106 to overlap with the conductive film 104; metal oxide films 108a and 108b over the oxide semiconductor film 108; the first insulating film 110 over the metal oxide film 108b; the pair of electrodes 112a and 112b that are over the first insulating film 110 and electrically connected to the oxide semiconductor film 108; the insulating films 114, 116, and 118 over the first insulating film 110 and the pair of electrodes 112a and 112b; and the conductive films 120a and 120b over the insulating film 118.

The oxide semiconductor film 108 and the metal oxide films 108a and 108b are collectively referred to as stacked-layer oxide films in some cases.

Figure 3B:
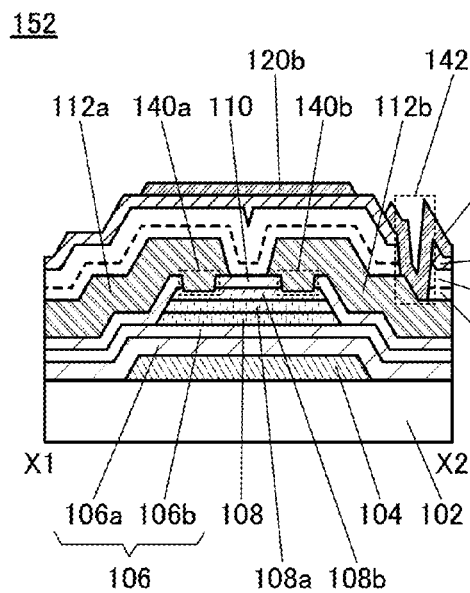
Figure 3C:
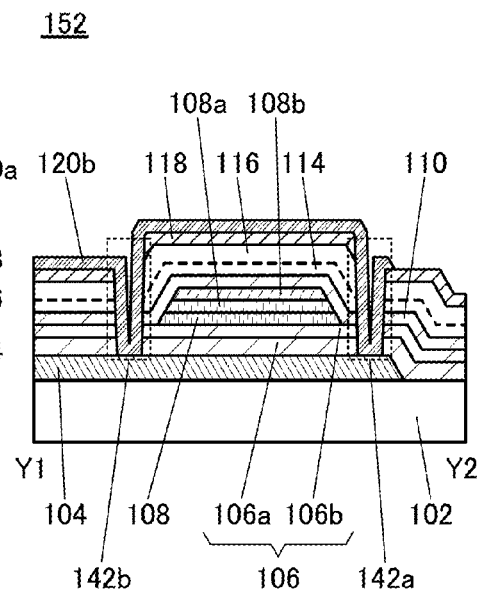

The transistor 152 in FIGS. 3A to 3C is different from the transistor 150 in FIGS. 1A to 1C in that the metal oxide films 108a and 108b are provided over the oxide semiconductor film 108. The other structures are the same as those of the transistor 150 and the effect similar to that in the case of the transistor 150 can be obtained. Note that in the transistor 152, the metal oxide films 108a and 108b can further inhibit an impurity (here, an impurity contained in the pair of electrodes 112a and 112b, such as Cu) from entering the oxide semiconductor film 108. Note that the details of the metal oxide films 108a and 108b are described later.

Like the transistor 150 described above, the transistor 152 has an s-channel structure.

Specifically, as illustrated in the cross-sectional view of FIG. 3B, the oxide semiconductor film 108 is positioned to face each of the conductive film 104 functioning as a first gate electrode and the conductive film 120b functioning as a back gate electrode, and is sandwiched between the two conductive films functioning as gate electrodes. The lengths in the channel length direction and the channel width direction of the conductive film 120b functioning as a back gate electrode are longer than those in the channel length direction and the channel width direction of the oxide semiconductor film 108. The whole oxide semiconductor film 108 and metal oxide films 108a and 108b are covered with the conductive film 120b with the first insulating film 110 and the insulating films 114, 116, and 118 positioned therebetween. Since the conductive film 120b functioning as a back gate electrode is connected to the conductive film 104 functioning as a first gate electrode through the openings 142a and 142b provided in the insulating films 106a, 106b, 114, 116, and 118 and the first insulating film 110, a side surface of the oxide semiconductor film 108 in the channel width direction faces the conductive film 120b functioning as a back gate electrode with the first insulating film 110 positioned therebetween.

In other words, in the channel width direction of the transistor 152, the conductive film 104 functioning as a first gate electrode and the conductive film 120b functioning as a back gate electrode are connected to each other through the openings provided in the insulating film 106 functioning as a gate insulating film, the first insulating film 110, and the insulating films 114, 116, and 118 functioning as a gate insulating film; and the conductive film 104 and the conductive film 120b surround the oxide semiconductor film 108 with the insulating film 106 functioning as a gate insulating film between the oxide semiconductor film 108 and the conductive film 104 and with the first insulating film 110 and the insulating films 114, 116, and 118 functioning as a gate insulating film between the oxide semiconductor film 108 and the conductive film 120b.

Next, a transistor 154, which is a semiconductor device of one embodiment of the present invention, is described with reference to FIGS. 4A to 4C.

Figure 4A:
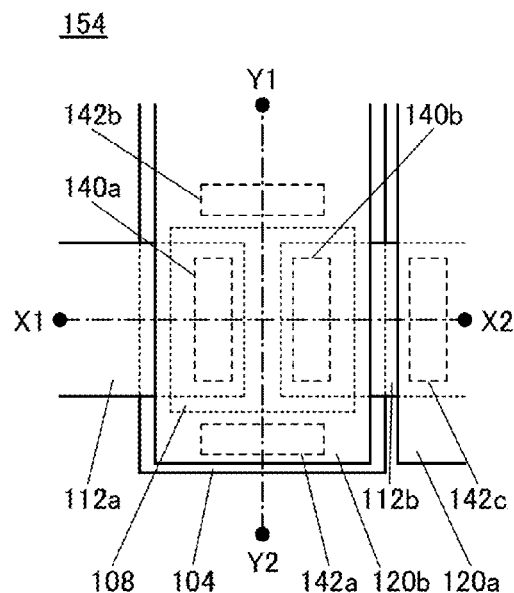
FIGS. 4A to 4C are a top view and cross-sectional views of a semiconductor device.

FIG. 4A is a top view of the transistor 154, which is a semiconductor device of one embodiment of the present invention. FIG. 4B is a cross-sectional view taken along dashed dotted line X1-X2 in FIG. 4A. FIG. 4C is a cross-sectional view taken along dashed dotted line Y1-Y2 in FIG. 4A.

The transistor 154 includes the conductive film 104 functioning as a first gate electrode over the substrate 102; the insulating film 106 functioning as a gate insulating film over the substrate 102 and the conductive film 104; the oxide semiconductor film 108 provided over the insulating film 106 to overlap with the conductive film 104; the metal oxide film 108b over the oxide semiconductor film 108; the first insulating film 110 over the metal oxide film 108b; the pair of electrodes 112a and 112b that are over the first insulating film 110 and electrically connected to the oxide semiconductor film 108; the insulating films 114, 116, and 118 over the first insulating film 110 and the pair of electrodes 112a and 112b; and the conductive films 120a and 120b over the insulating film 118.

The oxide semiconductor film 108 and the metal oxide film 108b are collectively referred to as stacked-layer oxide films in some cases.

Figure 4B:
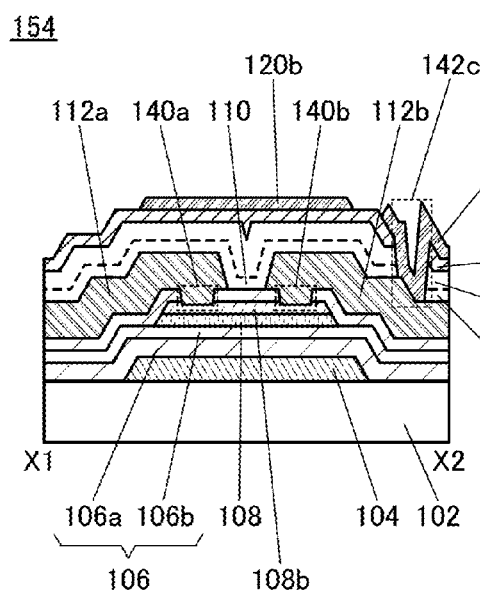
Figure 4C:
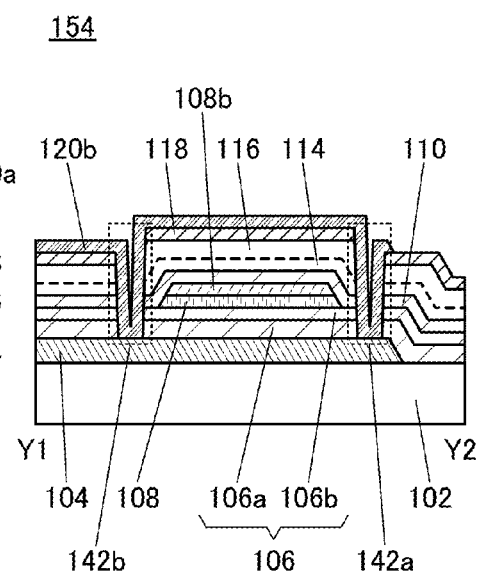

The transistor 154 in FIGS. 4A to 4C is different from the transistor 150 in FIGS. 1A to 1C in that the metal oxide film 108b is provided over the oxide semiconductor film 108. The other structures are the same as those of the transistor 150 and the effect similar to that in the case of the transistor 150 can be obtained. Note that in the transistor 154, the metal oxide film 108b can further inhibit an impurity (here, an impurity contained in the pair of electrodes 112a and 112b) from entering the oxide semiconductor film 108.

Like the transistor 150 described above, the transistor 154 has an s-channel structure.

Next, the oxide semiconductor film 108, the metal oxide film 108a, and the metal oxide film 108b, which can be used in the transistor 152 in FIGS. 3A to 3C and the transistor 154 in FIGS. 4A to 4C, are described in detail below.

For the oxide semiconductor film 108, for example, a material described above, which contains an In-M-Zn oxide (M is Ti, Ga, Y, La, Ce, Nd, Sn, or Hf), is used. For the metal oxide film 108a, a material containing an In-M-Zn metal oxide or an In-M oxide (M is Ti, Ga, Y, Zr, La, Ce, Nd, Sn, or Hf) is used. For the metal oxide film 108b, a material containing an In-M-Zn oxide or an In-M oxide (M is Ti, Ga, Y, Zr, La, Ce, Nd, Sn, or Hf) is used.

Note that in the case where the metal oxide film 108a and the metal oxide film 108b are formed using the same kinds of materials, the interface between the metal oxide film 108a and the metal oxide film 108b cannot be observed in some cases.

To increase a blocking property against a constituent element of the pair of electrodes 112a and 112b, e.g., a copper element, it is preferable that the metal oxide film 108b be formed of CAAC-OS described later.

Here, a band structure of the oxide semiconductor film 108 and the metal oxide films 108a and 108b and a band structure of the oxide semiconductor film 108 and the insulating film in contact with the metal oxide films 108a and 108b are described with reference to FIGS. 5A and 5B.

Figure 5A:
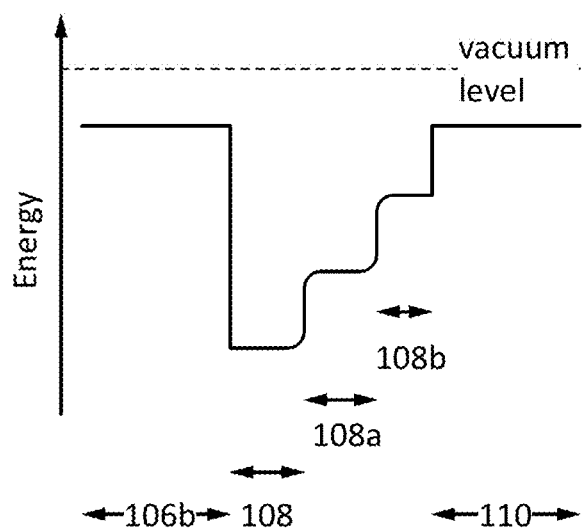
FIGS. 5A and 5B each illustrate an energy band of a stacked-layer film.

FIG. 5A shows an example of a band structure in the thickness direction of a stacked-layer structure of the insulating film 106b, the oxide semiconductor film 108, the metal oxide film 108a, the metal oxide film 108b, and the first insulating film 110. FIG. 5B shows an example of a band structure in the thickness direction of a stacked-layer structure of the insulating film 106b, the oxide semiconductor film 108, the metal oxide film 108b, and the first insulating film 110. For easy understanding, the energy level (Ec) of the bottom of the conduction band of each of the insulating film 106b, the oxide semiconductor film 108, the metal oxide films 108a and 108b, and the first insulating film 110 is shown in the band structures.

In the band structure of FIG. 5A, a silicon oxide film is used as each of the insulating film 106b and the first insulating film 110, an oxide semiconductor film formed using a metal oxide target having an atomic ratio of metal elements of In:Ga:Zn=1:1:1 is used as the oxide semiconductor film 108, a metal oxide film formed using a metal oxide target having an atomic ratio of metal elements of In:Ga:Zn=1:3:6 is used as the metal oxide film 108a, and a metal oxide film formed using a metal oxide target having an atomic ratio of metal elements of In:Ga:Zn=1:4:5 is used as the metal oxide film 108b.

Figure 5B:
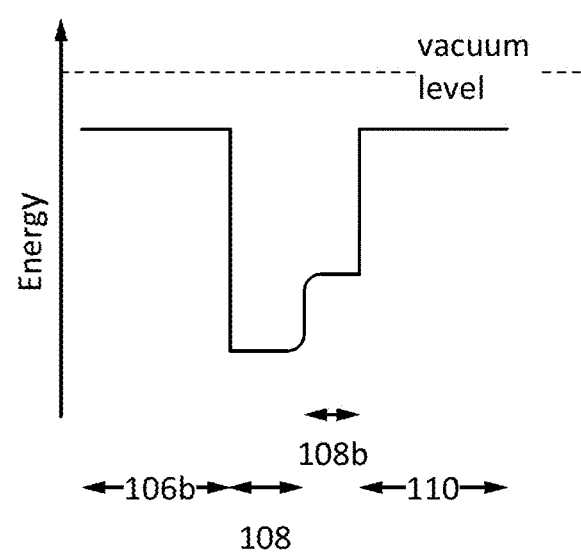

In the band structure of FIG. 5B, a silicon oxide film is used as each of the insulating film 106b and the first insulating film 110, an oxide semiconductor film formed using a metal oxide target having an atomic ratio of metal elements of In:Ga:Zn=1:1:1 is used as the oxide semiconductor film 108, and a metal oxide film formed using a metal oxide target having an atomic ratio of metal elements of In:Ga:Zn=1:3:6 is used as the metal oxide film 108b.

As illustrated in FIGS. 5A and 5B, the energy level of the bottom of the conduction band smoothly varies between the oxide semiconductor film 108 and the metal oxide film 108a or between the oxide semiconductor film 108 and the metal oxide film 108b. In other words, the energy level of the bottom of the conduction band is continuously varied, or a continuous junction is formed. To obtain such a band structure, there exists no impurity, which forms a defect state such as a trap center or a recombination center for the oxide semiconductor, at the interface between the oxide semiconductor film 108 and the metal oxide film 108a or at the interface between the oxide semiconductor film 108 and the metal oxide film 108b.

To form a continuous junction between the oxide semiconductor film 108 and the metal oxide film 108a and between the oxide semiconductor film 108 and the metal oxide film 108b, it is necessary to form the films successively without exposure to the air by using a multi-chamber deposition apparatus (sputtering apparatus) provided with a load lock chamber.

With the band structure of FIG. 5A or FIG. 5B, the oxide semiconductor film 108 serves as a well, and a channel region is formed in the oxide semiconductor film 108 in the transistor with the stacked-layer structure.

By providing the metal oxide films 108a and 108b, the oxide semiconductor film 108 can be distanced away from trap states.

In addition, the trap states might be more distant from the vacuum level than the energy level (Ec) of the bottom of the conduction band of the oxide semiconductor film 108 functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level (Ec) of the bottom of the conduction band of the oxide semiconductor film 108. Such a structure inhibits accumulation of electrons in the trap states. As a result, the on-state current and the field-effect mobility of the transistor can be increased.

In FIGS. 5A and 5B, the energy level of the bottom of the conduction band of each of the metal oxide films 108a and 108b is closer to the vacuum level than that of the oxide semiconductor film 108. Typically, an energy difference between the bottom of the conduction band of the oxide semiconductor film 108 and the bottom of the conduction band of each of the metal oxide films 108a and 108b is greater than or equal to 0.15 eV or greater than or equal to 0.5 eV, and less than or equal to 2 eV or less than or equal to 1 eV. That is, the difference between the electron affinity of each of the metal oxide films 108a and 108b and the electron affinity of the oxide semiconductor film 108 is greater than or equal to 0.15 eV or greater than or equal to 0.5 eV, and less than or equal to 2 eV or less than or equal to 1 eV.

In such a structure, the oxide semiconductor film 108 serves as a main path of current and functions as a channel region. In addition, since the metal oxide films 108a and 108b each contain one or more metal elements contained in the oxide semiconductor film 108 in which a channel region is formed, interface scattering is less likely to occur at the interface between the oxide semiconductor film 108 and the metal oxide film 108a or the interface between the oxide semiconductor film 108 and the metal oxide film 108b. Thus, the transistor can have high field-effect mobility because the movement of carriers is not hindered at the interface.

To prevent each of the metal oxide films 108a and 108b from functioning as part of a channel region, a material having sufficiently low conductivity is used for the metal oxide films 108a and 108b. Alternatively, a material which has a smaller electron affinity (a difference in energy level between the vacuum level and the bottom of the conduction band) than the oxide semiconductor film 108 and has a difference in energy level of the bottom of the conduction band from the oxide semiconductor film 108 (band offset) is used for the metal oxide films 108a and 108b. Furthermore, to inhibit generation of a difference between threshold voltages due to the value of the drain voltage, it is preferable to form the metal oxide films 108a and 108b using a material whose energy level of the bottom of the conduction band is closer to the vacuum level than that of the oxide semiconductor film 108 is by more than 0.2 eV, preferably 0.5 eV or more.

It is preferable that the metal oxide films 108a and 108b not have a spinel crystal structure. If the metal oxide film 108a or the metal oxide film 108b has a spinel crystal structure, constituent elements of the pair of electrodes 112a and 112b might be diffused into the oxide semiconductor film 108 at the interface between the spinel structure and another region. Note that each of the metal oxide films 108a and 108b is preferably a CAAC-OS, which is described later, in which case a higher blocking property against constituent elements of the pair of electrodes 112a and 112b, e.g., a copper element, is obtained.

The thickness of each of the metal oxide films 108a and 108b is greater than or equal to a thickness that is capable of inhibiting diffusion of the constituent element of the pair of electrodes 112a and 112b into the oxide semiconductor film 108, and less than a thickness that inhibits supply of oxygen from the first insulating film 110 or the insulating film 114 to the oxide semiconductor film 108. For example, when the thickness of each of the metal oxide films 108a and 108b is greater than or equal to 10 nm, the constituent elements of the pair of electrodes 112a and 112b can be prevented from diffusing into the oxide semiconductor film 108. When the thickness of each of the metal oxide films 108a and 108b is less than or equal to 100 nm, oxygen can be effectively supplied from the first insulating film 110 or the insulating films 114 and 116 to the oxide semiconductor film 108.

When the metal oxide films 108a and 108b are each an In-M-Zn oxide in which the atomic ratio of the element M (M is Ti, Ga, Y, Zr, La, Ce, Nd, Sn, or Hf) is higher than that of In, the energy gap of each of the metal oxide films 108a and 108b can be large and the electron affinity thereof can be small. Therefore, a difference in electron affinity between the oxide semiconductor film 108 and each of the metal oxide films 108a and 108b may be controlled by the proportion of the element M. Furthermore, oxygen vacancy is less likely to be generated in the metal oxide film in which the atomic ratio of Ti, Ga, Y, Zr, La, Ce, Nd, Sn, or Hf is higher than that of In because Ti, Ga, Y, Zr, La, Ce, Nd, Sn, and Hf are each a metal element that is strongly bonded to oxygen.

When the metal oxide films 108a and 108b are each an In-M-Zn oxide, the proportion of In and the proportion of M, not taking Zn and O into consideration, are preferably less than 50 at. % and greater than or equal to 50 at. %, respectively, further preferably less than 25 at. % and greater than or equal to 75 at. %, respectively.

Furthermore, in the case where the oxide semiconductor film 108 and the metal oxide films 108a and 108b are each an In-M-Zn oxide (M is Ti, Ga, Y, Zr, La, Ce, Nd, Sn, or Hf), the proportion of M (M is Ti, Ga, Y, Zr, La, Ce, Nd, Sn, or Hf) in each of the metal oxide films 108a and 108b is larger than that in the oxide semiconductor film 108. Typically, the proportion of M in each of the metal oxide films 108a and 108b is 1.5 or more times, preferably two or more times, further preferably three or more times as large as that in the oxide semiconductor film 108.

Furthermore, in the case where the oxide semiconductor film 108 and the metal oxide films 108a and 108b are each an In-M-Zn oxide (M is Ti, Ga, Y, Zr, La, Ce, Nd, Sn, or Hf), when the oxide semiconductor film 108 has an atomic ratio of In:M:Zn=$x_1$:$y_1$:$z_1$ and the metal oxide films 108a and 108b each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, still further preferably $y_2/x_2$ is three or more times or four or more times as large as $y_1/x_1$. In that case, it is preferable that, in the oxide semiconductor film

108, $y_1$ be larger than or equal to $x_1$ because the transistor including the oxide semiconductor film 108 can have stable electric characteristics. However, when $y_1$ is three or more times as large as $x_1$, the field-effect mobility of the transistor including the oxide semiconductor film 108 is reduced. Accordingly, $y_1$ is preferably smaller than three times $x_1$.

In the case where the oxide semiconductor film 108 is an In-M-Zn oxide (M is Ti, Ga, Y, Zr, La, Ce, Nd, Sn, or Hf) and a target having the atomic ratio of metal elements of In:M:Zn=$x_1$:$y_1$:$z_1$ is used for depositing the oxide semiconductor film 108, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later is easily formed as the oxide semiconductor film 108. Typical examples of the atomic ratio of the metal elements of the target include In:M:Zn=1:1:1, In:M:Zn=1:1:1.2, In:M:Zn=1:1:1.5, and In:M:Zn=3:1:2.

In the case where the metal oxide films 108a and 108b are each an In-M-Zn oxide (M is Ti, Ga, Y, Zr, La, Ce, Nd, Sn, or Hf) and a target having an atomic ratio of metal elements of In:M:Zn=$x_2$:$y_2$:$z_2$ is used for depositing the metal oxide films 108a and 108b, $x_2/y_2$ is preferably less than $x_1/y_1$, and $z_2/y_2$ is preferably greater than or equal to ⅓ and less than or equal to 6, further preferably greater than or equal to 1 and less than or equal to 6. When the atomic ratio of M with respect to indium is high, the energy gap of each of the metal oxide films 108a and 108b can be large and the electron affinity thereof can be small; therefore, $y_2/x_2$ is preferably greater than or equal to 3 or greater than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, In:M:Zn=1:4:6, In:M:Zn=1:4:7, In:M:Zn=1:4:8, and In:M:Zn=1:5:5.

Furthermore, in the case where the metal oxide films 108a and 108b are each an In-M oxide (M is Ti, Ga, Y, Zr, La, Ce, Nd, Sn, or Hf), when a divalent metal element (e.g., zinc) is not contained as M, the metal oxide films 108a and 108b which do not include a spinel crystal structure can be formed. As the metal oxide films 108a and 108b, for example, an In—Ga oxide film can be used. The In—Ga oxide can be formed by a sputtering method using an In—Ga metal oxide target (In:Ga=7:93), for example. To deposit the metal oxide films 108a and 108b by a sputtering method using DC discharge, when an atomic ratio of In:M is x:y, it is preferable that $y/(x+y)$ be less than or equal to 0.96, further preferably less than or equal to 0.95, for example, 0.93.

Note that in each of the oxide semiconductor film 108 and the metal oxide films 108a and 108b, the proportions of atoms in the atomic ratio vary within a range of ±40% as an error.

<Structure Example 3 of Semiconductor Device>

Next, a transistor 152A and a transistor 154A, which are semiconductor devices of embodiments of the present invention, are described with reference to FIGS. 25A to 25C and FIGS. 26A to 26C.

First, the transistor 152A, which is a semiconductor device of one embodiment of the present invention, is described with reference to FIGS. 25A to 25C.

Figure 25A:
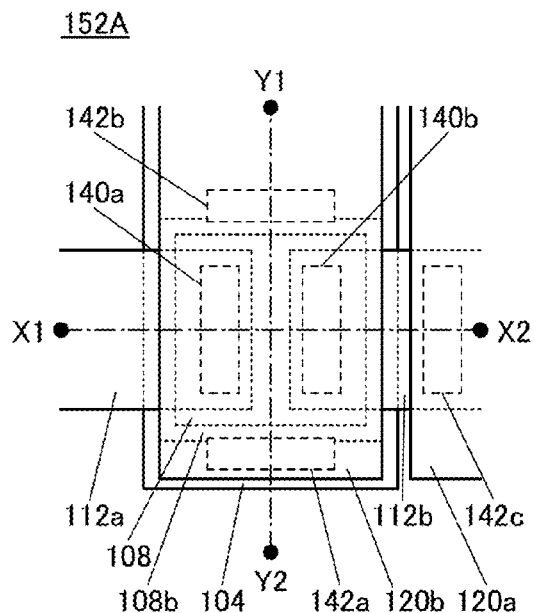
FIGS. 25A to 25C are a top view and cross-sectional views of a semiconductor device.

FIG. 25A is a top view of the transistor 152A, which is a semiconductor device of one embodiment of the present invention. FIG. 25B is a cross-sectional view taken along dashed dotted line X1-X2 in FIG. 25A. FIG. 25C is a cross-sectional view taken along dashed dotted line Y1-Y2 in FIG. 25A.

The transistor 152A includes the conductive film 104 functioning as a first gate electrode over the substrate 102; the insulating film 106 functioning as a gate insulating film over the substrate 102 and the conductive film 104; the oxide semiconductor film 108 provided over the insulating film 106 to overlap with the conductive film 104; metal oxide films 108a and 108b over the oxide semiconductor film 108; the first insulating film 110 over the metal oxide film 108b; the pair of electrodes 112a and 112b that are over the first insulating film 110 and electrically connected to the oxide semiconductor film 108; the insulating films 114, 116, and 118 over the first insulating film 110 and the pair of electrodes 112a and 112b; and the conductive films 120a and 120b over the insulating film 118.

Figure 25B:
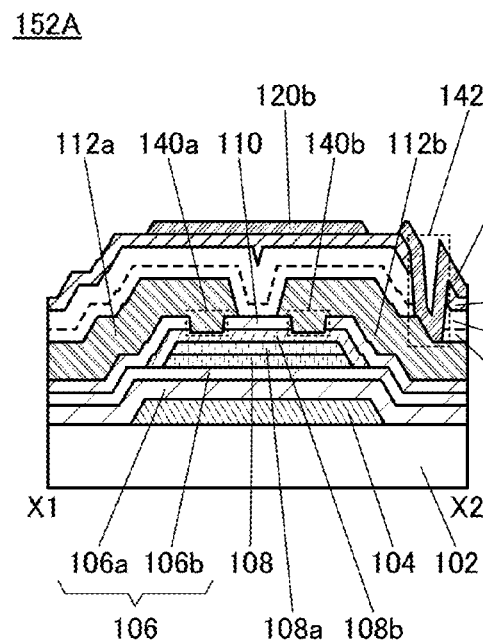
Figure 25C:
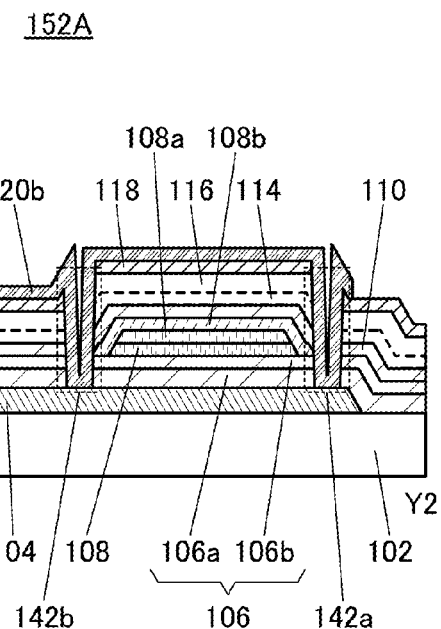

The transistor 152A in FIGS. 25A to 25C is a modification example of the transistor 152 in FIGS. 3A to 3C, and is different from the transistor 152 in FIGS. 3A to 3C in that the metal oxide film 108b covers side surfaces of the oxide semiconductor film 108 and the metal oxide film 108a. The other structures are the same as those of the transistor 152 and the effect similar to that in the case of the transistor 152 can be obtained. In the transistor 152A, the metal oxide film 108b covers the side surfaces of the oxide semiconductor film 108 and the metal oxide film 108a, whereby impurities that enter the oxide semiconductor film 108 and the metal oxide film 108a (here, impurities included in the pair of electrodes 112a and 112b) can be further reduced.

Next, a transistor 154A, which is a semiconductor device of one embodiment of the present invention, is described with reference to FIGS. 26A to 26C.

Figure 26A:
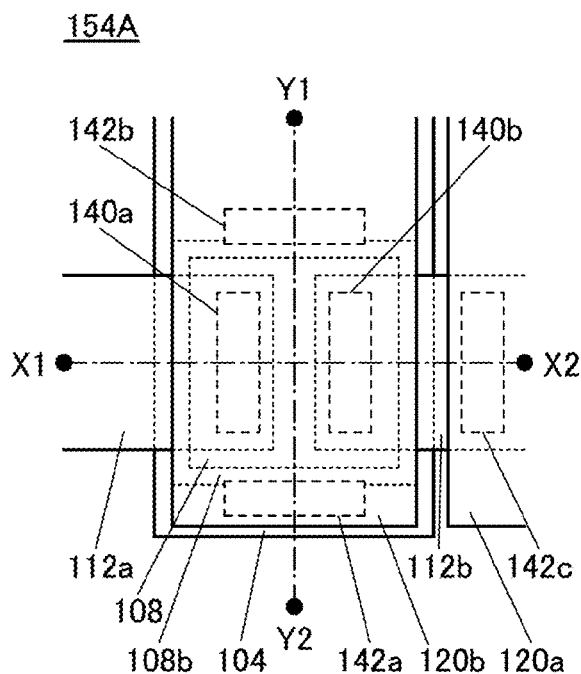
FIGS. 26A to 26C are a top view and cross-sectional views of a semiconductor device.

FIG. 26A is a top view of the transistor 154A, which is a semiconductor device of one embodiment of the present invention. FIG. 26B is a cross-sectional view taken along dashed dotted line X1-X2 in FIG. 26A. FIG. 26C is a cross-sectional view taken along dashed dotted line Y1-Y2 in FIG. 26A.

The transistor 154A includes the conductive film 104 functioning as a first gate electrode over the substrate 102; the insulating film 106 functioning as a gate insulating film over the substrate 102 and the conductive film 104; the oxide semiconductor film 108 provided over the insulating film 106 to overlap with the conductive film 104; the metal oxide film 108b over the oxide semiconductor film 108; the first insulating film 110 over the metal oxide film 108b; the pair of electrodes 112a and 112b that are over the first insulating film 110 and electrically connected to the oxide semiconductor film 108; the insulating films 114, 116, and 118 over the first insulating film 110 and the pair of electrodes 112a and 112b; and the conductive films 120a and 120b over the insulating film 118.

Figure 26B:
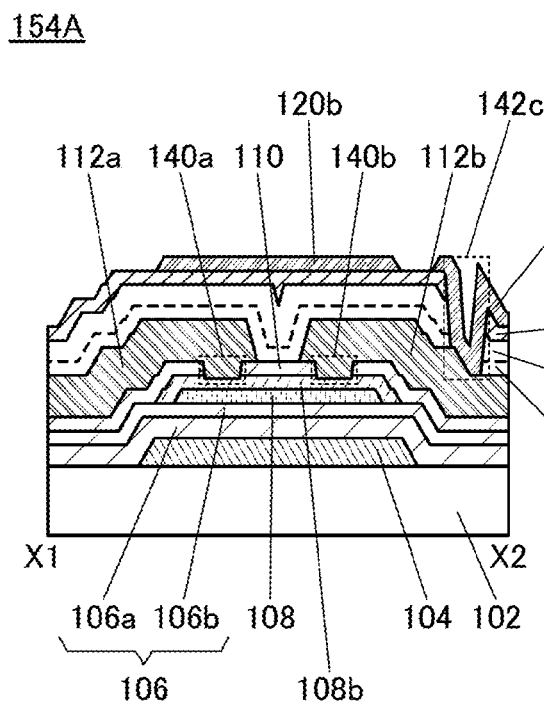
Figure 26C:
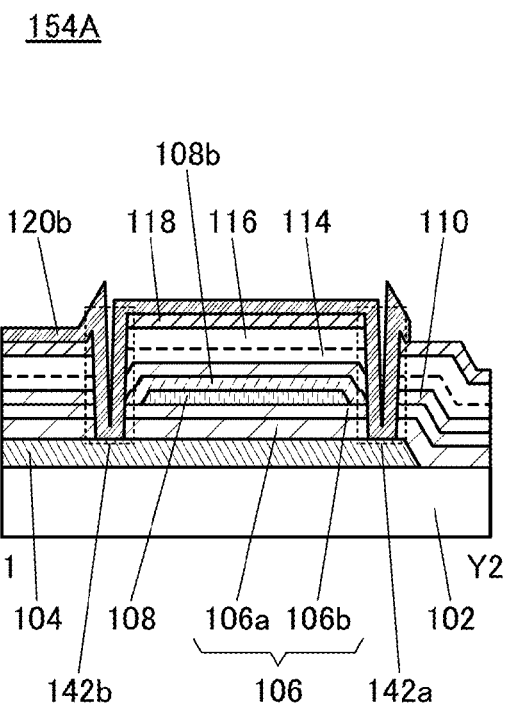

The transistor 154A in FIGS. 26A to 26C is a modification example of the transistor 154 in FIGS. 4A to 4C, and is different from the transistor 154 in FIGS. 4A to 4C in that the metal oxide film 108b covers a side surface of the oxide semiconductor film 108. The other structures are the same as those of the transistor 154 and the effect similar to that in the case of the transistor 154 can be obtained. In the transistor 154A, the metal oxide film 108b covers the side surface of the oxide semiconductor film 108, whereby impurities that enter the oxide semiconductor film 108 (here, impurities included in the pair of electrodes 112a and 112b) can be further reduced.

<Method 1 for Manufacturing Semiconductor Device>

Next, a method for manufacturing the transistor 150, which is a semiconductor device of one embodiment of the present invention, is described below in detail using FIGS. 6A to 6C, FIGS. 7A to 7C, and FIGS. 8A to 8C.

First, a conductive film is formed over the substrate 102 and processed through a photolithography process and an etching process, whereby the conductive film 104 functioning as a first gate electrode is formed. Then, the insulating film 106 functioning as a gate insulating film is formed over the conductive film 104 functioning as a first gate electrode. The insulating film 106 includes the insulating films 106a and 106b (see FIG. 6A).

The conductive film 104 functioning as a first gate electrode can be formed by a sputtering method, a chemical vapor deposition (CVD) method, a vacuum evaporation method, or a pulsed laser deposition (PLD) method. Alternatively, a coating method or a printing method can be used. Although typical deposition methods are a sputtering method and a plasma chemical vapor deposition (PE-CVD) method, a thermal CVD method such as an MOCVD method, or an ALD method described above may be used.

In this embodiment, a glass substrate is used as the substrate 102, and as the conductive film 104 functioning as a first gate electrode, a 100-nm-thick tungsten film is formed by a sputtering method. Note that instead of the 100-nm-thick tungsten film, a 200-nm-thick Cu-Mu alloy film may be used as the conductive film 104. The Cu—Mn alloy film can be formed by a sputtering method using a Cu—Mn metal target (Cu:Mn=90:10 [at. %]).

The insulating film 106 functioning as a gate insulating film can be formed by a sputtering method, a PE-CVD method, a thermal CVD method, a vacuum evaporation method, a PLD method, or the like. In this embodiment, a 400-nm-thick silicon nitride film as the insulating film 106a functioning as a gate insulating film and a 50-nm-thick silicon oxynitride film as the insulating film 106b are formed by a PE-CVD method.

Note that the insulating film 106a included in the insulating film 106 functioning as a gate insulating film can have a stacked-layer structure of silicon nitride films. Specifically, the insulating film 106a can have a three-layer structure of a first silicon nitride film, a second silicon nitride film, and a third silicon nitride film. An example of the three-layer structure is as follows.

For example, the first silicon nitride film can be formed to have a thickness of 50 nm under the condition where silane, nitrogen, and an ammonia gas are supplied at flow rates of 200 sccm, 2000 sccm, and 100 sccm, respectively, as a source gas to a reaction chamber of a PE-CVD apparatus; the pressure in the reaction chamber is controlled to 100 Pa, and a power of 2000 W is supplied using a 27.12 MHz high-frequency power source.

The second silicon nitride film can be formed to have a thickness of 300 nm under the condition where silane, nitrogen, and an ammonia gas are supplied at flow rates of 200 sccm, 2000 sccm, and 2000 sccm, respectively, as a source gas to the reaction chamber of the PE-CVD apparatus; the pressure in the reaction chamber is controlled to 100 Pa, and a power of 2000 W is supplied using a 27.12 MHz high-frequency power source.

The third silicon nitride film can be formed to have a thickness of 50 nm under the condition where silane and nitrogen are supplied at flow rates of 200 sccm and 5000 sccm, respectively, as a source gas to the reaction chamber of the PE-CVD apparatus; the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can be each formed at a substrate temperature of 350° C.

When the insulating film 106a has the three-layer structure of silicon nitride films, for example, in the case where a conductive film containing copper (Cu) is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

Figure 6A:
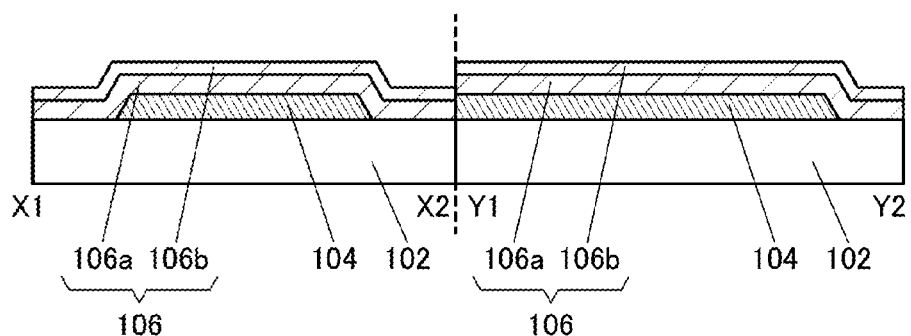
FIGS. 6A to 6C are cross-sectional views illustrating a method for manufacturing a semiconductor device.
Figure 6B:
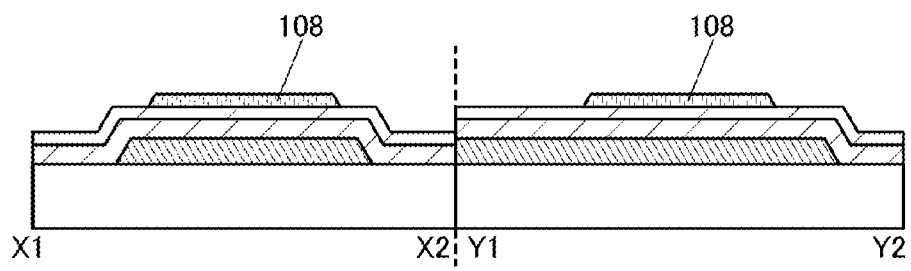

Next, the oxide semiconductor film 108 is formed over the insulating film 106 functioning as a gate insulating film (see FIG. 6B).

In this embodiment, an oxide semiconductor film is formed by a sputtering method using an In—Ga—Zn metal oxide target (In:Ga:Zn=1:1:1) and the oxide semiconductor film is processed into a desired region, so that the oxide semiconductor film 108 is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor film and can reduce hydrogen, water, and the like contained in the oxide semiconductor film 108. Note that the heat treatment for the purpose of reducing hydrogen, water, and the like may be performed before the oxide semiconductor film 108 is processed into an island shape. As the method for processing the oxide semiconductor film 108 into an island shape, a wet etching method or a dry etching method may be used.

An electric furnace, an RTA apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor film 108 may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. Furthermore, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

In the case where the oxide semiconductor film 108 is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of approximately $5 \times 10^{-7}$ Pa to $1 \times 10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas containing carbon or hydrogen from an exhaust system to the inside of the chamber.

Figure 6C:
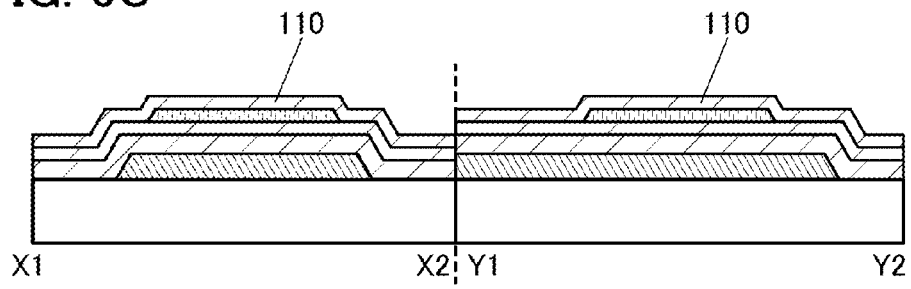

Next, a first insulating film 110 is deposited over the insulating film 106 and the oxide semiconductor film 108 (see FIG. 6C).

The first insulating film 110 can be formed using a material selected from the above-described materials that can be used for the first insulating film 110. In this embodiment, as the first insulating film 110, a 10-nm-thick silicon oxynitride film is used. Note that the silicon oxynitride film is formed by a PE-CVD method.

Figure 7A:
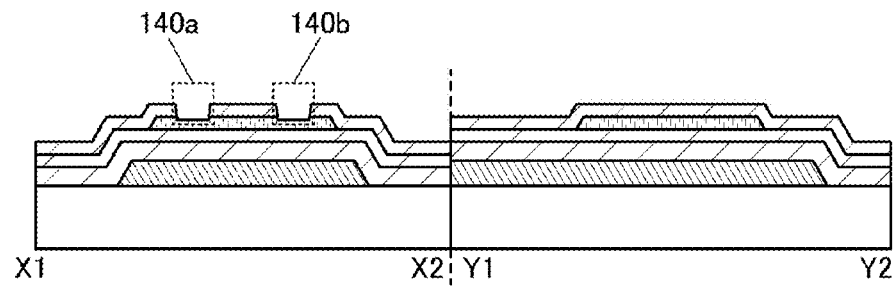
FIGS. 7A to 7C are cross-sectional views illustrating a method for manufacturing a semiconductor device.

Next, the openings 140a and 140b are formed by processing desired regions of the first insulating film 110 (see FIG. 7A).

The openings 140a and 140b can be formed by, for example, a dry etching method, a wet etching method, or a combination of the dry etching method and the wet etching method. Note that at the time of forming the openings 140a and 140b, part of the oxide semiconductor film 108 might be etched, so that the oxide semiconductor film 108 might have a recessed portion.

Figure 7B:
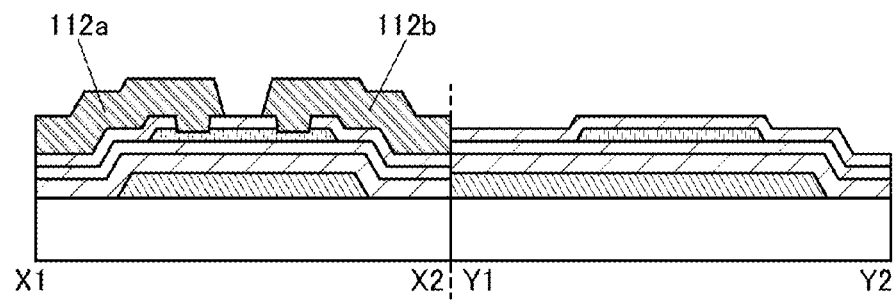

Then, a conductive film is formed over the oxide semiconductor film 108 and the first insulating film 110 so as to cover the openings 140a and 140b, and the conductive film is processed into a desired region, so that the pair of electrodes 112a and 112b are formed (see FIG. 7B).

The pair of electrodes 112a and 112b can be formed using a material selected from the above-described materials that can be used for the pair of electrodes 112a and 112b. In this embodiment, a stacked-layer film including a 30-nm-thick Cu—Mn alloy film and a 200-nm-thick Cu film is used for the pair of electrodes 112a and 112b. The Cu—Mn alloy film is formed by a sputtering method using a Cu—Mn metal target (Cu:Mn=90:10 [at. %]). The copper (Cu) film is formed by a sputtering method.

As a method for processing the pair of electrodes 112a and 112b, for example, a dry etching method, a wet etching method, a combination of a dry etching method and a wet etching method, and the like are given. In particular, a wet etching method is preferably used as the processing method for the pair of electrodes 112a and 112b because the manufacturing cost can be saved.

Figure 7C:
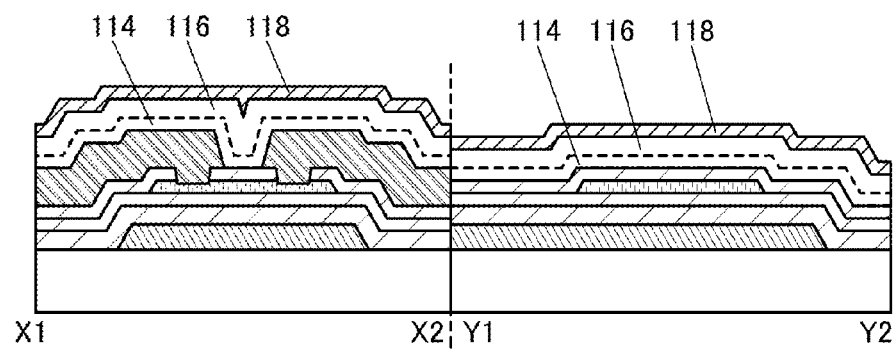

Next, the insulating films 114, 116, and 118 functioning as a gate insulating film and a protective insulating film are formed to cover the first insulating film 110 and the pair of electrodes 112a and 112b (see FIG. 7C).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced and oxygen in the insulating film 116 can be moved to the oxide semiconductor film 108; accordingly, the amount of oxygen vacancy in the oxide semiconductor film 108 can be reduced.

For example, as the insulating film 114, a silicon oxynitride film can be formed by a PE-CVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PE-CVD method under the condition where the ratio of the oxidizing gas to the deposition gas is higher than 20 times and lower than 100 times, preferably higher than or equal to 40 times and lower than or equal to 80 times and the pressure in a reaction chamber is lower than 100 Pa, preferably lower than or equal to 50 Pa.

In this embodiment, a silicon oxynitride film is formed as the insulating film 114 by a PE-CVD method under the condition where the substrate 102 is held at a temperature of 220° C., silane at a flow rate of 50 sccm and dinitrogen monoxide at a flow rate of 2000 sccm are used as a source gas, the pressure in the reaction chamber is 20 Pa, and a high-frequency power of 100 W at 27.12 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in a reaction chamber of the PE-CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the reaction chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the reaction chamber.

As the deposition conditions of the insulating film 116, the high-frequency power having the above power density is supplied to the reaction chamber having the above pressure, whereby the decomposition efficiency of the source gas in plasma is increased, oxygen radicals are increased, and oxidation of the source gas is promoted; therefore, the oxygen content of the insulating film 116 becomes higher than that in the stoichiometric composition. On the other hand, in the film formed at a substrate temperature within the above temperature range, a bond between silicon and oxygen is weak, and accordingly, part of oxygen in the film is released by heat treatment in a later step. Thus, it is possible to form an oxide insulating film which contains oxygen at a higher proportion than oxygen in the stoichiometric composition and from which part of oxygen is released by heating.

Note that the first insulating film 110 and the insulating film 114 function as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating layer in which the amount of defects is small, i.e., the spin density corresponding to a signal which appears at g=2.001 due to a dangling bond of silicon is lower than $6\times10^{17}$ spins/cm$^3$, preferably lower than or equal to $3\times10^{17}$ spins/cm$^3$, further preferably lower than or equal to $1.5\times10^{17}$ spins/cm$^3$ by ESR measurement. As a result, the reliability of the transistor can be improved.

After the insulating films 114 and 116 are formed, heat treatment is performed. By the heat treatment, part of oxygen contained in the insulating films 114 and 116 can be moved to the oxide semiconductor film 108, so that the amount of oxygen vacancy contained in the oxide semiconductor film 108 can be further reduced. After the heat treatment, the insulating film 118 is formed.

The temperature of the heat treatment performed on the insulating films 114 and 116 is typically higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). Note that an electric furnace, an RTA apparatus, or the like can be used for the heat treatment, in which it is preferable that hydrogen, water, and the like not be contained in the nitrogen, oxygen, ultra-dry air, or rare gas.

In this embodiment, the heat treatment is performed at 350° C. for one hour in a mixed atmosphere of nitrogen and oxygen.

In the case where water, hydrogen, or the like is contained in the insulating films 114 and 116, when the insulating film 118 having a function of blocking water, hydrogen, and the like is formed and then heat treatment is performed, water, hydrogen, or the like contained in the insulating films 114 and 116 might be moved to the oxide semiconductor film 108, so that defects might be generated in the oxide semiconductor film 108. Thus, when heat treatment is performed before formation of the insulating film 118, water or hydrogen contained in the insulating films 114 and 116 can be effectively reduced.

Note that when the insulating film 116 is formed over the insulating film 114 while being heated, oxygen can be moved to the oxide semiconductor film 108 and oxygen vacancies in the oxide semiconductor film 108 can be reduced. For this reason, the heat treatment is not necessarily performed.

In the case where the insulating film 118 is formed by a PE-CVD method, the substrate temperature is preferably set to higher than or equal to 300° C. and lower than or equal to 400° C., more preferably higher than or equal to 320° C. and lower than or equal to 370° C., so that a dense film can be formed.

For example, in the case where a silicon nitride film is formed by a PE-CVD method as the insulating film 118, a deposition gas containing silicon, nitrogen, and ammonia are preferably used as a source gas. A small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, with the use of a PE-CVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the reaction chamber is 100 Pa, the substrate temperature is 350° C., and a high-frequency power of 1000 W is supplied to parallel-plate electrodes with a 27.12 MHz high-frequency power source. Note that the PE-CVD apparatus is a parallel-plate PE-CVD apparatus in which the electrode area is 6000 cm$^2$, and the power per unit area (power density) into which the supplied power is converted is $1.7\times10^{-1}$ W/cm$^2$.

Heat treatment may be performed after the formation of the insulating film 118. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C. When the heat treatment is performed, the amount of hydrogen and water in the insulating films 114 and 116 is reduced and accordingly the generation of defects in the oxide semiconductor film 108 described above is inhibited.

Next, the openings 142a and 142b are formed in the insulating films 106a, 106b, 114, 116, and 118 and the first insulating film 110. In addition, the opening 142c is formed in the insulating films 114, 116, and 118 (see FIG. 8A).

The openings 142a and 142b reach the conductive film 104. The opening 142c reaches the electrode 112b. The openings 142a, 142b, and 142c can be formed in the same process. For example, a pattern may be formed in a desired region using a half-tone mask (or a gray-tone mask, a phase-shift mask, or the like), and the openings 142a, 142b, and 142c can be formed with a dry-etching apparatus. Note that a half-tone mask or a gray-tone mask may be used as needed, and they are not necessarily used. The openings 142a and 142b and the opening 142c may be formed in different formation processes. In such a case, the openings 142a and 142b might have two steps.

Figure 8A:
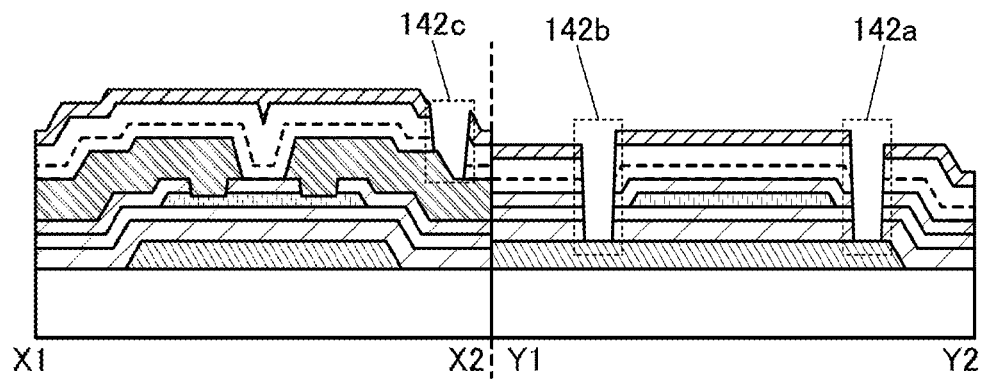
FIGS. 8A to 8C are cross-sectional views illustrating a method for manufacturing a semiconductor device.
Figure 8B:
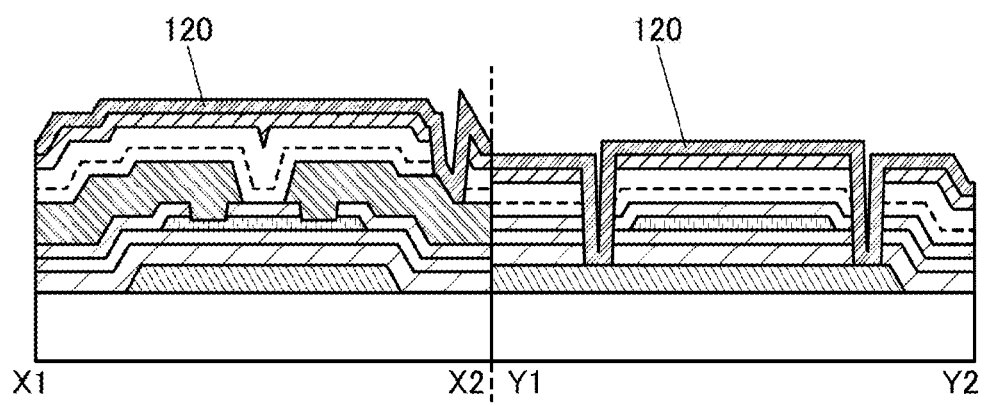

Next, a conductive film 120 is formed over the insulating film 118 to cover the openings 142a, 142b, and 142c (see FIG. 8B).

For the conductive film 120, for example, a material including one of indium (In), zinc (Zn), and tin (Sn) can be used. In particular, for the conductive film 120, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used. The conductive film 120 can be formed by a sputtering method, for example.

Figure 8C:
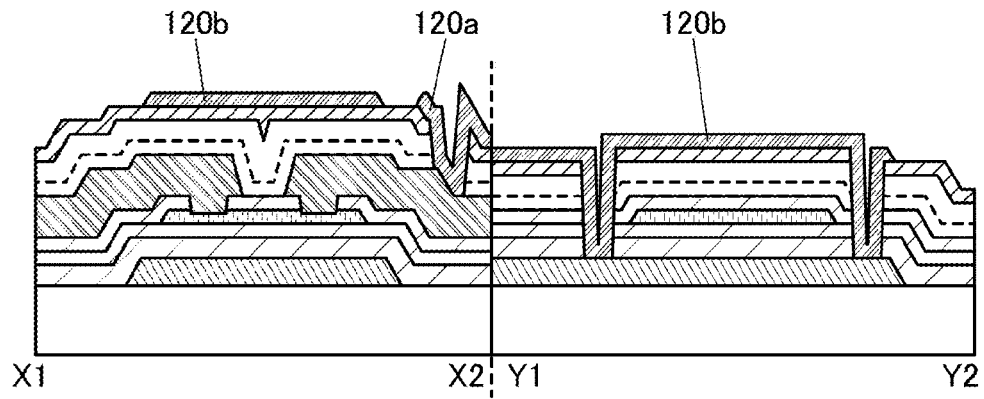

Then, the conductive film 120 is processed into a desired shape, whereby the conductive films 120a and 120b are formed (see FIG. 8C).

To form the conductive films 120a and 120b, for example, a dry etching method, a wet etching method, or a combination of dry etching and wet etching is used.

Through the above process, the transistor 150, which is the semiconductor device illustrated in FIGS. 1A to 1C, can be formed.

<Method 2 for Manufacturing Semiconductor Device>

Next, methods for manufacturing the transistors 152 and 154, which are semiconductor devices of embodiments of the present invention, are described below in detail.

The metal oxide films 108a and 108b included in the transistor 152 in FIGS. 3A to 3C are formed in the following manner: at the time of the formation of the oxide semiconductor film 108 shown in FIG. 6B, the oxide semiconductor film 108 and metal oxide films are successively formed, whereby the stacked-layer oxide films are formed, and then, the stacked-layer oxide films are collectively processed into an island shape.

In this embodiment, the metal oxide film 108a is formed by a sputtering method using an In—Ga—Zn metal oxide target (In:Ga:Zn=1:3:6). Furthermore, the metal oxide film 108b is formed by a sputtering method using an In—Ga—Zn metal oxide target (In:Ga:Zn=1:4:5).

In the case where the oxide semiconductor film 108 and the metal oxide films 108a and 108b are formed by a sputtering method, a power supply device for generating plasma can be an RF power supply device, an AC power supply device, a DC power supply device, or the like as appropriate. Note that it is preferable to use DC discharge applicable to a large-sized substrate in deposition because the productivity of the semiconductor device can be increased.

The metal oxide film 108b included in the transistor 154 in FIGS. 4A to 4C are formed in the following manner: at the time of the formation of the oxide semiconductor film 108 shown in FIG. 6B, the oxide semiconductor film 108 and a metal oxide film are successively formed, whereby the stacked-layer oxide films are formed, and then, the stacked-layer oxide films are collectively processed into an island shape.

In this embodiment, the metal oxide film 108b is formed by a sputtering method using an In—Ga—Zn metal oxide target (In:Ga:Zn=1:3:6).

The structure and method described in this embodiment can be implemented by being combined as appropriate with any of the other structures and methods described in the other embodiments.

(Embodiment 2)

In this embodiment, the structure of an oxide semiconductor film included in a semiconductor device of one embodiment of the present invention is described below in detail.

<Structure of Oxide Semiconductor>

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 19A:
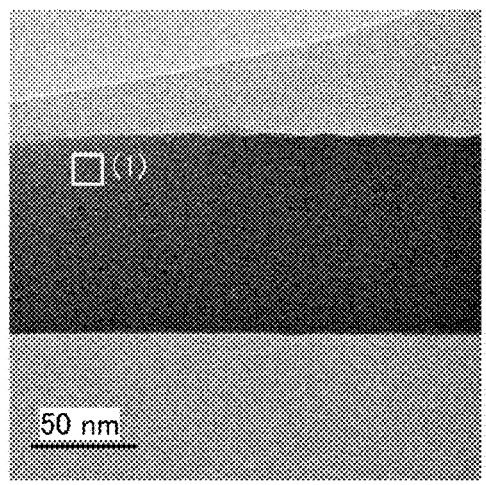
FIGS. 19A to 19D are Cs-corrected high-resolution TEM images of a cross section of a CAAC-OS and a cross-sectional schematic view of a CAAC-OS.

A CAAC-OS observed with a TEM is described below. FIG. 19A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 19B:
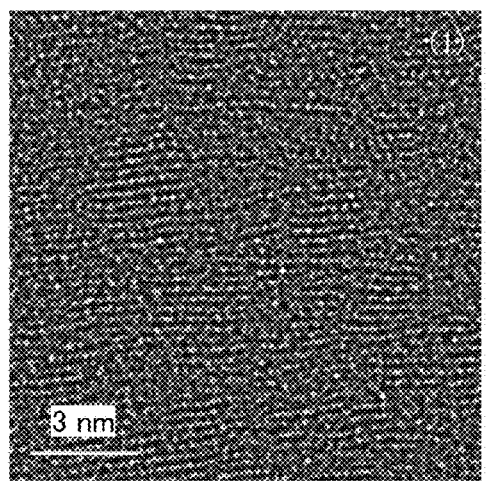

FIG. 19B is an enlarged Cs-corrected high-resolution TEM image of a region (1) in FIG. 19A. FIG. 19B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 19C:
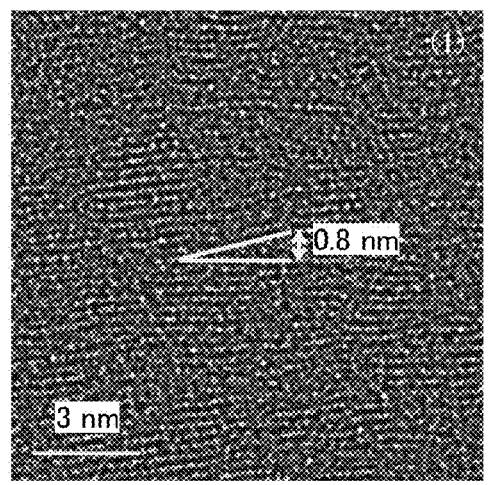

As shown in FIG. 19B, the CAAC-OS has a characteristic atomic arrangement. The characteristic atomic arrangement is denoted by an auxiliary line in FIG. 19C. FIGS. 19B and 19C prove that the size of a pellet is approximately 1 nm to 3 nm, and the size of a space caused by tilt of the pellets is approximately 0.8 nm. Therefore, the pellet can also be referred to as a nanocrystal (nc).

Figure 19D:
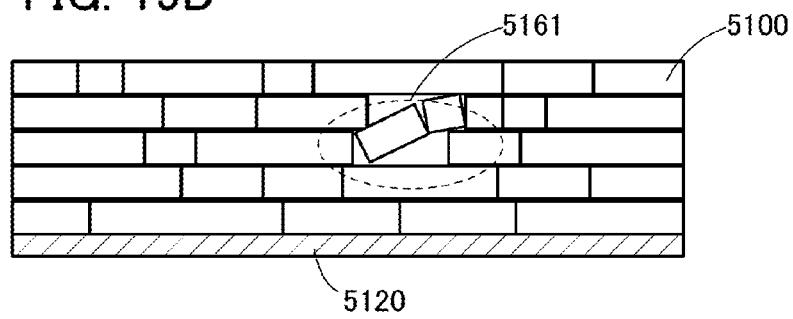

Here, according to the Cs-corrected high-resolution TEM images, the schematic arrangement of pellets 5100 of a CAAC-OS over a substrate 5120 is illustrated by such a structure in which bricks or blocks are stacked (see FIG. 19D). The part in which the pellets are tilted as observed in FIG. 19C corresponds to a region 5161 shown in FIG. 19D.

FIG. 20A shows a Cs-corrected high-resolution TEM image of a plane of the CAAC-OS observed from a direction substantially perpendicular to the sample surface. FIGS. 20B, 20C, and 20D are enlarged Cs-corrected high-resolution TEM images of regions (1), (2), and (3) in FIG. 20A, respectively. FIGS. 20B, 20C, and 20D indicate that metal atoms are arranged in a triangular, quadrangular, or hexagonal configuration in a pellet. However, there is no regularity of arrangement of metal atoms between different pellets.

Figure 21A:
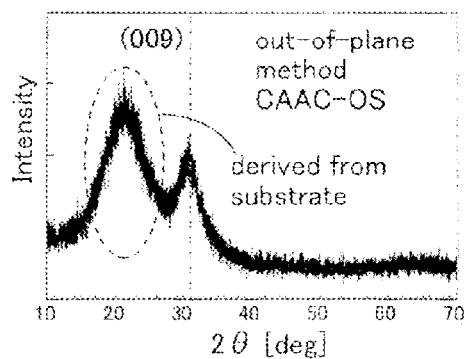
FIGS. 21A to 21C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 21A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 21B:
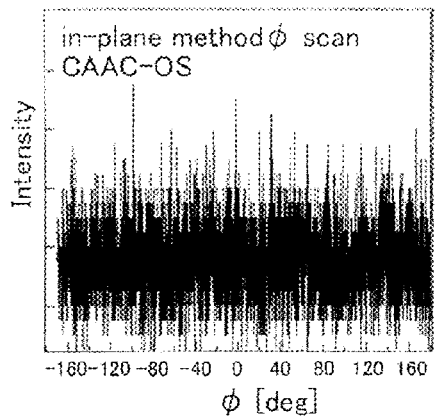
Figure 21C:
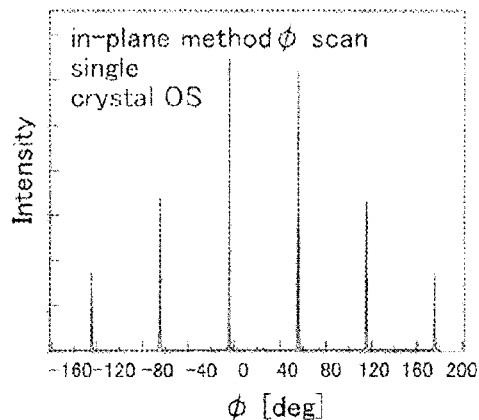

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 21B, a peak is not clearly observed. In contrast, in the case of a single crystal oxide semiconductor of InGaZnO$_4$, when φ scan is performed with 2θ fixed at around 56°, as shown in FIG. 21C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 27A might be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 27B shows a diffraction pattern obtained in such a manner that an electron beam with a probe diameter of 300 nm is incident on the same sample in a direction perpendicular to the sample surface. As in FIG. 27B, a ring-like diffraction pattern is observed. Thus, the electron diffraction also indicates that the a-axes and b-axes of the pellets included in the CAAC-OS do not have regular alignment. The first ring in FIG. 27B is considered to be derived from the (010) plane, the (100) plane, and the like of the InGaZnO$_4$ crystal. The second ring in FIG. 27B is considered to be derived from the (110) plane and the like.

Moreover, the CAAC-OS is an oxide semiconductor having a low density of defect states. Defects in the oxide semiconductor are, for example, a defect due to impurity and oxygen vacancy. Therefore, the CAAC-OS can be regarded as an oxide semiconductor with a low impurity concentration, or an oxide semiconductor having a small amount of oxygen vacancy.

The impurity contained in the oxide semiconductor might serve as a carrier trap or serve as a carrier generation source. Furthermore, oxygen vacancy in the oxide semiconductor serves as a carrier trap or serves as a carrier generation source when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small amount of oxygen vacancy) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered.

Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is such an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 28:
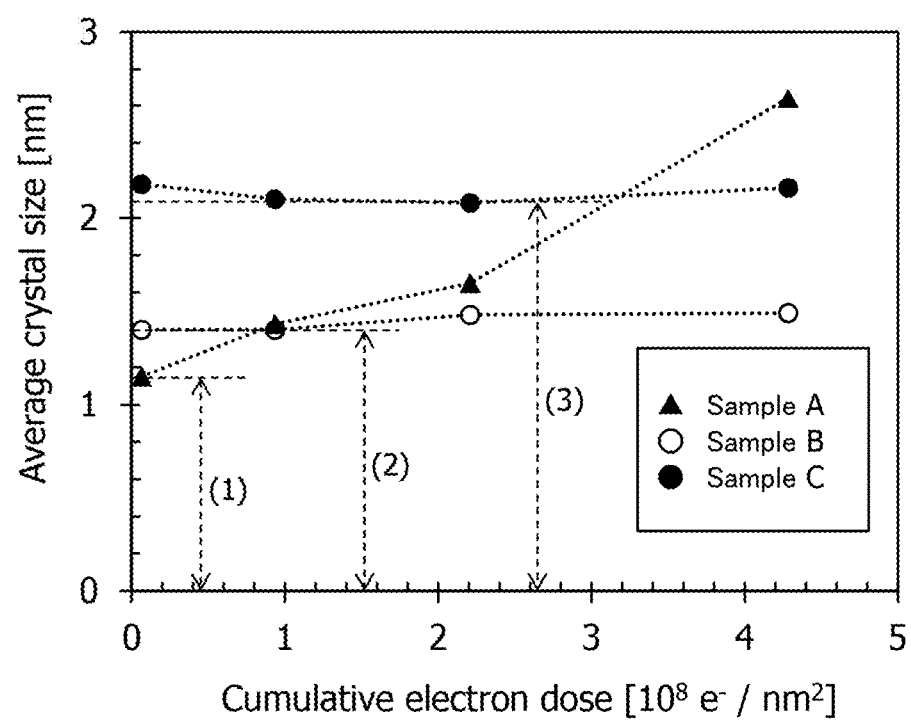
FIG. 28 shows a change in crystal part of an In—Ga—Zn oxide induced by electron irradiation.

FIG. 28 shows change in the average size of crystal parts (at 22 points to 45 points) in each sample. Note that the crystal part size corresponds to the length of a lattice fringe. FIG. 28 indicates that the crystal part size in the a-like OS increases with an increase in the cumulative electron dose. Specifically, as shown by (1) in FIG. 28, a crystal part of approximately 1.2 nm at the start of TEM observation (the crystal part is also referred to as an initial nucleus) grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 28, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 29A:
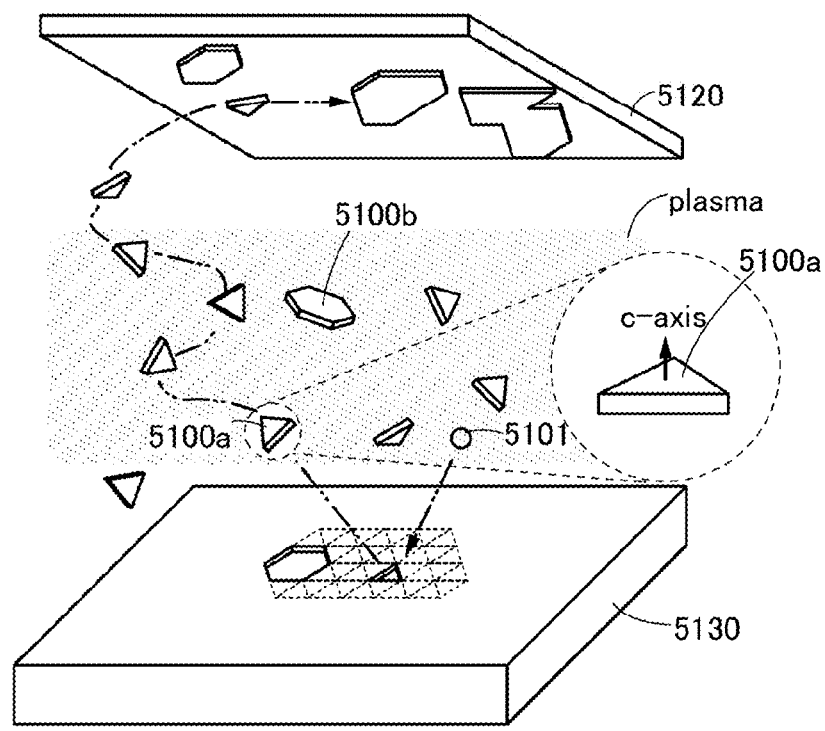
FIGS. 29A and 29B are schematic views showing deposition models of a CAAC-OS and an nc-OS.

FIG. 29A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generate a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

Figure 30A:
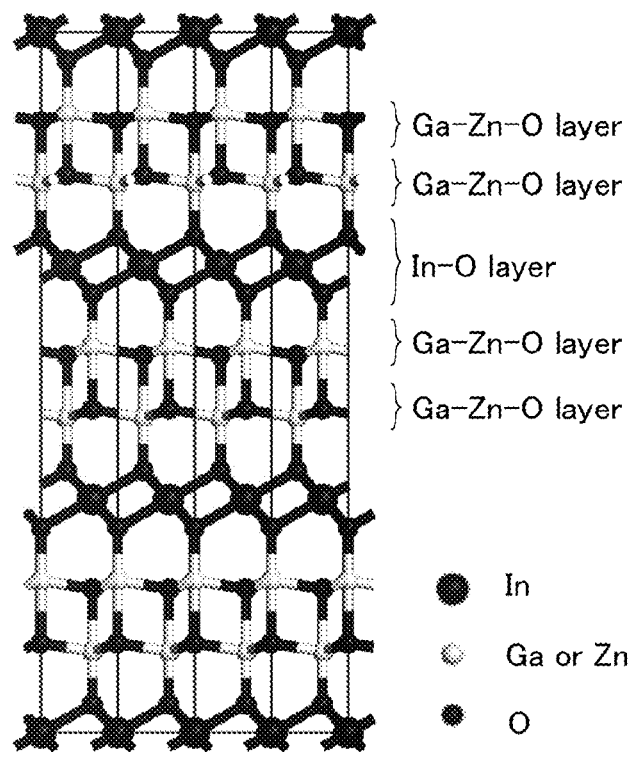
FIGS. 30A to 30C show an $InGaZnO_4$ crystal and a pellet.

Here, the target 5130 has a polycrystalline structure which includes a plurality of crystal grains and in which a cleavage plane exists in at least one crystal grain. FIG. 30A shows a structure of an InGaZnO$_4$ crystal included in the target 5130 as an example. Note that FIG. 30A shows a structure of the case where the InGaZnO$_4$ crystal is observed from a direction parallel to the b-axis. FIG. 30A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 30B:
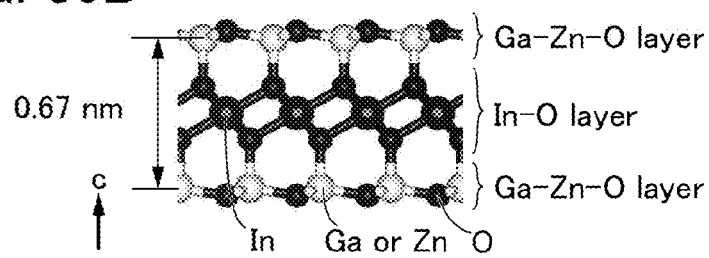
Figure 30C:
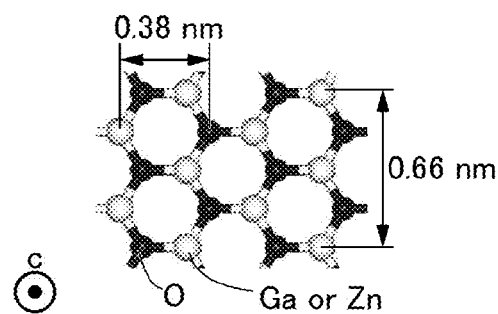

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 28. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 30B is separated. Note that FIG. 30C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 28 corresponds to the amount of growth in plasma. Here, in the case where the temperature of the substrate 5120 is at around room temperature, the pellet 5100 on the substrate 5120 hardly grows; thus, an nc-OS is formed (see FIG. 29B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 29B:
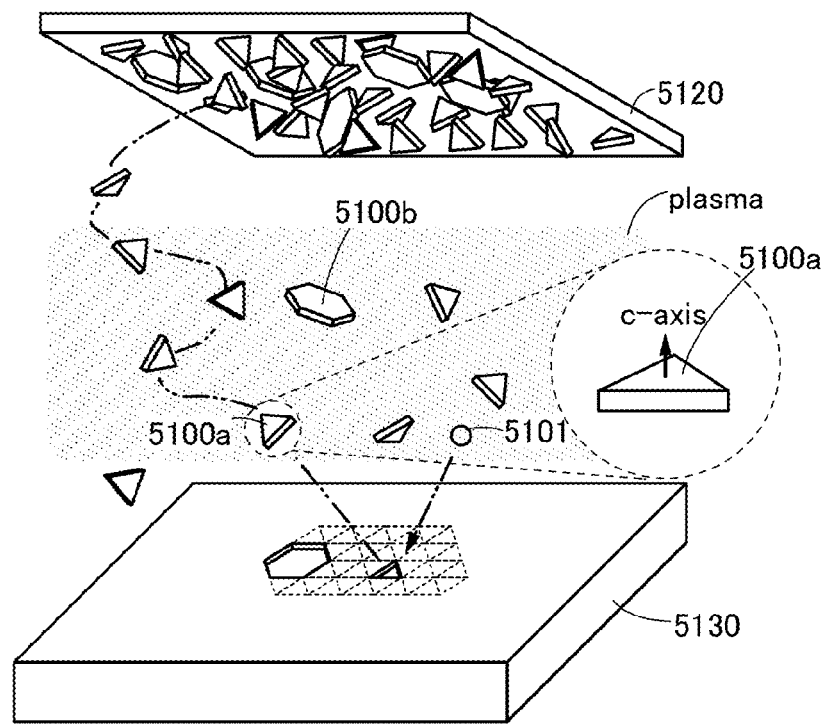

As shown in FIGS. 29A and 29B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 29A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 31A to 31D are cross-sectional schematic views.

Figure 31A:
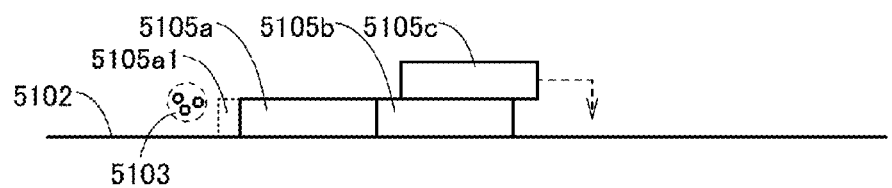
FIGS. 31A to 31D are schematic views showing a deposition model of a CAAC-OS.

As illustrated in FIG. 31A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 31B:
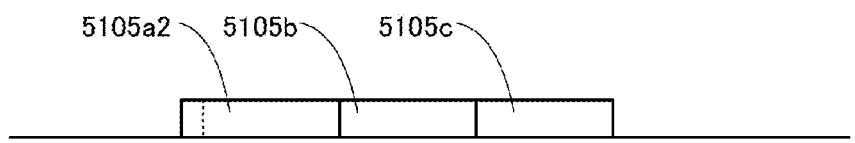

Then, as illustrated in FIG. 31B, the region 5105a1 grows to part of the pellet 5105a to form a pellet 5105a2. In addition, a side surface of the pellet 5105c is in contact with another side surface of the pellet 5105b.

Figure 31C:
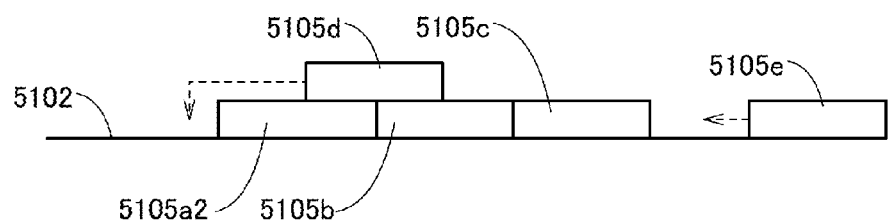

Next, as illustrated in FIG. 31C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 31D:
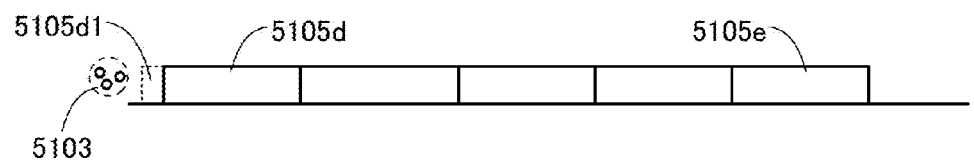

Then, as illustrated in FIG. 31D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 28 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the film formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles has a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a film formation surface with an amorphous structure.

The semiconductor device of one embodiment of the present invention can be formed using an oxide semiconductor film having any of the above structures.

The structure and method described in this embodiment can be implemented by being combined as appropriate with any of the other structures and methods described in the other embodiments.

(Embodiment 3)

In this embodiment, an example of a display device having a display function using any of the transistors described in Embodiment 1 is described below with reference to FIGS. 9A and 9B, FIG. 10, and FIG. 11.

Figure 9A:
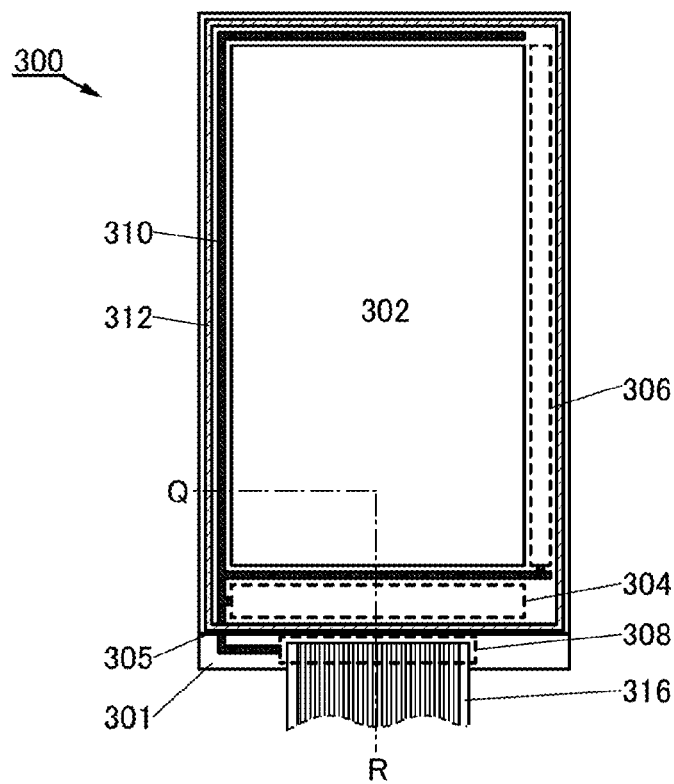
FIGS. 9A and 9B each illustrate a top view of a display device.

FIG. 9A is a top view of an example of a display device. A display device 300 illustrated in FIG. 9A includes a pixel portion 302 provided over a first substrate 301; a source driver circuit portion 304 and a gate driver circuit portion 306 provided over the first substrate 301; a sealant 312 provided to surround the pixel portion 302, the source driver circuit portion 304, and the gate driver circuit portion 306; and a second substrate 305 provided to face the first substrate 301. The first substrate 301 and the second substrate 305 are sealed with the sealant 312. That is, the pixel portion 302, the source driver circuit portion 304, and the gate driver circuit portion 306 are sealed with the first substrate 301, the sealant 312, and the second substrate 305. Although not illustrated in FIG. 9A, a display element is provided between the first substrate 301 and the second substrate 305.

In the display device 300, a flexible printed circuit (FPC) terminal portion 308 electrically connected to the pixel portion 302, the source driver circuit portion 304, and the gate driver circuit portion 306 is provided in a region different from the region which is surrounded by the sealant 312 and positioned over the first substrate 301. Furthermore, an FPC 316 is connected to the FPC terminal portion 308, and a variety of signals and the like are supplied to the pixel portion 302, the source driver circuit portion 304, and the gate driver circuit portion 306 through the FPC 316. Furthermore, a signal line 310 is connected to the pixel portion 302, the source driver circuit portion 304, the gate driver circuit portion 306, and FPC terminal portion 308. Various signals and the like are applied to the pixel portion 302, the source driver circuit portion 304, the gate driver circuit portion 306, and the FPC terminal portion 308 via the signal line 310 from the FPC 316.

Figure 9B:
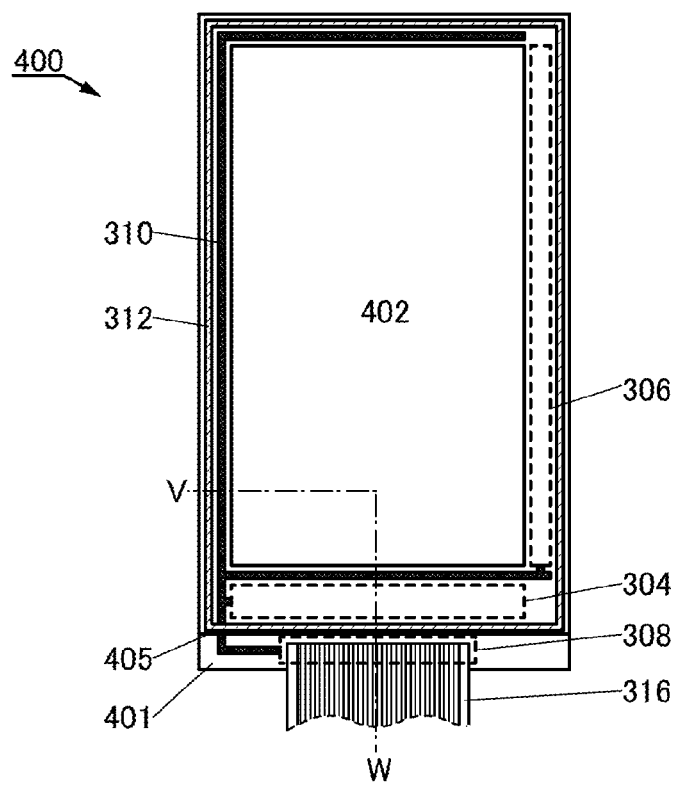

FIG. 9B is a top view of an example of a display device. In a display device 400 illustrated in FIG. 9B, a first substrate 401 is used instead of the first substrate 301 of the display device 300 in FIG. 9A, a second substrate 405 is used instead of the second substrate 305 of the display device 300, and a pixel portion 402 is used instead of the pixel portion 302.

A plurality of gate driver circuit portions 306 may be provided in each of the display devices 300 and 400. An example in which the source driver circuit portion 304 and the gate driver circuit portion 306 are formed over the first substrate 301 or 401 where the pixel portion 302 or 402 is also formed in the display devices 300 and 400 is described; however, one embodiment of the present invention is not limited to the structure. For example, only the gate driver circuit portion 306 may be formed over the first substrate 301 or 401 or only the source driver circuit portion 304 may be formed over the first substrate 301 or 401. In this case, a substrate where a source driver circuit, a gate driver circuit, or the like is formed (e.g., a driver circuit substrate formed using a single crystal semiconductor film or a polycrystalline semiconductor film) may be mounted on the first substrate 301 or 401.

There is no particular limitation on the connection method of a separately formed driver circuit substrate; a chip on glass (COG) method, a wire bonding method, a tape automated bonding (TAB) method, or the like can be used. Note that the display device in this specification means an image display device, a display device, or a light source (including a lighting device or the like). Furthermore, the display device also includes the following modules in its category: a module to which a connector such as an FPC or a tape carrier package (TCP) is attached; a module having a TCP at the tip of which a printed wiring board is provided; and a module in which a driver circuit substrate or an integrated circuit (IC) is directly mounted on a display element by a COG method.

The pixel portions 302 and 402, the source driver circuit portion 304, and the gate driver circuit portion 306 included in the display devices 300 and 400 include a plurality of transistors. As the plurality of transistors, any of the transistors, which are the semiconductor devices of embodiments of the present invention, can be used.

Note that the display device 300 includes a liquid crystal element as a display element, and the display device 400 includes a light-emitting element as a display element. The display device 300 and the display device 400 are described in detail with reference to FIG. 10 and FIG. 11. Note that common portions between the display device 300 and the display device 400 are described first, and then different portions are described.

Note that a display element, a display device which is a device including a display element, a light-emitting element, and a light-emitting device which is a device including a light-emitting element can employ various modes and can include various elements. Examples of a display element, a display device, a light-emitting element, or a light-emitting device include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a carbon nanotube. Examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

<Common Portions in Display Devices>

Figure 10:
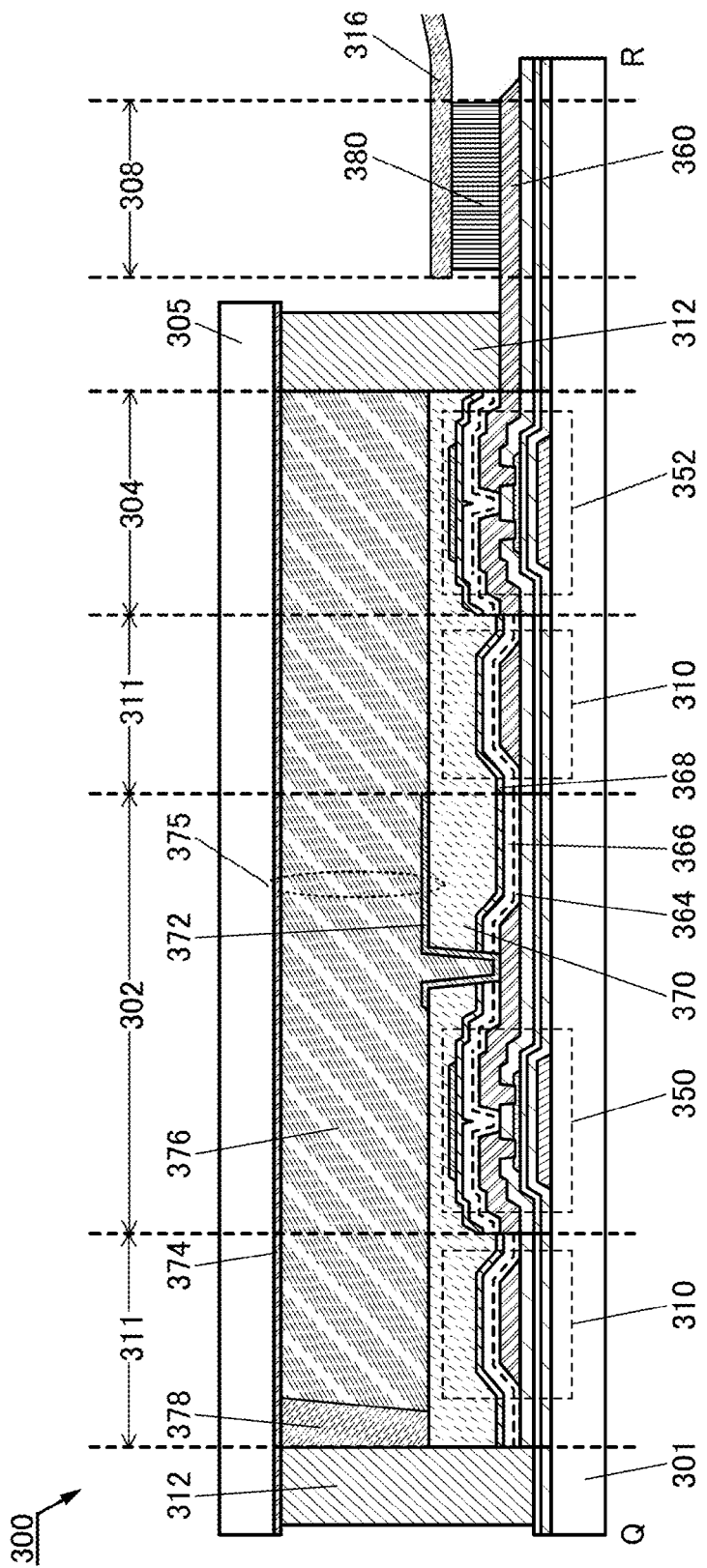
FIG. 10 illustrates a cross section of a display device.

FIG. 10 is a cross-sectional view taken along line dashed dotted line Q-R in FIG. 9A. FIG. 11 is a cross-sectional view taken along dashed dotted line V-W in FIG. 9B.

The display devices 300 and 400 illustrated in FIG. 10 and FIG. 11 include a lead wiring portion 311, the pixel portion 302 or 402, the source driver circuit portion 304, and the FPC terminal portion 308. Note that the lead wiring portion 311 includes a signal line 310.

The signal line 310 included in the lead wiring portion 311 is formed in the same process as a pair of electrodes functioning as a source electrode and a drain electrode of a transistor 350. Note that the signal line 310 may be formed using a conductive film which is formed in the same process as a conductive film functioning as a first gate electrode of the transistor 350.

The FPC terminal portion 308 includes a connection electrode 360, an anisotropic conductive film 380, and the FPC 316. Note that the connection electrode 360 is formed in the same process as the pair of electrodes functioning as the source electrode and the drain electrode of the transistor 350. The connection electrode 360 is electrically connected to a terminal included in the FPC 316 through the anisotropic conductive film 380.

The display devices 300 and 400 illustrated in FIG. 10 and FIG. 11 are examples in which the transistor 350 is provided in the pixel portion 302 or 402, and a transistor 352 is provided in the source driver circuit portion 304. The transistors 350 and 352 have the same structure as the transistor 150 in FIGS. 1A to 1C. Note that the structures of the transistors 350 and 352 are not limited to the structure of the transistor 150, and may be, for example, any of the structures of the transistors 152, 154, 152A, and 154A.

The transistors used in this embodiment each include an oxide semiconductor film which is highly purified and in which formation of oxygen vacancies is suppressed. By using the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the above transistor can have relatively high field-effect mobility and thus can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

When a wiring containing a copper element is used as the signal line connected to the transistor of the pixel portion and the transistor used in the driver circuit portion, a display device in which signal delay or the like due to wiring resistance is reduced can be obtained, which is preferable.

Note that in this embodiment, the transistor 350 included in the pixel portion 302 or 402 and the transistor 352 included in the source driver circuit portion 304 have in the same size; however, this embodiment is not limited to this. The sizes (L/W) or the number of the transistors used in the pixel portion 302 and the source driver circuit portion 304 may vary as appropriate. The gate driver circuit portion 306 is not illustrated in FIG. 10 and FIG. 11; however, the gate driver circuit portion 306 can have a structure similar to that of the source driver circuit portion 304 when a portion to be connected, a connecting method, or the like is changed.

Furthermore, in FIG. 10 and FIG. 11, a planarization insulating film 370 is provided over insulating films 364, 366, and 368 included in the transistor 350 and the transistor 352.

The insulating films 364, 366, and 368 can be formed using materials and methods similar to those of the insulating films 114, 116, and 118 described in the above embodiments, respectively.

The planarization insulating film 370 can be formed using a heat-resistant organic material, such as a polyimide resin, an acrylic resin, a polyimide amide resin, a benzocyclobutene resin, a polyamide resin, or an epoxy resin. Note that the planarization insulating film 370 may be formed by stacking a plurality of insulating films formed using these materials. Alternatively, a structure without the planarization insulating film 370 may be employed.

A conductive film 372 or a conductive film 444 is connected to one of the pair of electrodes included in the transistor 350. The conductive films 372 and 444 are each formed over the planarization insulating film 370 to function as a pixel electrode, i.e., one electrode of the display portion. As the conductive film 372, a conductive film which transmits visible light is preferably used. For example, the conductive film is preferably formed using a material including one of indium (In), zinc (Zn), and tin (Sn). As the conductive film 444, a reflective conductive film is preferably used.

<Structure Example 1 of Display Device Using Liquid Crystal Element as Display Element>

The display device 300 illustrated in FIG. 10 includes a liquid crystal element 375. The liquid crystal element 375 includes the conductive film 372, a conductive film 374, and a liquid crystal layer 376. The conductive film 374 is provided on the second substrate 305 side and functions as a counter electrode. The display device 300 in FIG. 10 is capable of displaying an image in such a manner that transmission or non-transmission is controlled by change in the alignment state of the liquid crystal layer 376 depending on a voltage applied to the conductive film 372 and the conductive film 374.

Although not illustrated in FIG. 10, an alignment film may be provided on a side of the conductive film 372 in contact with the liquid crystal layer 376 and on a side of the conductive film 374 in contact with the liquid crystal layer 376. Although not illustrated in FIG. 10, a color filter (a coloring layer); a black matrix (a light-shielding layer); an optical member (an optical substrate) such as a polarizing member, a retardation member, or an anti-reflection member; and the like may be provided as appropriate. For example, circular polarization may be employed by using a polarizing substrate and a retardation substrate. In addition, a backlight, a sidelight, or the like may be used as a light source.

For example, a glass substrate can be used as the first substrate 301 and the second substrate 305.

A spacer 378 is provided between the first substrate 301 and the second substrate 305. The spacer 378 is a columnar spacer obtained by selective etching of an insulating film and is provided to control the thickness (cell gap) of the liquid crystal layer 376. Note that a spherical spacer may be used as the spacer 378.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has high response speed. In addition, the liquid crystal composition which includes liquid crystal exhibiting a blue phase and a chiral material has a short response time and has optical isotropy; thus, the liquid crystal composition does not need alignment treatment. Moreover, the liquid crystal composition which includes liquid crystal exhibiting a blue phase has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. There are some examples of a vertical alignment mode; for example, a multi-domain vertical alignment (MVA) mode, a patterned vertical alignment (PVA) mode, an ASV mode, or the like can be employed.

As a display method in the pixel portion 302, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Note that, the sizes of display regions may be different between respective dots of color elements. Embodiments of the disclosed invention are not limited to a display device for color display; the disclosed invention can also be applied to a display device for monochrome display.

<Display Device Using Light-Emitting Element as Display Element>

The display device 400 illustrated in FIG. 11 includes a light-emitting element 480. The light-emitting element 480 includes the conductive film 444, an EL layer 446, and a conductive film 448. The display device 400 is capable of displaying an image by light emission from the EL layer 446 included in the light-emitting element 480.

The display device 400 in FIG. 11 includes the first substrate 401, an adhesive layer 418, an insulating film 420, a first element layer 410, a sealing layer 432, a second element layer 411, an insulating film 440, an adhesive layer 412, and the second substrate 405. The first element layer 410 includes the transistors 350 and 352, the insulating films 364, 366, and 368, the connection electrode 360, the light-emitting element 480, an insulating film 430, the signal line 310, and the connection electrode 360. The second element layer 411 includes an insulating film 434, a coloring layer 436, and a light-blocking layer 438. Note that the first element layer 410 and the second element layer 411 face each other with the sealing layer 432 positioned therebetween.

Note that the first substrate 401 and the second substrate 405 each have flexibility. Therefore, the display device 400 including the first substrate 401 and the second substrate 405 has flexibility.

For the first substrate 401 and the second substrate 405, glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polyether etherketone (PEEK) resin can be used, for example. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The insulating film 430 is provided over the planarization insulating film 370 and the conductive film 444. The insulating film 430 covers part of the conductive film 444. Note that the light-emitting element 480 has a top emission structure. Therefore, the conductive film 448 has a light-transmitting property and transmits light emitted from the EL layer 446. Although the top-emission structure is described as an example in this embodiment, one embodiment of the present invention is not limited thereto. A bottom-emission structure in which light is emitted to the conductive film 444 side, or a dual-emission structure in which light is emitted to both the conductive film 444 side and the conductive film 448 side may be employed.

The coloring layer 436 is provided to overlap with the light-emitting element 480, and the light-blocking layer 438 is provided to overlap with the insulating film 430 and to be included in the lead wiring portion 311 and in the source driver circuit portion 304. The coloring layer 436 and the light-blocking layer 438 are covered with the insulating film 434. A space between the light-emitting element 480 and the insulating film 434 is filled with the sealing layer 432. Although the structure of the display device 400 with the coloring layer 436 is described in this embodiment, one embodiment of the present invention is not limited thereto. For example, a structure without the coloring layer 436 may be employed in the case where the EL layer 446 is formed by separate coloring.

The transistors 350 and 352 are provided over the insulating film 420. The insulating film 420 and the first substrate 401 are attached to each other with the adhesive layer 418. The insulating film 440 and the second substrate 405 are attached to each other with the adhesive layer 412. Examples of the insulating film 420 and the insulating film 440 include an organic resin film of an epoxy resin, an aramid resin, an acrylic resin, a polyimide resin, a polyamide resin, a polyamide-imide resin, or the like; an inorganic insulating film with low moisture permeability such as a silicon oxide film, a silicon nitride film, a silicon oxynitride film, a silicon nitride oxide film, or an aluminum oxide film. The method for manufacturing the display device 400 is varied depending on the materials used for the insulating film 420 and the insulating film 440. Specifically, the method for manufacturing the display device 400 when the insulating film 420 and the insulating film 440 are formed using an organic resin film is different from that when the insulating film 420 and the insulating film 440 are formed using an inorganic insulating film. The manufacturing methods are described later.

For each of the adhesive layers 412 and 418, a resin that is curable at room temperature such as a two-component type resin, a light-curable resin, a heat-curable resin, or the like can be used, for example. The examples include an epoxy resin, an acrylic resin, a silicone resin, a phenol resin, and the like. In particular, a material with low moisture permeability, such as an epoxy resin, is preferably used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element 480, thereby improving the reliability of the display device.

In addition, it is preferable to mix a filler with a high refractive index (e.g., titanium oxide) into the resin, in which case the efficiency of light extraction from the light-emitting element 480 can be improved.

The adhesive layers 412 and 418 may each also include a scattering member for scattering light. For example, each of the adhesive layers 412 and 418 can be a mixture of the above resin and particles having a refractive index different from that of the resin. The particles function as the scattering member for scattering light. The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles. Particles of titanium oxide or barium oxide are preferable because they scatter light excellently. When zeolite is used, it can adsorb water contained in the resin and the like, thereby improving the reliability of the light-emitting element.

The display device described in this embodiment can be manufactured in such a manner that the first element layer 410 is formed over a substrate with high heat resistance; the first element layer 410 is separated from the substrate; and the insulating film 420, the transistors 350 and 352, the light-emitting element 480, and the like are transferred over the first substrate 401 using the adhesive layer 418.

In the case where, for example, a material which has high water permeability and low heat resistance (e.g., a resin) is used for the first substrate 401 and the second substrate 405, it is difficult to perform the manufacturing process at high temperature (e.g., 300° C.); therefore, conditions for forming the transistor or the insulating film over the first substrate 401 and the second substrate 405 are limited. In the manufacturing method of this embodiment, a transistor and the like can be formed over a substrate with high heat resistance; thus, a highly reliable transistor and an insulating film with sufficiently low water permeability can be formed. In addition, by transferring transistor or the insulating film to the first substrate 401 or the second substrate 405, a highly reliable display device can be manufactured. Thus, according to one embodiment of the present invention, a thin or/and lightweight light-emitting device with high reliability can be provided.

A material with high toughness is preferably used for the first substrate 401 and the second substrate 405. Thus, a light-emitting device with high impact resistance that is less likely to be broken can be provided. For example, when an organic resin substrate is used as the first substrate 401 and the second substrate 405, the display device 400 can be lightweight and unlikely to broken as compared to the case where a glass substrate used as the substrate.

Furthermore, when a material with high thermal emissivity is used for the first substrate 401, the surface temperature of the display device can be prevented from rising, leading to prevention of breakage or a decrease in reliability of the display device. For example, the first substrate 401 may have a stacked-layer structure of a metal substrate and a layer with high thermal emissivity (the layer can be formed using a metal oxide or a ceramic material, for example).

Here, a method for manufacturing the display device 400 illustrated in FIG. 11 is described below in detail with reference to FIGS. 12A to 12D, FIGS. 13A and 13B, FIGS. 14A to 14D, and FIG. 15. Note that FIGS. 12A to 12D illustrate an example in which an organic resin film is used for the insulating film 420 and the insulating film 440, and FIG. 15 illustrates an example in which an inorganic insulating film is used as the insulating film 420 and the insulating film 440. In FIGS. 12A to 12D, FIGS. 13A and 13B, FIGS. 14A to 14D, and FIG. 15, to avoid complication of the drawings, the first element layer 410 and the second element layer 411 illustrated in FIG. 11 are not illustrated.

First, a method for manufacturing the display device in which an organic resin film is used as each of the insulating film 420 and the insulating film 440 is described.
<Method 1 for Manufacturing Display Device>

Figure 12A:
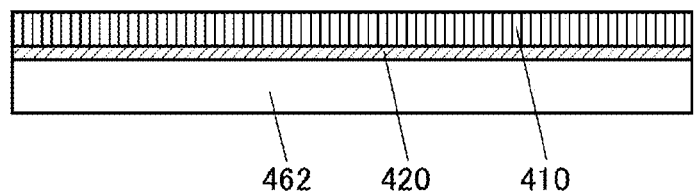
FIGS. 12A to 12D are cross-sectional views illustrating a method for manufacturing a display device.
Figure 12B:
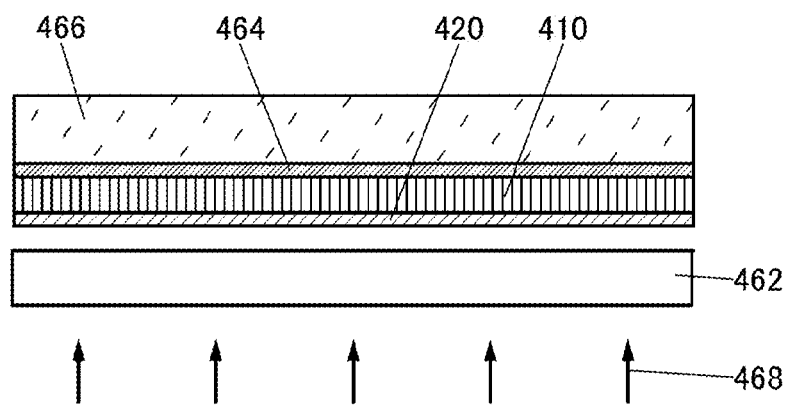

First of all, the insulating film 420 is formed over a substrate 462, and the first element layer 410 is formed over the insulating film 420 (see FIG. 12A).

It is necessary that the substrate 462 have at least heat resistance high enough to withstand heat treatment performed later. For example, a glass substrate, a ceramic substrate, a quartz substrate, or a sapphire substrate may be used as the substrate 462.

In the case where a glass substrate is used as the substrate 462, an insulating film such as a silicon oxide film, a silicon oxynitride film, a silicon nitride film, or a silicon nitride oxide film is preferably formed between the substrate 462 and the insulating film 420, in which case contamination from the glass substrate can be prevented.

For the insulating film 420, an organic resin film of an epoxy resin, an aramid resin, an acrylic resin, a polyimide resin, a polyamide resin, a polyamide-imide resin, or the like can be used. Among them, a polyimide resin is preferably used because it has high heat resistance. For example, in the case where a polyimide resin is used for the insulating film 420, the thickness of the polyimide resin is greater than or equal to 3 nm and less than or equal to 20 µm, preferably greater than or equal to 500 nm and less than or equal to 2 µm. In the case where a polyimide resin is used for the insulating film 420, the insulating film 420 can be formed by a spin coating method, a dip coating method, a doctor blade method, or the like. In the case where a polyimide resin is used for the insulating film 420, for example, the polyimide resin with a desired thickness can be obtained by removing an excess resin by a doctor blade method.

The transistor 350 and the like in the first element layer 410 can be formed according to the method for manufacturing the transistor 150 described in the above embodiment. In this embodiment, methods for forming components other than the transistor 350 are described below in detail.

Note that formation temperatures of all the components in the first element layer 410, including the transistor 350, are preferably higher than or equal to room temperature and lower than or equal to 300° C. For example, the deposition temperature of an insulating film or a conductive film which is formed in the first element layer 410 using an inorganic material is higher than or equal to 150° C. and lower than or equal to 300° C., preferably higher than or equal to 200° C. and lower than or equal to 270° C. Furthermore, an insulating film or the like formed in the first element layer 410 using an organic resin material is preferably formed at a temperature higher than or equal to room temperature and lower than or equal to 100° C. In addition, in the formation process of the transistor 350, for example, a heating step in the manufacturing process is not necessarily performed.

It is preferable that the CAAC-OS, which is described above, be used for a channel region of the transistor 350. In the case where the CAAC-OS is used for the channel region of the transistor 350, for example, when the display device 400 is bent, a crack or the like is less likely to be generated in the channel region, resulting in high resistance against bending.

The insulating film 430, the conductive film 372, the EL layer 446, and the conductive film 448 included in the first element layer 410 are formed in the following manner.

For the insulating film 430, an organic resin or an inorganic insulating material can be used. As the organic resin, for example, a polyimide resin, a polyamide resin, an acrylic resin, a siloxane resin, an epoxy resin, or a phenol resin can be used. As the inorganic insulating material, silicon oxide, silicon oxynitride, or the like can be used. In particular, a photosensitive resin is preferably used for easy formation of the insulating film 430. There is no particular limitation on the method for forming the insulating film 430; for example, a photolithography method, a sputtering method, an evaporation method, a droplet discharging method (e.g., an inkjet method), a printing method (e.g., a screen printing method or an offset printing method), or the like can be used.

It is preferable that a metal film which is highly reflective to visible light be used as the conductive film 444. For example, aluminum, silver, an alloy thereof, or the like can be used for the metal film. The conductive film 444 can be formed by a sputtering method, for example.

A light-emitting material which can emit light by recombination of holes and electrons injected from the conductive film 444 and the conductive film 448 may be used for the EL layer 446. In addition to the light-emitting material, functional layers such as a hole-injection layer, a hole-transport layer, an electron-transport layer, and an electron-injection layer may be used as needed. The EL layer 446 can be formed by an evaporation method, a coating method, or the like.

As the conductive film 448, a conductive film which transmits visible light is preferably used, for example. For example, a material including one of indium (In), zinc (Zn), and tin (Sn) is preferably used for the conductive film. For the conductive film 448, for example, a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added can be used. In particular, indium tin oxide to which silicon oxide is added is preferably used for the conductive film 448 because a crack is less likely to be generated in the conductive film 448 when the display device 400 is bent. The conductive film 448 can be formed by a sputtering method, for example.

Next, the first element layer 410 and a temporary supporting substrate 466 are attached with an adhesive 464 for separation, and then the insulating film 420 and the first element layer 410 are separated from the substrate 462. Thus, the temporary supporting substrate 466 is provided with the insulating film 420 and the first element layer 410 (see FIG. 12B).

As the temporary supporting substrate 466, a glass substrate, a quartz substrate, a sapphire substrate, a ceramic substrate, a metal substrate, or the like can be used. Alternatively, a plastic substrate that can withstand a processing temperature of this embodiment may be used, or a flexible film-like substrate may be used.

An adhesive with which the temporary supporting substrate 466 and the element layer 410 can be chemically or physically separated when necessary, such as an adhesive that is soluble in water or a solvent or an adhesive which is capable of being plasticized upon irradiation of UV light or the like, is used as the adhesive 464 for separation.

Any of various methods can be used as appropriate as the process for transferring the components to the temporary supporting substrate 466. For example, the substrate 462 and the insulating film 420 can be separated from each other in such a manner that the insulating film 420 is irradiated with laser light 468 from a side of the substrate 462 where the insulating film 420 is not formed, i.e., from the bottom side in FIG. 12B to make the insulating film 420 weak. Furthermore, a region where adhesion between the substrate 462 and the insulating film 420 is low and a region where adhesion between the substrate 462 and the insulating film 420 is high may be formed by adjustment of the irradiation energy density of the laser light 468, and then the substrate 462 and the insulating film 420 may be separated.

Although the method in which separation is caused at the interface between the substrate 462 and the insulating film 420 is described, one embodiment of the present invention is not limited thereto. For example, separation may be caused at the interface between the insulating film 420 and the first element layer 410.

The insulating film 420 may be separated from the substrate 462 by filling the interface between the substrate 462 and the insulating film 420 with a liquid. Alternatively, the first element layer 410 may be separated from the insulating film 420 by filling the interface between the insulating film 420 and the first element layer 410 with a liquid. As the liquid, water, a polar solvent, or the like can be used, for example. The interface along which the insulating film 420 is separated, specifically, the interface between the substrate 462 and the insulating film 420 or the interface between the insulating film 420 and the first element layer 410 is filled with a liquid, whereby an influence of static electricity and the like which are generated owing to the separation and applied to the first element layer 410 can be reduced.

Figure 12C:
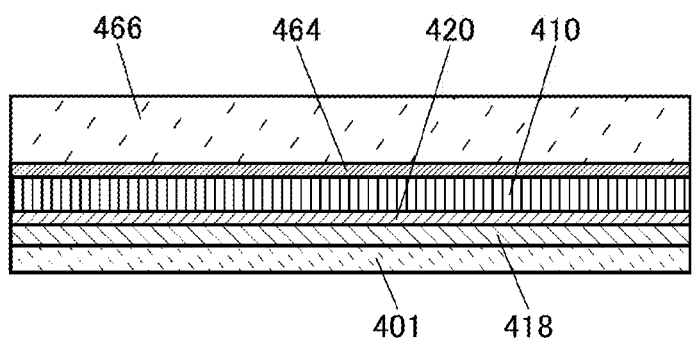

Next, the first substrate 401 is attached to the insulating film 420 using the adhesive layer 418 (see FIG. 12C).

Figure 12D:
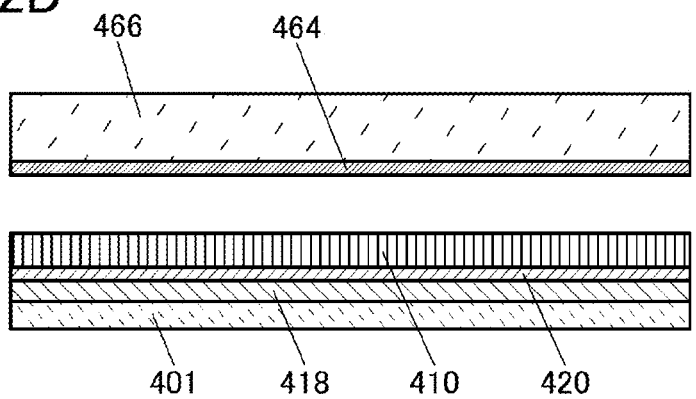

Then, the adhesive 464 for separation and the temporary supporting substrate 466 are removed from the first element layer 410 by dissolving or plasticizing the adhesive 464 for separation (see FIG. 12D).

Note that the adhesive 464 for separation is preferably removed by water, a solvent, or the like to expose the surface of the first element layer 410.

Through the above process, the first element layer 410 can be formed over the first substrate 401.

Figure 13A:
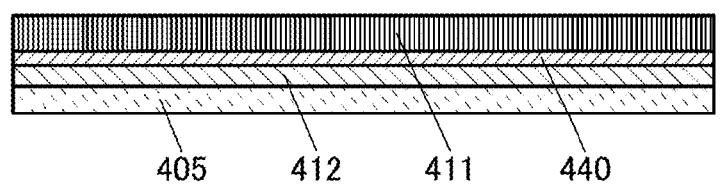
FIGS. 13A and 13B are cross-sectional views illustrating a method for manufacturing a display device.

Next, the second substrate 405, the adhesive layer 412 over the second substrate 405, the insulating film 440 over the adhesive layer 412, and the second element layer 411 are formed by a process similar to that illustrated in FIGS. 12A to 12D (see FIG. 13A).

The insulating film 440 included in the second element layer 411 can be formed using a material similar to that of the insulating film 420, here, using an organic resin film.

The coloring layer 436 included second element layer 411 is a coloring layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position with any of various materials by a printing method, an inkjet method, an etching method using a photolithography technique, or the like.

The light-blocking layer 438 included in the second element layer 411 has a function of shielding light in a particular wavelength region, and can be a metal film or an organic insulating film including a black pigment or the like.

The insulating film 434 included in the second element layer 411 can be formed using an organic insulating film of an acrylic resin or the like. Note that the insulating film 434 is not necessarily formed.

Figure 13B:
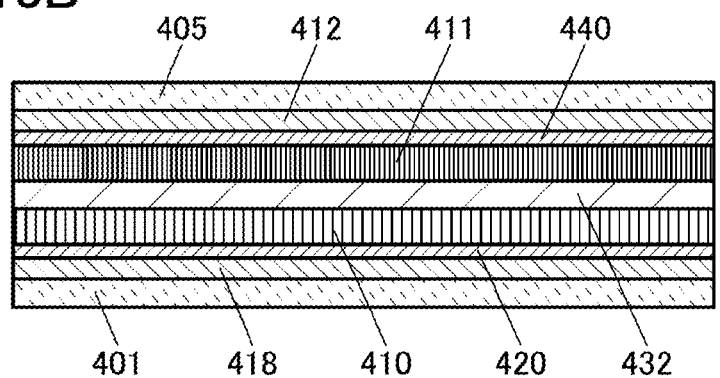

Next, a space between the first element layer 410 and the second element layer 411 is filled with the sealing layer 432 to attach the first element layer 410 and the second element layer 411 (see FIG. 13B).

With the sealing layer 432, for example, solid sealing is possible. Note that the sealing layer 432 preferably has flexibility. For example, a glass material such as a glass frit, or a resin that is curable at room temperature such as a two-component type resin, a light curable resin, a heat-curable resin, and the like can be used for the sealing layer 432.

Finally, the anisotropic conductive film 380 and an FPC 408 are attached to the connection electrode 360. An IC chip or the like may be mounted if necessary.

Through the above process, the display device 400 illustrated in FIG. 11 can be manufactured.

Next, a method for manufacturing a display device in which an inorganic insulating film is used as each of the insulating film 420 and the insulating film 440 is described below. Note that common reference numerals are used for components that have functions similar to functions described in Method 1 for manufacturing display device, and detailed descriptions of the components are omitted.

<Method 2 for Manufacturing Display Device>

First, a separation layer 463 is formed over the substrate 462. Then, the insulating film 420 is formed over the separation layer 463, and the first element layer 410 is formed over the insulating film 420 (see FIG. 14A).

The separation layer 463 can have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements, for example. In the case of a layer containing silicon, a crystal structure of the layer containing silicon may be amorphous, microcrystal, polycrystal, or single crystal The separation layer 463 can be formed by a sputtering method, a PE-CVD method, a coating method, a printing method, or the like. Note that a coating method includes a spin coating method, a droplet discharge method, and a dispensing method.

In the case where the separation layer 463 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

When the separation layer 463 has a stacked-layer structure including a layer containing tungsten and a layer containing an oxide of tungsten, it may be utilized that the layer containing tungsten is formed first and an insulating layer formed of oxide is formed thereover so that a layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer 463 is changed by the plasma treatment or heat treatment, whereby adhesion between the separation layer 463 and the insulating film 420 formed later can be controlled.

The insulating film 420 can be formed using an inorganic insulating film with low moisture permeability, such as a silicon oxide film, a silicon nitride film, a silicon oxynitride film, a silicon nitride oxide film, or an aluminum oxide film. The inorganic insulating film can be formed by a sputtering method or a PE-CVD method, for example.

Next, the first element layer 410 and a temporary supporting substrate 466 are attached with an adhesive 464 for separation, and then the insulating film 420 and the first element layer 410 are separated from the separation layer 463. Thus, the temporary supporting substrate 466 is provided with the insulating film 420 and the first element layer 410 (see FIG. 14B).

Any of various methods can be used as appropriate as the process for transferring the layer to the temporary supporting substrate 466. For example, in the case where a layer including a metal oxide film is formed at the interface between the separation layer 463 and the insulating film 420, the metal oxide film is made to be weakened by crystallization, so that the insulating film 420 can be separated from the separation layer 463. Alternatively, in the case where the separation layer 463 is formed using a tungsten film, separation is performed in such a manner that the tungsten film is etched using a mixed solution of ammonia water and a hydrogen peroxide solution.

The insulating film 420 may be separated from the separation layer 463 by filling the interface between the separation layer 463 and the insulating film 420 with a liquid. As the liquid, water, a polar solvent, or the like can be used, for example. The interface along which the insulating film 420 is separated, specifically, the interface between the separation layer 463 and the insulating film 420 is filled with a liquid, whereby an influence of static electricity and the like which are generated owing to the separation and applied to the first element layer 410 can be reduced.

Figure 14A:
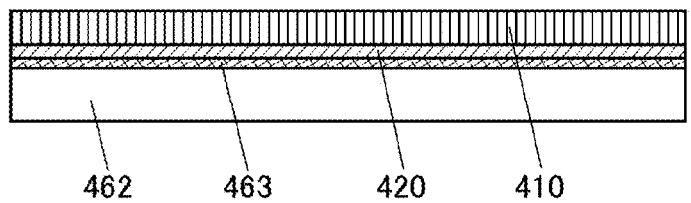
FIGS. 14A to 14D are cross-sectional views illustrating a method for manufacturing a display device.
Figure 14B:
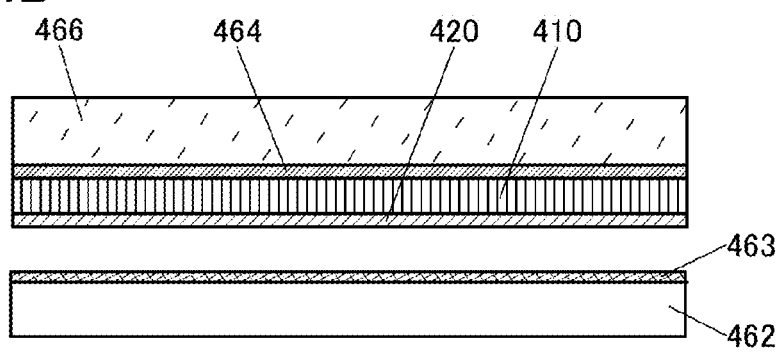
Figure 14C:
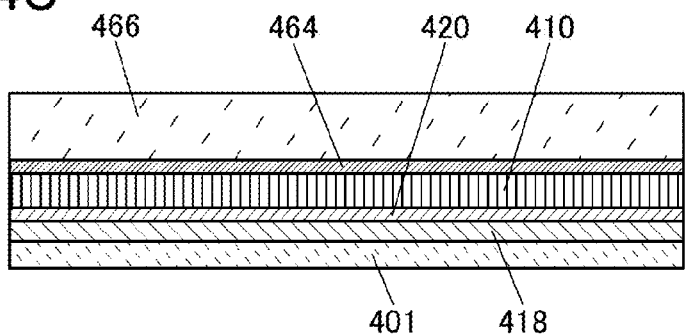
Figure 15:
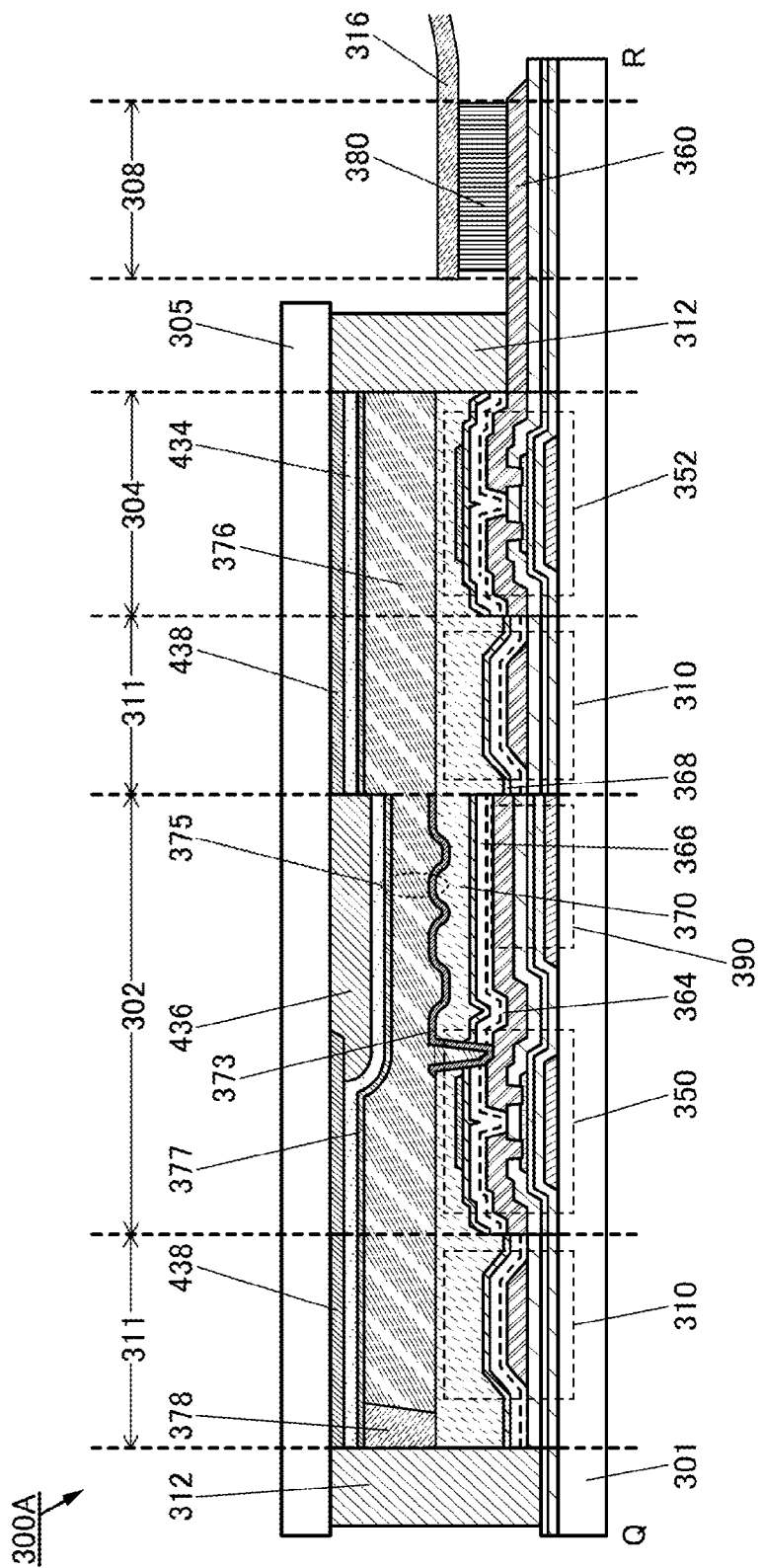
FIG. 15 illustrates a cross section of a display device.

Next, the first substrate 401 is attached to the insulating film 420 using the adhesive layer 418 (see FIG. 14C).

Figure 14D:
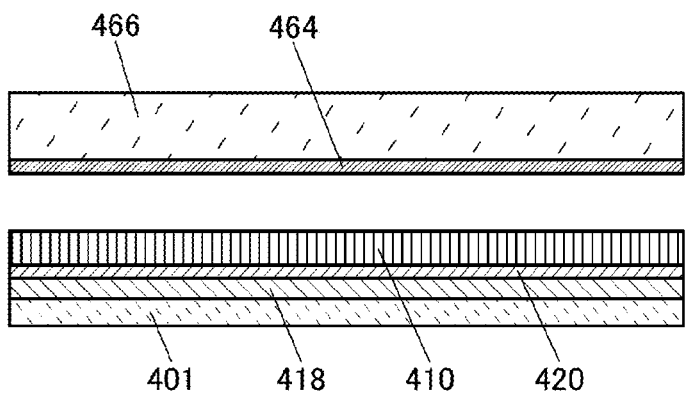

Then, the adhesive 464 for separation and the temporary supporting substrate 466 are removed from the first element layer 410 by dissolving or plasticizing the adhesive 464 for separation (see FIG. 14D).

Note that the adhesive 464 for separation is preferably removed by water, a solvent, or the like to expose the surface of the first element layer 410.

Through the above process, the first element layer 410 can be formed over the first substrate 401.

Next, the second substrate 405, the adhesive layer 412 over the second substrate 405, the insulating film 440 over the adhesive layer 412, and the second element layer 411 are formed by a process similar to that illustrated in FIGS. 14A to 14D. After that, a space between the first element layer 410 and the second element layer 411 is filled with the sealing layer 432, so that the first element layer 410 and the second element layer 411 are attached to each other.

Finally, the anisotropic conductive film 380 and the FPC 408 are attached to the connection electrode 360. An IC chip or the like may be mounted if necessary.

Through the above process, the display device 400 illustrated in FIG. 11 can be manufactured.

Next, a display device 300A that is a modification example of the display device 300 illustrated in FIG. 10 is described with reference to FIG. 15.

<Structure Example 2 of Display Device Using Liquid Crystal Element as Display Element>

The display device 300A in FIG. 15 includes the liquid crystal element 375. The liquid crystal element 375 includes a conductive film 373, a conductive film 377, and the liquid crystal layer 376. The conductive film 373 is provided over the planarization insulating film 370 over the first substrate 301 to function as a reflective electrode. The display device 300A in FIG. 15 is what is called a reflective color liquid crystal display device in which external light is reflected by the conductive film 373 and an image is displayed through the coloring layer 436.

Note that projections and depressions are provided in part of the planarization insulating film 370 of the pixel portion 302 in the display device 300A in FIG. 15. The projections and depressions can be formed in such a manner that the planarization insulating film 370 is formed using an organic resin film or the like, and projections and depressions are formed on the surface of the organic resin film. The conductive film 373 functioning as a reflective electrode is formed along the projections and depressions. Therefore, when external light is incident on the conductive film 373, the light is reflected diffusely at the surface of the conductive film 373, whereby visibility can be improved.

The display device 300A includes the light-blocking layer 438, the insulating film 434, and the coloring layer 436 on the second substrate 305 side. For the light-blocking layer 438, the insulating film 434, and the coloring layer 436, the materials and methods in the description of the display device 400 can be referred to. The conductive film 373 included in the display device 300A is electrically connected to a source electrode or a drain electrode of the transistor 350. For the conductive film 373, the material and method in the description of the conductive film 444 can be referred to.

The display device 300A includes a capacitor 390. The capacitor 390 includes a pair of electrodes and an insulating film therebetween. Specifically, in the capacitor 390, a conductive film which is formed in the same process as a conductive film functioning as a first gate electrode of the transistor 350 is used as one electrode, a conductive film which is formed in the same process as a conductive film functioning as a source electrode or a drain electrode of the transistor 350 is used as the other electrode, and an insulating film which is formed in the same process as an insulating film functioning as a gate insulating film of the transistor 350 and a first insulating film functioning as a protective insulating film of an oxide semiconductor film are included between the pair of electrodes.

As described above, the transistor, which is the semiconductor device of one embodiment of the present invention, can be applied to a variety of display devices.

The structure described in this embodiment can be used in appropriate combination with the structure described in any of the other embodiments.

(Embodiment 4)

In this embodiment, a display device that can be formed using a semiconductor device of one embodiment of the present invention is described with reference to FIGS. 16A to 16C.

The display device illustrated in FIG. 16A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Further, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 16A:
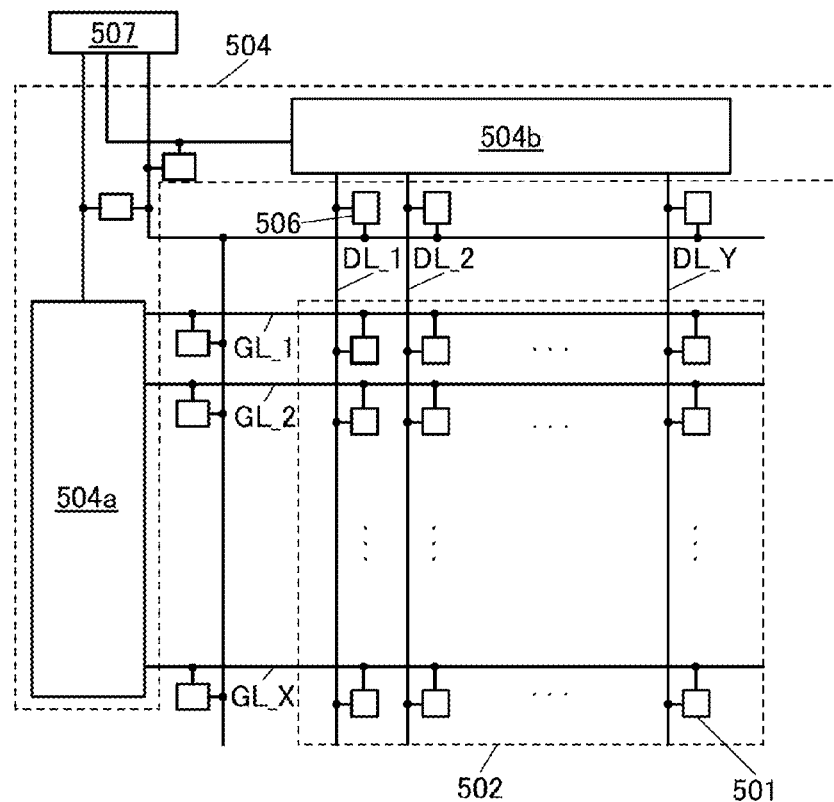
FIGS. 16A to 16C are a block diagram and circuit diagrams illustrating a display device.

The protection circuit 506 shown in FIG. 16A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 16A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 16A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 16B:
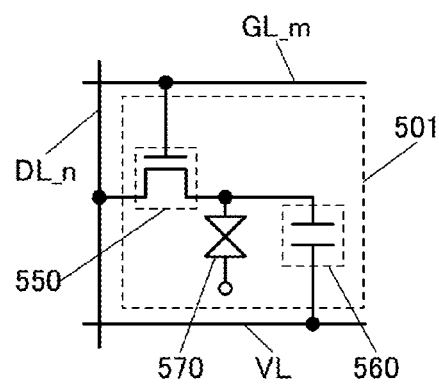

Each of the plurality of pixel circuits 501 in FIG. 16A can have the structure illustrated in FIG. 16B, for example.

The pixel circuit 501 illustrated in FIG. 16B includes a liquid crystal element 570, a transistor 550, and a capacitor 560.

The semiconductor device of one embodiment of the present invention can be used as, for example, the transistor 550. As the transistor 550, any of the transistors 150, 152, 154, and the like described in the above embodiment, for example, can be used The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Further, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 16B, the pixel circuits 501 are sequentially selected row by row by the gate driver 504a illustrated in FIG. 16A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 16C:
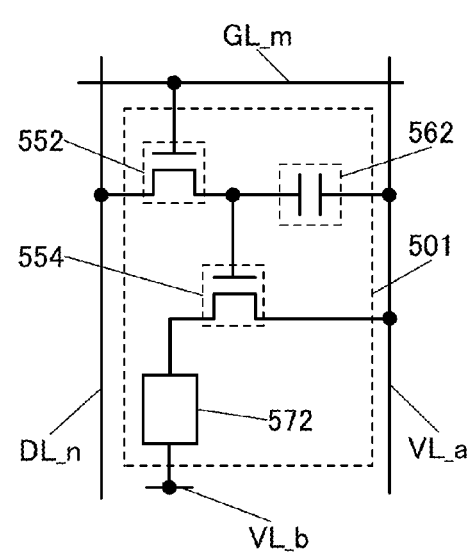

Alternatively, each of the plurality of pixel circuits 501 in FIG. 16A can have the structure illustrated in FIG. 16C, for example.

The pixel circuit 501 illustrated in FIG. 16C includes transistors 552 and 554, a capacitor 562, and a light-emitting element 572. Here, any of the transistors 150, 152, 154, 152A, 154A, and the like described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Further, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 16C, the pixel circuits 501 are sequentially selected row by row by the gate driver 504a illustrated in FIG. 16A, whereby the transistors 552 are turned on and a data signal is written.

When the transistors 552 are turned off, the pixel circuits 501 in which the data has been written are brought into a holding state. Further, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structure described in this embodiment can be used in appropriate combination with any of the structures described in the other embodiments.

(Embodiment 5)

In this embodiment, a display module and electronic devices that can be formed using a semiconductor device of one embodiment of the present invention are described with reference to FIG. 17 and FIGS. 18A to 18H.

Figure 17:
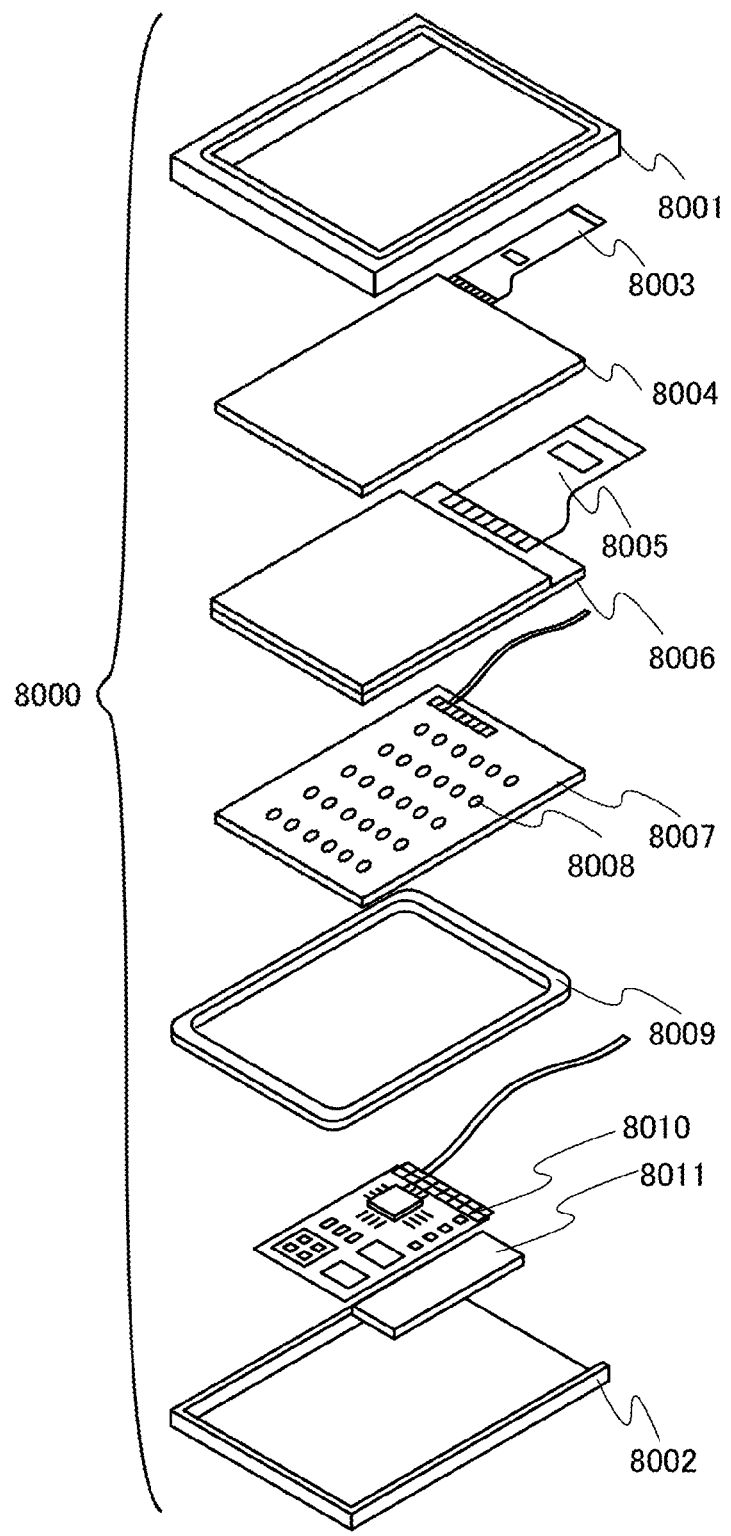
FIG. 17 illustrates a display module.

In a display module 8000 illustrated in FIG. 17, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 17, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 18A to 18H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 18A:
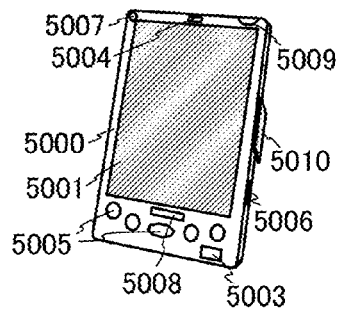
FIGS. 18A to 18H illustrate electronic devices.
Figure 18B:
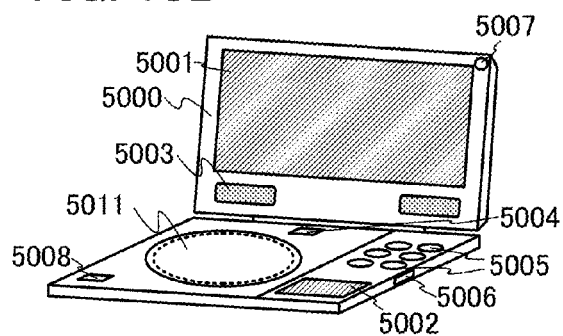
Figure 18C:
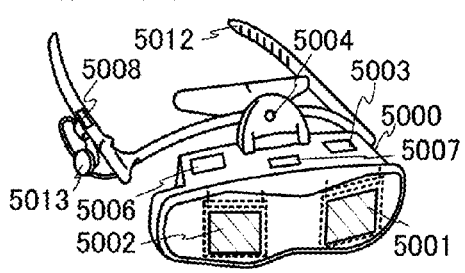
Figure 18D:
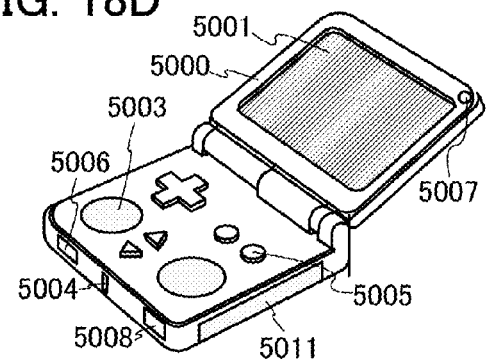
Figure 18E:
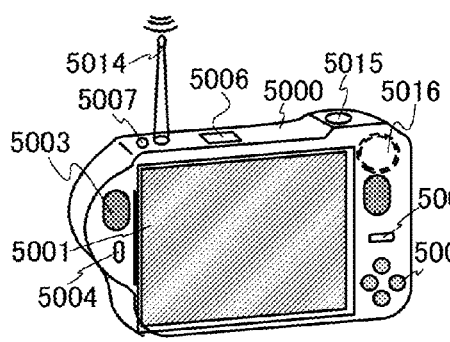
Figure 18F:
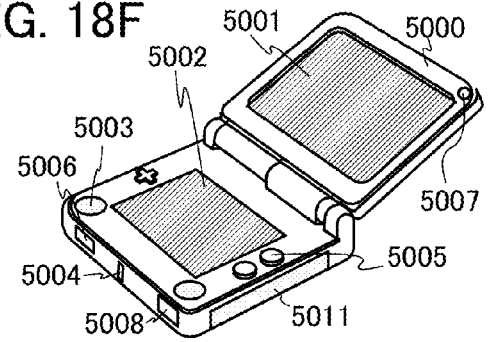
Figure 18G:
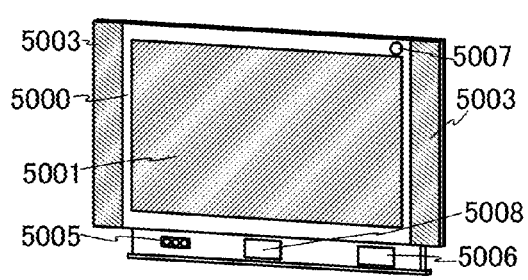
Figure 18H:
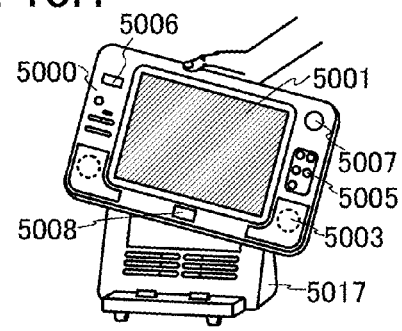

FIG. 18A illustrates a mobile computer that can include a switch 5009, an infrared port 5010, and the like in addition to the above components. FIG. 18B illustrates a portable image reproducing device (e.g., a DVD player) that is provided with a memory medium and can include a second display portion 5002, a memory medium reading portion 5011, and the like in addition to the above components. FIG. 18C illustrates a goggle-type display that can include the second display portion 5002, a support 5012, an earphone 5013, and the like in addition to the above components. FIG. 18D illustrates a portable game machine that can include the memory medium reading portion 5011 and the like in addition to the above components. FIG. 18E illustrates a digital camera that has a television reception function and can include an antenna 5014, a shutter button 5015, an image receiving portion 5016, and the like in addition to the above components. FIG. 18F illustrates a portable game machine that can include the second display portion 5002, the memory medium reading portion 5011, and the like in addition to the above components. FIG. 18G illustrates a television receiver that can include a tuner, an image processing portion, and the like in addition to the above components. FIG. 18H illustrates a portable television receiver that can include a charger 5017 capable of transmitting and receiving signals, and the like in addition to the above components.

The electronic devices illustrated in FIGS. 18A to 18H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Further, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 18A to 18H are not limited to those described above, and the electronic devices can have a variety of functions.

The electronic devices described in this embodiment each include the display portion for displaying some sort of data. Note that the semiconductor device of one embodiment of the present invention can also be used for an electronic device which does not have a display portion.

The structure described in this embodiment can be used in appropriate combination with any of the structures described in the other embodiments.

EXAMPLE

In this example, transistors were fabricated and ID-VG characteristics of the transistors were evaluated.

<Fabrication of Samples>

In this example, transistors each having a structure corresponding to that of the transistor 150 illustrated in FIGS. 1A to 1C were fabricated. Note that samples (Samples A1 to A3, Samples B1 to B3, and Samples C1 to C3) with various thicknesses of the first insulating film 110 and various distances between the pair of electrodes 112a and 112b, which are included in the transistors 150 illustrated in FIG. 1B, were fabricated under nine conditions in total. First, conditions of the samples fabricated in this example are shown in Table 1.

TABLE 1

|           | Tins (nm) | Lm (μm) | Sov (μm) | Lc (μm) |
|-----------|-----------|---------|----------|---------|
| Sample A1 | 10        | 6       | 2        | 10      |
| Sample A2 | 10        | 4       | 3        | 10      |
| Sample A3 | 10        | 2       | 4        | 10      |
| Sample B1 | 50        | 6       | 2        | 10      |
| Sample B2 | 50        | 4       | 3        | 10      |
| Sample B3 | 50        | 2       | 4        | 10      |
| Sample C1 | 100       | 6       | 2        | 10      |
| Sample C2 | 100       | 4       | 3        | 10      |
| Sample C3 | 100       | 2       | 4        | 10      |

In Table 1, Tins, Lm, Sov, and Lc correspond to Tins, Lm, Sov, and Lc shown in FIG. 2, respectively. Furthermore, Samples A1, A2, A3, B1, B2, and B3 in Table 1 are semiconductor devices of embodiments of the present invention and Samples C1 to C3 are semiconductor devices for comparison.

Next, fabrication methods of the samples shown in Table 1 are described below.

<Fabrication Methods of Samples>

First, a glass substrate was used as a substrate, and a conductive film functioning as a first gate electrode was formed over the substrate.

A 100 nm-thick tungsten film was formed by sputtering, a mask was formed over the tungsten film by a photolithography process, and part of the tungsten film was etched using the mask, so that the conductive film functioning as the first gate electrode was formed.

Next, an insulating film functioning as a gate insulating film was formed over the conductive film functioning as the first gate electrode.

As the insulating film functioning as the gate insulating film, a stack including a 400-nm-thick silicon nitride film and a 50-nm-thick first silicon oxynitride film was used.

Note that the silicon nitride film was formed to have a three-layer structure of a first silicon nitride film, a second silicon nitride film, and a third silicon nitride film.

The first silicon nitride film was formed to have a thickness of 50 nm under the following conditions: silane at a flow rate of 200 sccm, nitrogen at a flow rate of 2000 sccm, and an ammonia gas at a flow rate of 100 sccm were supplied to a reaction chamber of a PE-CVD apparatus as a source gas; the pressure in the reaction chamber was controlled to 100 Pa; and a power of 2000 W was supplied with the use of a 27.12 MHz high-frequency power source. The second silicon nitride film was formed to have a thickness of 300 nm under the following conditions: silane at a flow rate of 200 sccm, nitrogen at a flow rate of 2000 sccm, and an ammonia gas at a flow rate of 2000 sccm were supplied to the reaction chamber of the PE-CVD apparatus as a source gas; the pressure in the reaction chamber was controlled to 100 Pa; and a power of 2000 W was supplied with the use of a 27.12 MHz high-frequency power source. The third silicon nitride film was formed to have a thickness of 50 nm under the following conditions: silane at a flow rate of 200 sccm and nitrogen at a flow rate of 5000 sccm were supplied to the reaction chamber of the PE-CVD apparatus as a source gas; the pressure in the reaction chamber was controlled to 100 Pa; and a power of 2000 W was supplied with the use of a 27.12 MHz high-frequency power source. Note that the first silicon nitride film, the second silicon nitride film, and the third silicon nitride film were each formed at a substrate temperature of 350° C.

The first silicon oxynitride film was formed under the following conditions: silane at a flow rate of 20 sccm and dinitrogen monoxide at a flow rate of 3000 sccm were supplied to the reaction chamber of the PE-CVD apparatus as a source gas; the pressure in the reaction chamber was controlled to 40 Pa, and a power of 100 W was supplied with the use of a 27.12 MHz high-frequency power source. Note that the silicon oxynitride film was formed at a substrate temperature of 350° C.

Next, an oxide semiconductor film was formed to overlap with the conductive film functioning as the first gate electrode with the insulating film functioning as the gate insulating film positioned therebetween.

Here, a 50-nm-thick oxide semiconductor film was formed over the insulating film functioning as the gate insulating film by a sputtering method.

The oxide semiconductor film was formed under the following conditions: a sputtering target containing In, Ga, and Zn at an atomic ratio of 1:1:1 was used; a mixed gas of argon and oxygen with a proportion of oxygen of 50% was supplied into a reaction chamber of a sputtering apparatus; the pressure in the reaction chamber was controlled to 0.6 Pa; and an alternating-current power of 2.5 kW was supplied. Note that the oxide semiconductor film was formed at a substrate temperature of 170° C.

Next, first heat treatment was performed. As the first heat treatment, heat treatment at 450° C. in a nitrogen atmosphere for one hour and heat treatment at 450° C. in a mixed gas atmosphere of nitrogen and oxygen for one hour were successively performed.

Next, a first insulating film in contact with the oxide semiconductor film was formed.

In Samples A1, A2, and A3, as the first insulating film, a 10-nm-thick second silicon oxynitride film was formed. In Samples B1, B2, and B3, as the first insulating film, a 50-nm-thick second silicon oxynitride film was formed. In Samples C1, C2, and C3, as the first insulating film, a 100-nm-thick second silicon oxynitride film was formed.

The second silicon oxynitride film, which was used as the first insulating film, was formed under the following conditions: silane at a flow rate of 30 sccm and dinitrogen monoxide at a flow rate of 4000 sccm were supplied to the reaction chamber of the PE-CVD apparatus as a source gas; the pressure in the reaction chamber was controlled to 200 Pa, and a power of 150 W was supplied with the use of a 27.12 MHz high-frequency power source. Note that the substrate temperature was 220° C. when the silicon oxynitride film was formed.

Next, an opening reaching the oxide semiconductor film was formed in the first insulating film. The opening was formed in the following manner: a mask was formed over the first insulating film by a photolithography process, and the first insulating film was partly etched using the mask.

Next, a pair of electrodes in contact with the oxide semiconductor film was formed to cover the opening.

First, a conductive film was formed over the first insulating film and the oxide semiconductor film. As the conductive film, a 400-nm-thick aluminum film was formed over a 50-nm-thick titanium film, and a 100-nm-thick titanium film was formed over the aluminum film. Then, a mask was formed over the conductive film by a photolithography process, and the conductive film was partly etched using the mask. Through the above steps, the pair of electrodes was formed.

The sizes of the masks formed by the photolithography process are varied at the time of formation of the pair of electrodes, whereby Samples with the lengths of Lm, Sov, and Lc shown in Table 1 were fabricated.

Then, a second insulating film was formed over the first insulating film and the pair of electrodes. Here, as the second insulating film, a two-layer structure of a 325-nm-thick third silicon oxynitride film and a 100-nm-thick fourth silicon nitride film was used. Second heat treatment was performed between the formation of the third silicon oxynitride film and the formation of the fourth silicon nitride film.

The third silicon oxynitride film was formed by a PE-CVD method under the following conditions: silane with a flow rate of 200 sccm and dinitrogen monoxide with a flow rate of 4000 sccm were used as a source gas; the pressure in the reaction chamber was 200 Pa; the substrate temperature was 220° C.; and a high-frequency power of 1500 W was supplied to the parallel plate electrodes. Under the above conditions, it is possible to form a silicon oxynitride film containing oxygen at a higher proportion than oxygen in the stoichiometric composition and from which part of oxygen is released by heating.

The second heat treatment was performed at 350° C. in a mixed gas atmosphere of nitrogen and oxygen for one hour. By performing the second heat treatment, water, nitrogen, hydrogen, and the like are released from the second silicon oxynitride film and the third silicon oxynitride film and part of oxygen contained in the second silicon oxynitride film and the third silicon oxynitride film is supplied to the oxide semiconductor film.

The fourth silicon nitride film was formed by a PE-CVD method under the following conditions: silane at a flow rate of 50 sccm, nitrogen at a flow rate of 5000 sccm, and an ammonia gas at a flow rate of 100 sccm were used as a source gas; the pressure in the reaction chamber was 100 Pa; the substrate temperature was 350° C.; and a high-frequency power of 1000 W was supplied to the parallel plate electrodes.

Subsequently, in a region where the oxide semiconductor film and the pair of electrodes were not provided, an opening that reaches the conductive film functioning as the first gate electrode was formed in part of the insulating film functioning as the gate insulating film, the first insulating film, and the second insulating film. The opening was formed in the following manner: a mask was formed over the second gate insulating film by a photolithography process, and the insulating film functioning as the gate insulating film, the first insulating film, and the second insulating film were partly etched using the mask.

Then, a conductive film functioning as a back gate electrode was formed over the second insulating film to cover the opening. The conductive film functioning as the back gate electrode was electrically connected to the conductive film functioning as the first gate electrode through the opening.

As the conductive film functioning as the back gate electrode, a 100-nm-thick conductive film of an indium oxide-tin oxide compound (ITO—$SiO_2$) containing silicon oxide was formed by a sputtering method. Note that the composition of a target used for forming the conductive film was $In_2O_3$:$SnO_2$:$SiO_2$=85:10:5 [wt %]. After that, heat treatment was performed at 250° C. in a nitrogen atmosphere for one hour.

Through the above process, Samples of this example shown in Table 1 was fabricated.

Note that the channel width (W) of each of Samples shown in Table 1 was 50 μm.

<ID-VG Characteristics>

Next, as initial characteristics of the transistors included in Samples A1, A2, A3, B1, B2, B3, C1, C2, and C3 in Table 1, ID-VG characteristics were measured. As an evaluation method of the ID-VG characteristics, changes in current flowing between a source and a drain (hereinafter also referred to as drain current: ID) were measured under the following conditions: the substrate temperature was 25° C., the potential difference between the source and the drain (hereinafter also referred to as drain voltage: VD) was 10 V, and the potential difference between the source and the gate electrodes (hereinafter also referred to as gate voltage: VG) was changed from −15 V to 15 V.

Here, the transistors of Samples A1, A2, A3, B1, B2, B3, C1, C2, and C3 in Table 1 were driven by a method in which gate voltage is applied in a state where the conductive film functioning as the first gate electrode and the conductive film functioning as the back gate electrode are electrically connected to each other. In such a driving method, the gate voltages of the conductive film functioning as the first gate electrode and the conductive film functioning as the back gate electrode are equal to each other.

Figure 22A:
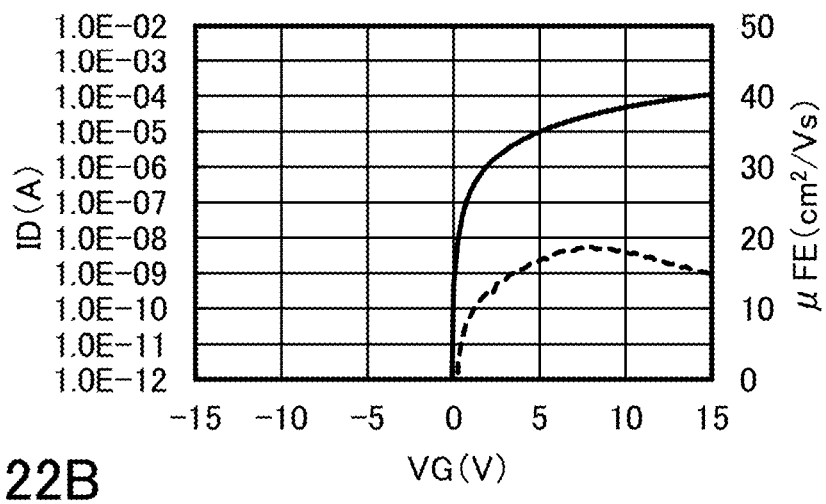
FIGS. 22A to 22C each show ID-VG characteristics of a transistor of an example.
Figure 22B:
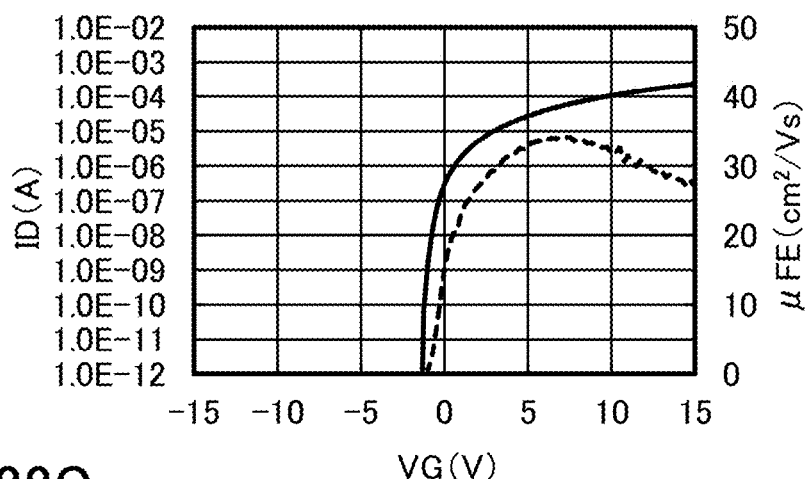
Figure 22C:
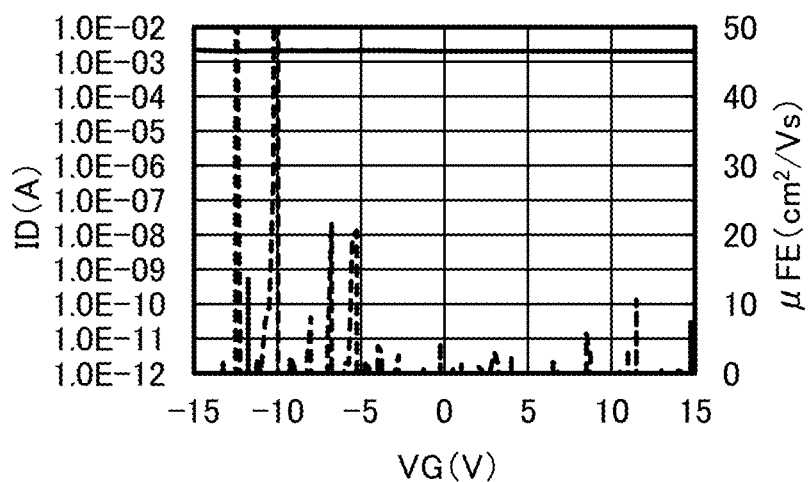
Figure 23A:
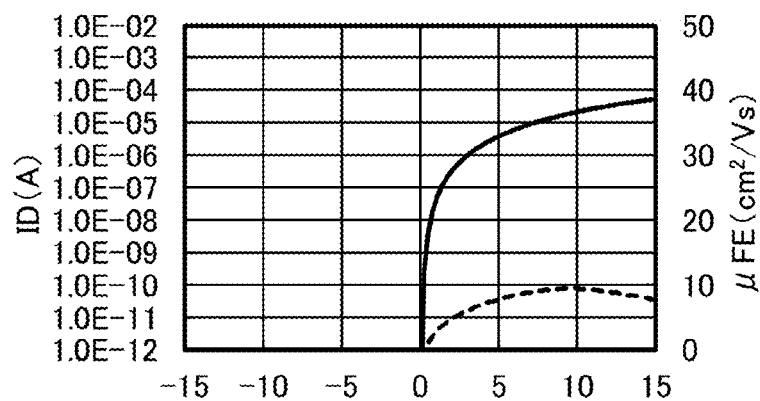
FIGS. 23A to 23C each show ID-VG characteristics of a transistor of an example.
Figure 23B:
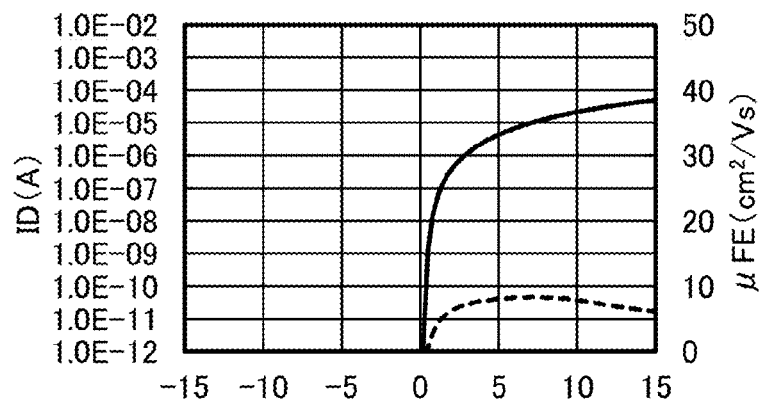
Figure 23C:
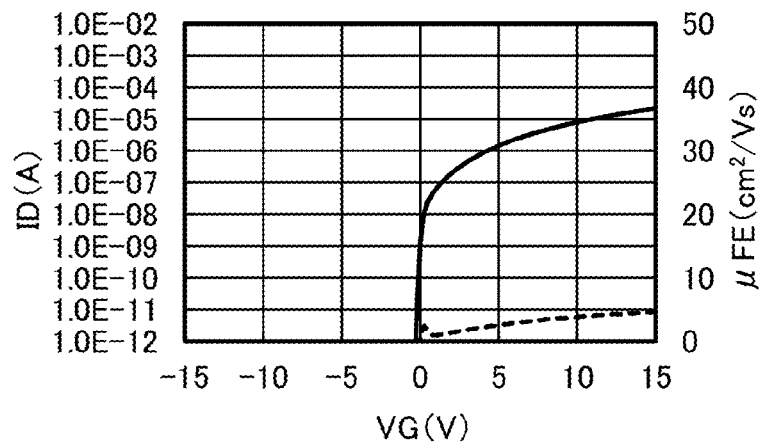
Figure 24A:
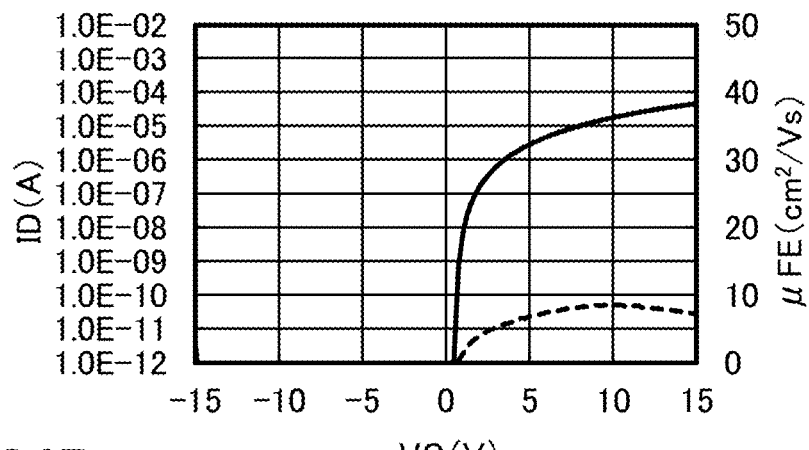
FIGS. 24A to 24C each show ID-VG characteristics of a transistor of an example.
Figure 24B:
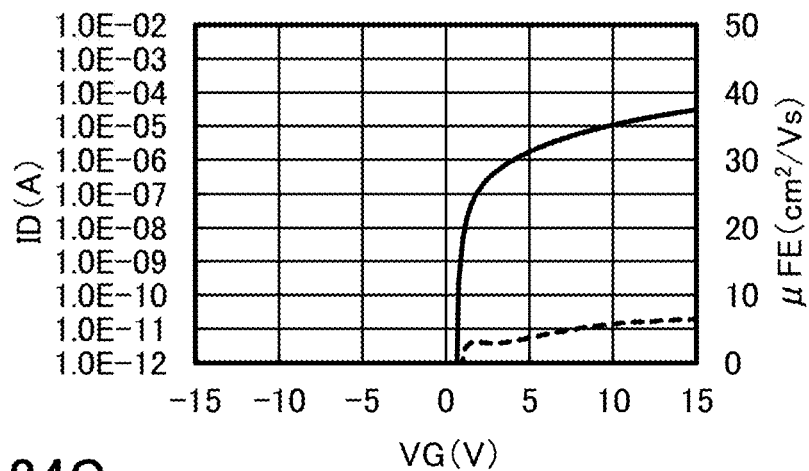
Figure 24C:
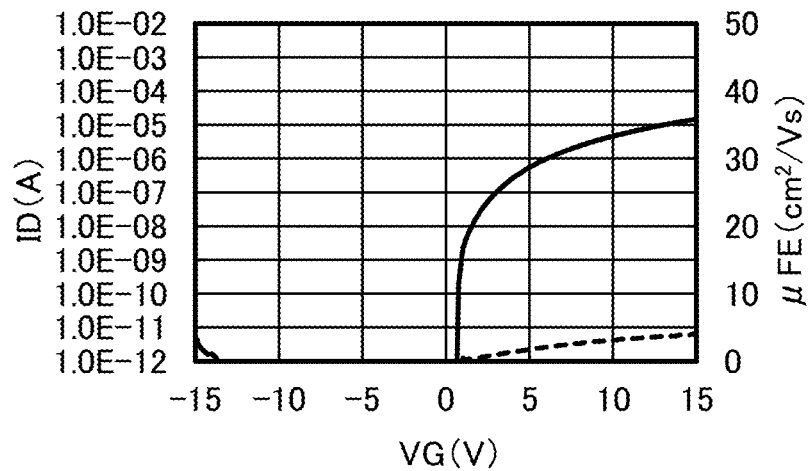

FIGS. 22A, 22B, and 22C show the ID-VG characteristics of Sample A1, Sample A2, and Sample A3, respectively. FIGS. 23A, 23B, and 23C show the ID-VG characteristics of Sample B1, Sample B2, and Sample B3, respectively. FIGS. 24A, 24B, and 24C show the ID-VG characteristics of Sample C1, Sample C2, and Sample C3, respectively.

In each of FIGS. 22A to 22C, FIGS. 23A to 23C, and FIGS. 24A to 24C, the first vertical axis, the second vertical axis, and the horizontal axis represent drain current ID, field-effect mobility (also referred to as μFE), and gate voltage VG, respectively. Here, to show field-effect mobility in a saturation region, field-effect mobility calculated when drain voltage VD was 10 V is shown.

From the results shown in FIGS. 22A to 22C, FIGS. 23A to 23C, and FIGS. 24A to 24C, it is found that as the thickness of the first insulating film, that is, Tins, becomes thinner, the on-state current and the field-effect mobility are increased. However, in Sample A3 in FIG. 22C, an on/off ratio of the transistor is not obtained. This may be because, in Sample A3, Tins is 10 nm, Lm is 2 μm, and Sov is 4 μm; thus, an n-type region in the oxide semiconductor film is significantly increased in the channel length direction so that the transistor is turned on. Thus, in the case where Tins is 10 nm, Lm preferably exceeds 2 μm. In Sample B3 in FIG. 23C in which Tins is 50 nm, an on/off ratio of the transistor is obtained. Thus, in the case where Tins is 50 nm, Lm is preferably longer than or equal to 1 μm.

In contrast, in Samples C1, C2, and C3 in FIGS. 24A, 24B, and 24C, the on-state current and the field-effect mobility are lower than those in Samples A1, A2, A3, B1, B2, and B3, which are embodiments of the present invention.

From the above results, the first insulating film includes a region having a thickness of 1 nm or more and 50 nm or less and the pair of electrodes includes a region where the distance between the pair of electrodes is 1 μm or more and 6 μm or less, whereby a semiconductor device with high on-state current and high field-effect mobility can be obtained.

This application is based on Japanese Patent Application serial no. 2013-256867 filed with Japan Patent Office on Dec. 12, 2013, the entire contents of which are hereby incorporated by reference.

What is claimed is:

1. A semiconductor device comprising:
a transistor comprising:
a first gate electrode;
an oxide semiconductor film overlapping the first gate electrode;
a gate insulating film between the oxide semiconductor film and the first gate electrode;
a first insulating film over the oxide semiconductor film;
a pair of electrodes that are over the first insulating film and electrically connected to the oxide semiconductor film;
a second insulating film over the first insulating film and the pair of electrodes; and
a second gate electrode that is over the second insulating film and overlaps the oxide semiconductor film,
wherein the first insulating film comprises a region where a nitrogen concentration measured by SIMS is lower than or equal to $6 \times 10^{20}$ atoms/cm$^3$,
wherein the first insulating film includes a region having a thickness greater than or equal to 1 nm and less than or equal to 50 nm,
wherein a spin density of the second insulating film is lower than or equal to $3 \times 10^{17}$ spins/cm$^3$ at g=2.001, and
wherein the pair of electrodes includes a region in which a distance between the pair of electrodes is greater than or equal to 1μm and less than or equal to 6μm.

2. The semiconductor device according to claim 1, wherein the oxide semiconductor film comprises an In-M-Zn oxide where M is Ti, Ga, Y, Zr, La, Ce, Nd, Sn, or Hf.

3. The semiconductor device according to claim 1, wherein the oxide semiconductor film includes a crystal part, and a c-axis of the crystal part is aligned parallel to a normal vector of a surface where the oxide semiconductor film is formed.

4. A display device comprising the semiconductor device according to claim 1.

5. An electronic device comprising the semiconductor device according to claim 1.

6. A semiconductor device comprising:
a transistor comprising:
a first gate electrode;
an oxide semiconductor film overlapping the first gate electrode;
a gate insulating film between the oxide semiconductor film and the first gate electrode;
a first insulating film over the oxide semiconductor film;
a pair of electrodes that are over the first insulating film and electrically connected to the oxide semiconductor film;
a second insulating film over the first insulating film and the pair of electrodes; and
a second gate electrode that is over the second insulating film and overlaps the oxide semiconductor film,
wherein the first insulating film comprises a region where a nitrogen concentration measured by SIMS is lower than or equal to $6 \times 10^{20}$ atoms/cm$^3$,
wherein the first gate electrode and the second gate electrode are connected to each other in an opening in the gate insulating film, the first insulating film, and the second insulating film, and the oxide semiconductor film is surrounded by the first gate electrode and the second gate electrode with the gate insulating film between the oxide semiconductor film and the first gate electrode and with the first insulating film and the second insulating film between the oxide semiconductor film and the second gate electrode,
wherein the first insulating film includes a region having a thickness greater than or equal to 1 nm and less than or equal to 50 nm,
wherein a spin density of the second insulating film is lower than or equal to $3 \times 10^{17}$ spins/cm$^3$ at g=2.001, and
wherein the pair of electrodes includes a region in which a distance between the pair of electrodes is greater than or equal to 1 μm and less than or equal to 6 μm.

7. The semiconductor device according to claim 6, wherein the oxide semiconductor film comprises an In-M-Zn oxide where M is Ti, Ga, Y, Zr, La, Ce, Nd, Sn, or Hf.

8. The semiconductor device according to claim 6, wherein the oxide semiconductor film includes a crystal part, and a c-axis of the crystal part is aligned parallel to a normal vector of a surface where the oxide semiconductor film is formed.

9. A display device comprising the semiconductor device according to claim 6.

10. An electronic device comprising the semiconductor device according to claim 6.

11. A semiconductor device comprising:
a transistor comprising:
a first gate electrode;
a stacked-layer oxide film comprising an oxide semiconductor film and a metal oxide film, the stacked-layer oxide film overlapping the first gate electrode;
a gate insulating film between the stacked-layer oxide film and the first gate electrode;
a first insulating film over the stacked-layer oxide film;
a pair of electrodes that are over the first insulating film and electrically connected to the stacked-layer oxide film;
a second insulating film over the first insulating film and the pair of electrodes; and
a second gate electrode that is over the second insulating film and overlaps the stacked-layer oxide film,
wherein the first insulating film comprises a region where a nitrogen concentration measured by SIMS is lower than or equal to $6 \times 10^{20}$ atoms/cm$^3$,
wherein the first insulating film includes a region having a thickness greater than or equal to 1 nm and less than or equal to 50 nm,
wherein a spin density of the second insulating film is lower than or equal to $3 \times 10^{17}$ spins/cm$^3$ at g=2.001, and
wherein the pair of electrodes includes a region in which a distance between the pair of electrodes is greater than or equal to 1 μm and less than or equal to 6 μm.

12. The semiconductor device according to claim 11,
wherein the first gate electrode and the second gate electrode are connected to each other in an opening in the gate insulating film, the first insulating film, and the second insulating film, and the stacked-layer oxide film is surrounded by the first gate electrode and the second gate electrode with the gate insulating film between the stacked-layer oxide film and the first gate electrode and with the first insulating film and the second insulating film between the stacked-layer oxide film and the second gate electrode.

13. The semiconductor device according to claim 11, wherein the oxide semiconductor film comprises an In-M-Zn oxide where M is Ti, Ga, Y, Zr, La, Ce, Nd, Sn, or Hf.

14. The semiconductor device according to claim 11, wherein the oxide semiconductor film includes a crystal part, and a c-axis of the crystal part is aligned parallel to a normal vector of a surface where the oxide semiconductor film is formed.

15. The semiconductor device according to claim 11, wherein the metal oxide film is an In-M-Zn oxide or an In-M oxide where M is Ti, Ga, Y, Zr, La, Ce, Nd, Sn, or Hf.

16. The semiconductor device according to claim 11, wherein the metal oxide film includes a crystal part, and a c-axis of the crystal part is aligned parallel to a normal vector of a surface where the metal oxide film is formed.

17. The semiconductor device according to claim 11, wherein an energy level of a bottom of a conduction band of the metal oxide film is closer to a vacuum level than that of the oxide semiconductor film is.

18. A display device including the semiconductor device according to claim cm 11.

19. An electronic device comprising the semiconductor device according to claim 11.

20. The semiconductor device according to claim 1, wherein the pair of electrode comprises copper.

21. The semiconductor device according to claim 6, wherein the pair of electrode comprises copper.

22. The semiconductor device according to claim 11, wherein the pair of electrode comprises copper.

23. The semiconductor device according to claim 1, wherein the first gate electrode comprises copper.

24. The semiconductor device according to claim 6, wherein the first gate electrode comprises copper.

25. The semiconductor device according to claim 11, wherein the first gate electrode comprises copper.

* * * * *